United States Patent
Adachi et al.

(10) Patent No.: US 10,921,710 B2
(45) Date of Patent: Feb. 16, 2021

(54) RESIST COMPOSITION AND PATTERN FORMING PROCESS

(71) Applicant: Shin-Etsu Chemical Co., Ltd., Tokyo (JP)

(72) Inventors: Teppei Adachi, Joetsu (JP); Ryosuke Taniguchi, Joetsu (JP); Kazuhiro Katayama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 175 days.

(21) Appl. No.: 16/047,073

(22) Filed: Jul. 27, 2018

(65) Prior Publication Data

US 2019/0033715 A1 Jan. 31, 2019

(30) Foreign Application Priority Data

Jul. 31, 2017 (JP) ................................ 2017-148008

(51) Int. Cl.
| | | |
|---|---|---|
| *G03F 7/039* | (2006.01) | |
| *G03F 7/038* | (2006.01) | |
| *G03F 7/004* | (2006.01) | |
| *G03F 7/11* | (2006.01) | |
| *G03F 7/20* | (2006.01) | |
| *G03F 7/16* | (2006.01) | |
| *G03F 7/38* | (2006.01) | |
| *G03F 7/32* | (2006.01) | |
| *C08F 220/16* | (2006.01) | |
| *C08F 220/28* | (2006.01) | |

(52) U.S. Cl.
CPC ............ *G03F 7/038* (2013.01); *C08F 220/16* (2013.01); *C08F 220/28* (2013.01); *G03F 7/0045* (2013.01); *G03F 7/0046* (2013.01); *G03F 7/039* (2013.01); *G03F 7/0397* (2013.01); *G03F 7/11* (2013.01); *G03F 7/16* (2013.01); *G03F 7/168* (2013.01); *G03F 7/2004* (2013.01); *G03F 7/2006* (2013.01); *G03F 7/2037* (2013.01); *G03F 7/2041* (2013.01); *G03F 7/32* (2013.01); *G03F 7/325* (2013.01); *G03F 7/38* (2013.01); *C08F 220/283* (2020.02)

(58) Field of Classification Search
CPC ........ G03F 7/0046; G03F 7/038; G03F 7/039; G03F 7/0397; G03F 7/2004; G03F 7/2006; G03F 7/2037; G03F 7/2041; G03F 7/0045

USPC ....................................................... 430/270.1
See application file for complete search history.

(56) References Cited

U.S. PATENT DOCUMENTS

| | | |
|---|---|---|
| 2010/0209827 A1 | 8/2010 | Ohashi et al. |
| 2012/0025386 A1 | 2/2012 | Murata |
| 2013/0022914 A1 | 1/2013 | Tanaka et al. |
| 2014/0205956 A1 | 7/2014 | Iwasawa et al. |
| 2014/0322650 A1* | 10/2014 | Ohashi ................ G03F 7/325 430/281.1 |
| 2015/0140482 A1 | 5/2015 | Yamanaka et al. |
| 2015/0198880 A1* | 7/2015 | Shinomiya ............ C08F 224/00 430/325 |
| 2016/0124309 A1 | 5/2016 | Lee et al. |
| 2016/0266495 A1 | 9/2016 | Hirano et al. |

FOREIGN PATENT DOCUMENTS

| | | |
|---|---|---|
| JP | 2010-215608 A | 9/2010 |
| JP | 2011-219363 A | 11/2011 |
| JP | 2012-180499 A | 9/2012 |
| JP | 2013-033262 A | 2/2013 |
| JP | 2013-257536 A | 12/2013 |
| JP | 2013-257548 A | 12/2013 |
| JP | 2014-26260 A | 2/2014 |
| JP | 2014-048397 A | 3/2014 |
| JP | 2014-142424 A | 8/2014 |
| JP | 2014-225005 A | 12/2014 |
| JP | 2016-091016 A | 5/2016 |
| KR | 10-2015-0127772 A | 11/2015 |
| KR | 10-2016-0045603 A | 4/2016 |

OTHER PUBLICATIONS

Office Action dated Dec. 9, 2019, issued in counterpart KR application No. 10-2018-0088667, with machine English translation (6 pages).
Office Action dated Jul. 7, 2020, issued in counterpart JP Application No. 2017-148008, with English translation (5 pages).

* cited by examiner

*Primary Examiner* — John A McPherson
(74) *Attorney, Agent, or Firm* — Westerman, Hattori, Daniels & Adrian, LLP

(57) ABSTRACT

A polymer comprising units having a highly fused homo-adamantane skeleton at side chain end bonded to the polymer backbone via a linking group has an appropriate solvent solubility and is capable of suppressing acid diffusion. A resist composition comprising the polymer and a specific photoacid generator exhibits a good DOF margin, CD uniformity, and a minimal CD change during PPD, and is quite effective in precise micropatterning.

6 Claims, No Drawings

RESIST COMPOSITION AND PATTERN FORMING PROCESS

CROSS-REFERENCE TO RELATED APPLICATION

This non-provisional application claims priority under 35 U.S.C. § 119(a) on Patent Application No. 2017-148008 filed in Japan on Jul. 31, 2017, the entire contents of which are hereby incorporated by reference.

TECHNICAL FIELD

This invention relates to a resist composition and a pattern forming process.

BACKGROUND ART

Miniaturization is in rapid progress to meet the demand for higher integration density and operating speed of LSIs. As the advanced miniaturization technology, microelectronic devices are manufactured in a mass scale by the ArF immersion lithography involving exposure with a liquid like water interposed between the projection lens and the substrate. Besides, active research efforts are made on the multi-patterning version of ArF lithography and EUV lithography of wavelength 13.5 nm.

In chemically amplified resist compositions for use in the above-mentioned lithography processes, base resin-constituting units containing a lactone ring are important for forming a pattern at a high resolution from the standpoints of adhesion, dissolution contrast, and acid diffusion control. Such units are derived from methacrylic compounds having lactone units such as butyrolactone, valerolactone, norbornane lactone, and cyclohexane lactone, and sultone units. Inter alia, units having a polycyclic lactone containing a homoadamantane skeleton are discussed in Patent Documents 1 to 4.

CITATION LIST

Patent Document 1: JP-A 2011-219363 (US 20130022914)
Patent Document 2: JP-A 2012-180499
Patent Document 3: JP-A 2013-257536
Patent Document 4: JP-A 2014-026260

SUMMARY OF INVENTION

The above-mentioned resist compositions are not sufficient to enable further miniaturization, with respect to some performance factors such as resolution and profile of resist patterns. It is also a problem that pattern size, often referred to as critical dimension (CD), changes as a result of the acid generated in the exposed region diffusing to the unexposed region during post PEB delay (PPD) or a lapse of time from exposure to development.

An object of the invention is to provide a resist composition which exhibits a good DOF margin, CD uniformity, and a minimal CD change during PPD, particularly when hole patterns are formed therefrom; and a pattern forming process using the resist composition.

The inventors have found that a resist composition comprising a base resin having a polycyclic lactone structure containing a homoadamantane skeleton and a specific photoacid generator exhibits improved properties such as a good DOF margin, CD uniformity, and a minimal CD change during PPD, and is quite effective in precise micropatterning. A polymer in which a unit having a highly fused homoadamantane skeleton at side chain end is bonded to the polymer backbone via a linking group has an appropriate solvent solubility and is capable of suppressing acid diffusion. A combination of the polymer with a photoacid generator capable of suppressing acid diffusion, when applied to the organic solvent development process, is successful in achieving a good DOF margin and CD uniformity while suppressing CD changes and pattern profile changes during PPD. The invention is predicated on these findings.

In one aspect, the invention provides a resist composition comprising (A) a base resin containing a resin comprising recurring units having the formula (1) shown below and recurring units having an acid labile group, (B) a photoacid generator containing at least one compound selected from the formulae (B-1) and (B-2) shown below, and (C) a solvent.

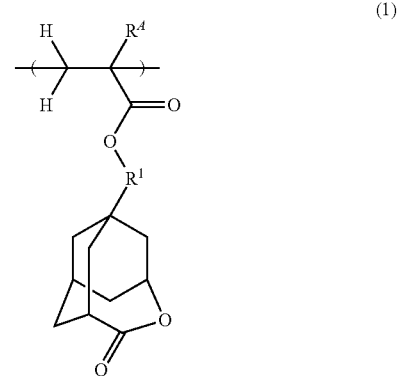

In formula (1), $R^A$ is hydrogen or methyl, $R^1$ is a $C_1$-$C_{10}$ straight, branched or cyclic divalent hydrocarbon group in which at least one carbon atom may be substituted by an ether or carbonyl moiety,

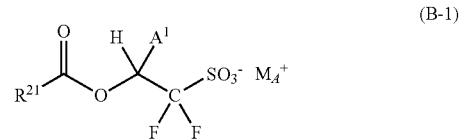

In formula (B-1), $A^1$ is hydrogen or trifluoromethyl, $R^{21}$ is a $C_1$-$C_{35}$ straight, branched or cyclic monovalent hydrocarbon group which may contain oxygen, a nitrogen-containing heterocyclic group, or a group having the formula (i) shown below, $M_A^+$ is an onium cation,

wherein $R^{31}$ and $R^{32}$ are each independently hydrogen or a $C_1$-$C_{20}$ straight, branched or cyclic monovalent hydrocarbon group which may contain a heteroatom, $R^{31}$ and $R^{32}$ may bond together to form a ring with the nitrogen atom to which they are attached, $R^{33}$ is a $C_1$-$C_{20}$ straight, branched or cyclic divalent hydrocarbon group which may contain a heteroatom.

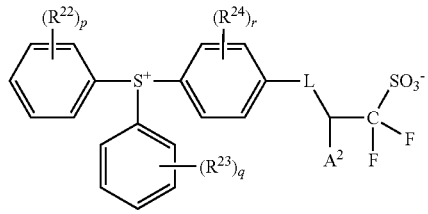
(B-2)

In formula (B-2), $A^2$ is hydrogen or trifluoromethyl, $R^{22}$, $R^{23}$, and $R^{24}$ are each independently hydrogen or a $C_1$-$C_{20}$ straight, branched or cyclic monovalent hydrocarbon group which may contain a heteroatom, p and q are each independently an integer of 0 to 5, r is an integer of 0 to 4, L is a single bond, ether group, or a $C_1$-$C_{20}$ straight, branched or cyclic divalent hydrocarbon group which may contain a heteroatom.

The resist composition may further comprise a photoacid generator having the formula (B-3).

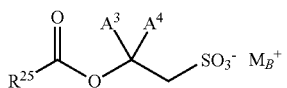
(B-3)

Herein $A^3$ and $A^4$ are each independently hydrogen or trifluoromethyl, excluding that both $A^3$ and $A^4$ are hydrogen at the same time, $R^{25}$ is a $C_1$-$C_{35}$ straight, branched or cyclic monovalent hydrocarbon group which may contain oxygen, a nitrogen-containing heterocyclic group, or a group of the formula (i), and $M_B^+$ is an onium cation.

In a preferred embodiment, the onium cation is at least one cation selected from the formulae (B-4) and (B-5).

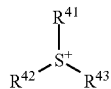
(B-4)

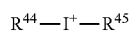
(B-5)

Herein $R^{41}$ to $R^{45}$ are each independently a $C_1$-$C_{20}$ straight, branched or cyclic monovalent hydrocarbon group which may contain a heteroatom, any two of $R^{41}$, $R^{42}$ and $R^{43}$ may bond together to form a ring with the sulfur atom in the formula.

In a preferred embodiment, the photoacid generator contains at least two compounds selected from the formulae (B-1) and (B-2), at least one of which is a compound of the formula (B-2).

The resist composition may further comprise (D) a fluororesin different from the resin as component (A), the fluororesin comprising recurring units of at least one type selected from the formulae (D-1), (D-2) and (D-3).

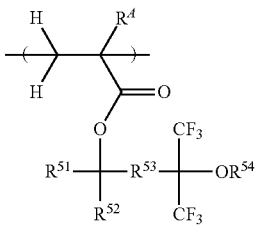
(D-1)

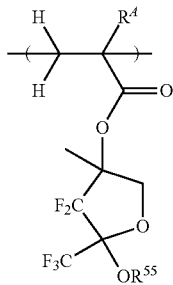
(D-2)

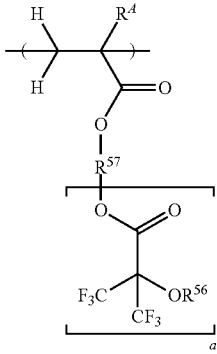
(D-3)

Herein $R^A$ is as defined above, $R^{51}$ and $R^{52}$ are each independently hydrogen or a $C_1$-$C_{10}$ straight, branched or cyclic monovalent hydrocarbon group, $R^{53}$ is a single bond or a $C_1$-$C_5$ straight or branched divalent hydrocarbon group, $R^{54}$, $R^{55}$ and $R^{56}$ are each independently hydrogen or a $C_1$-$C_{15}$ straight, branched or cyclic monovalent hydrocarbon, fluorinated hydrocarbon or acyl group, or an acid labile group, with the proviso that when $R^{54}$, $R^{55}$ and $R^{56}$ each are a monovalent hydrocarbon or fluorinated hydrocarbon group, at least one carbon atom in the group may be substituted by an ether or carbonyl moiety, $R^{57}$ is a $C_1$-$C_{20}$ straight, branched or cyclic (a+1)-valent hydrocarbon or fluorinated hydrocarbon group, and a is an integer of 1 to 3.

In another aspect, the invention provides a process for forming a pattern comprising the steps of applying the resist composition defined above onto a substrate, prebaking to form a resist film, exposing the resist film to ArF excimer laser, EB or EUV, baking, and developing the exposed film in a developer.

In a preferred embodiment, the exposing step is by immersion lithography wherein a liquid having a refractive index of at least 1.0 is interposed between the resist film and a projection lens. In this embodiment, a protective film is formed on the resist film, and in the immersion lithography, the liquid is interposed between the protective film and the projection lens.

Advantageous Effects of Invention

The resist composition of the invention is successful in forming a resist pattern with a good DOF margin and CD uniformity while suppressing CD changes and pattern profile changes during PPD, particularly when the pattern is a hole pattern.

DESCRIPTION OF PREFERRED EMBODIMENTS

In the disclosure, the singular forms "a," "an" and "the" include plural referents unless the context clearly dictates otherwise. The notation (Cn-Cm) means a group containing from n to m carbon atoms per group. In the chemical formulae, the broken line denotes a valence bond.

The abbreviations and acronyms have the following meaning.
EB: electron beam
EUV: extreme ultraviolet
PAG: photoacid generator
Mw: weight average molecular weight
Mn: number average molecular weight
Mw/Mn: molecular weight distribution or dispersity
GPC: gel permeation chromatography
PEB: post-exposure bake
LWR: line width roughness
DOF: depth of focus
CDU: critical dimension uniformity It is understood that for some structures represented by chemical formulae, there can exist stereoisomers (enantiomers or diastereomers). In such cases, a single formula collectively represents all such isomers unless otherwise stated. The isomers may be used alone or in admixture.

Resist Composition
(A) Base Resin

The resist composition is defined as comprising (A) a base resin containing a resin comprising recurring units having the formula (1) shown below and recurring units having an acid labile group. For simplicity sake, the resin comprising recurring units of formula (1) is referred to as Resin A, hereinafter.

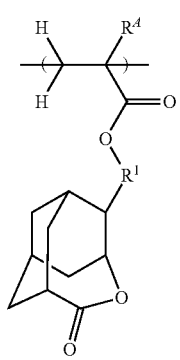
(1)

Herein $R^4$ is hydrogen or methyl. $R^1$ is a $C_1$-$C_{10}$ straight, branched or cyclic divalent hydrocarbon group in which at least one carbon atom may be substituted by an ether moiety (—O—) or carbonyl moiety (—C(=O)—).

Suitable divalent hydrocarbon groups include methylene, ethylene, trimethylene, propylene, tetramethylene, and pentamethylene.

Of the recurring units of formula (1), units of the following formula (1') are preferred.

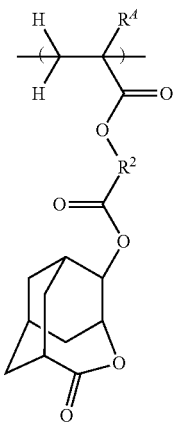
(1')

Herein $R^4$ is as defined above. $R^2$ is a $C_1$-$C_8$ straight, branched or cyclic divalent hydrocarbon group in which at least one carbon atom may be substituted by an ether or carbonyl moiety.

Examples of the recurring units of formula (1) are shown below, but not limited thereto. Herein $R^4$ is as defined above.

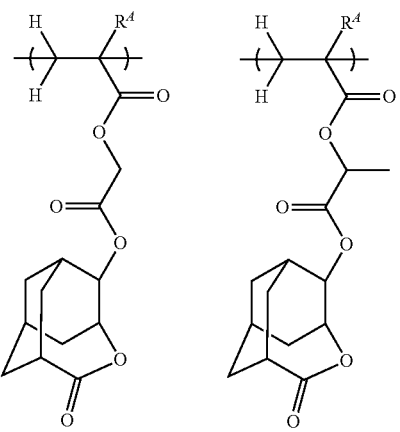

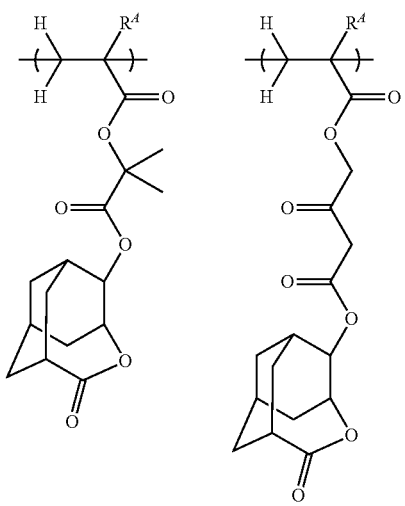

-continued

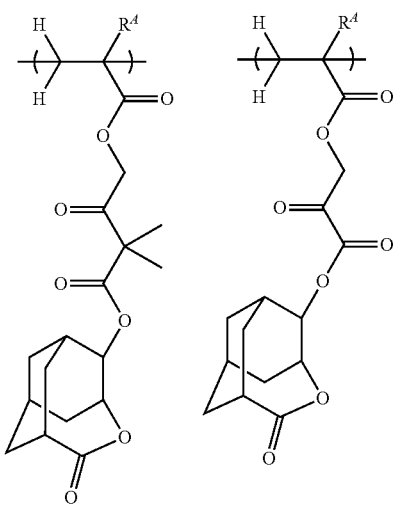

Resin A further contains recurring units having an acid labile group. The preferred units are units having the following formula (2).

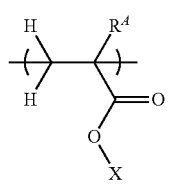
(2)

Herein $R^A$ is as defined above and X is an acid labile group.

A resin comprising recurring units of formula (2) is decomposed under the action of acid to generate a carboxyl group so that it may turn alkali soluble. The acid labile group X may be selected from a variety of such groups. Examples of the acid labile group are groups of the following formulae (L1) to (L9), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

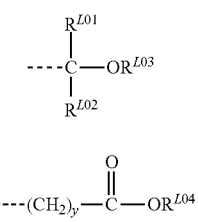
(L1)

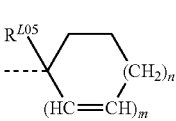
(L2)

(L3)

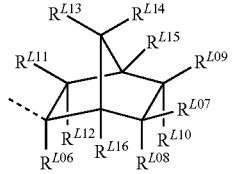
(L4)

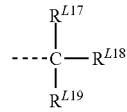
(L5)

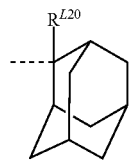
(L6)

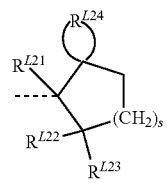
(L7)

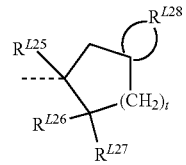
(L8)

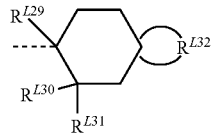
(L9)

In formula (L1), $R^{L01}$ and $R^{L02}$ are each independently hydrogen or a straight, branched or cyclic alkyl group of 1 to 18 carbon atoms, preferably 1 to 10 carbon atoms, examples of which include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of alkyl groups in which one or more hydrogen is substituted by hydroxyl, alkoxy, oxo, amino, alkylamino or the like. Exemplary substituted alkyl groups are illustrated below.

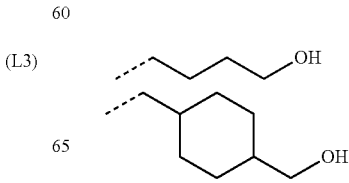

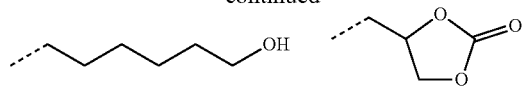

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$, and $R^{L03}$ is a straight or branched alkylene group of 1 to 18 carbon atoms, preferably 1 to 10 carbon atoms when they form a ring.

In formula (L2), $R^{L04}$ is a $C_4$-$C_{20}$, preferably $C_4$-$C_{15}$ tertiary alkyl group, a trialkylsilyl group in which each alkyl moiety has 1 to 6 carbon atoms, a $C_4$-$C_{20}$ oxoalkyl group, or a group of formula (L1). Suitable tertiary alkyl groups include tert-butyl, tert-pentyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Suitable trialkylsilyl groups include trimethylsilyl, triethylsilyl, and dimethyl-tert-butylsilyl. Suitable oxyalkyl groups include 3-oxocyclohexyl, 4-methyl-2-oxooxan-4-yl, and 5-methyl-2-oxooxolan-5-yl. In formula (L2), y is an integer of 0 to 6.

In formula (L3), $R^{L05}$ is an optionally substituted, straight, branched or cyclic $C_1$-$C_8$ alkyl group or optionally substituted $C_6$-$C_{20}$ aryl group. Examples of the optionally substituted alkyl groups include straight, branched or cyclic ones such as methyl, ethyl, propyl, isopropyl, n-butyl, sec-butyl, tert-butyl, tert-pentyl, n-pentyl, n-hexyl, cyclopentyl, and cyclohexyl; and substituted forms of alkyl groups in which one or more hydrogen is substituted by hydroxyl, alkoxy, carboxyl, alkoxycarbonyl, oxo, amino, alkylamino, cyano, mercapto, alkylthio, sulfo or the like. Exemplary optionally substituted aryl groups are phenyl, methylphenyl, naphthyl, anthryl, phenanthryl, and pyrenyl. In formula (L3), m is 0 or 1, n is an integer of 0 to 3, and 2m+n is equal to 2 or 3.

In formula (L4), $R^{L6}$ is an optionally substituted, straight, branched or cyclic $C_1$-$C_8$ alkyl group or optionally substituted $C_6$-$C_{20}$ aryl group. Examples are as exemplified for $R^{L05}$. $R^{L07}$ to $R^{L16}$ each independently denote hydrogen or a $C_1$-$C_{15}$ monovalent hydrocarbon group. Exemplary hydrocarbon groups are straight, branched or cyclic alkyl groups such as methyl, ethyl, propyl, isopropyl, n-butyl, sec-butyl, tert-butyl, tert-pentyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of alkyl groups in which one or more hydrogen is substituted by hydroxyl, alkoxy, carboxyl, alkoxycarbonyl, oxo, amino, alkylamino, cyano, mercapto, alkylthio, sulfo or the like. Alternatively, any two of $R^{L07}$ to $R^{L16}$ may bond together to form a ring (e.g., $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, or $R^{L13}$ and $R^{L14}$). A ring-forming combination of $R^{L07}$ to $R^{L16}$ is a $C_1$-$C_{15}$ divalent hydrocarbon group, examples of which are those exemplified above for the monovalent hydrocarbon groups, with one hydrogen atom being eliminated. Also a pair of $R^{L07}$ to $R^{L16}$ which are attached to vicinal carbon atoms may bond together directly to form a double bond (e.g., $R^{L07}$ and $R^{L09}$, $R^{L09}$ and $R^{L15}$, or $R^{L13}$ and $R^{L15}$).

In formula (L5), $R^{L17}$ to $R^{L19}$ are each independently a $C_1$-$C_{15}$ straight, branched or cyclic alkyl group. Suitable alkyl groups include methyl, ethyl, propyl, isopropyl, n-butyl, sec-butyl, tert-butyl, cyclopentyl, cyclohexyl, 2-ethylhexyl, n-octyl, 1-adamantyl and 2-adamantyl.

In formula (L6), $R^{L20}$ is an optionally substituted, straight, branched or cyclic $C_1$-$C_{10}$ alkyl group or optionally substituted $C_6$-$C_{20}$ aryl group. Examples are as exemplified for $R^{L05}$.

In formula (L7), $R^{L21}$ is an optionally substituted, straight, branched or cyclic $C_1$-$C_{10}$ alkyl group or optionally substituted $C_6$-$C_{20}$ aryl group. Examples are as exemplified for $R^{L05}$. $R^{L22}$ and $R^{L23}$ are each independently hydrogen or a $C_1$-$C_{15}$ straight, branched or cyclic monovalent hydrocarbon group. $R^{L22}$ and $R^{L23}$ may bond together to form a ring with the carbon atom to which they are attached, and the ring is a substituted or unsubstituted cyclopentane or cyclohexane ring. $R^{L24}$ is a divalent group which forms a substituted or unsubstituted cyclopentane, cyclohexane or norbornane ring with the carbon atom to which it is attached. In formula (L7), s is 1 or 2.

In formula (L8), $R^{L25}$ is an optionally substituted, straight, branched or cyclic $C_1$-$C_{10}$ alkyl group or optionally substituted $C_6$-$C_{20}$ aryl group. Examples are as exemplified for $R^{L05}$. $R^{L28}$ is a divalent group which forms a substituted or unsubstituted cyclopentane, cyclohexane or norbornane ring with the carbon atom to which it is attached. $R^{L26}$ and $R^{L27}$ are each independently hydrogen or a $C_1$-$C_{10}$ straight, branched or cyclic monovalent hydrocarbon group. $R^{L26}$ and $R^{L27}$ may bond together to form a ring with the carbon atom to which they are attached, and the ring is a substituted or unsubstituted cyclopentane or cyclohexane ring. In formula (L8), t is 1 or 2.

In formula (L9), $R^{L29}$ is an optionally substituted, straight, branched or cyclic $C_1$-$C_{10}$ alkyl group or optionally substituted $C_6$-$C_{20}$ aryl group. Examples are as exemplified for $R^{L05}$. $R^{L30}$ and $R^{L31}$ are each independently hydrogen or a $C_1$-$C_{10}$ straight, branched or cyclic monovalent hydrocarbon group. $R^{L30}$ and $R^{L31}$ may bond together to form a ring with the carbon atom to which they are attached, and the ring is a substituted or unsubstituted cyclopentane or cyclohexane ring. $R^{L32}$ is a divalent group which forms a substituted or unsubstituted cyclopentane, cyclohexane or norbornane ring with the carbon atom to which it is attached.

Of the acid labile groups of formula (L1), the straight or branched groups are exemplified below, but not limited thereto.

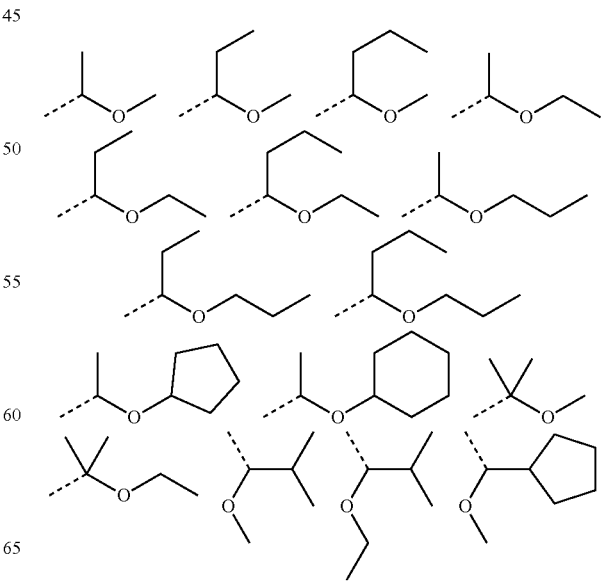

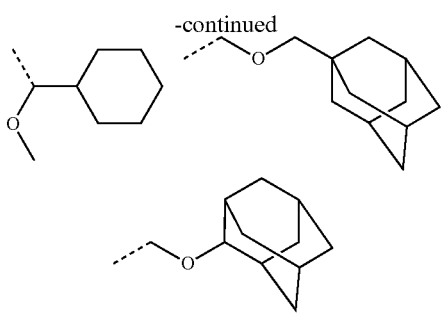

Of the acid labile groups of formula (L1), the cyclic groups are, for example, tetrahydrofuran-2-yl, 2-methyltetrahydrofuran-2-yl, tetrahydropyran-2-yl, and 2-methyltetrahydropyran-2-yl.

Examples of the acid labile group of formula (L2) include tert-butoxycarbonyl, tert-butoxycarbonylmethyl, tert-pentyloxycarbonyl, tert-pentyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile group of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-tert-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

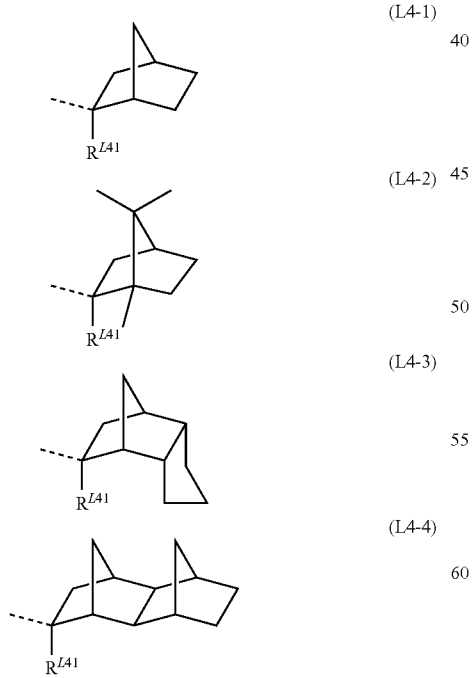

In formulas (L4-1) to (L4-4), the broken line denotes a bonding site and direction. $R^{L41}$ is each independently a monovalent hydrocarbon group, typically a $C_1$-$C_{10}$ straight, branched or cyclic alkyl group, such as methyl, ethyl, propyl, isopropyl, n-butyl, sec-butyl, tert-butyl, tert-pentyl, n-pentyl, n-hexyl, cyclopentyl and cyclohexyl.

For formulas (L4-1) to (L4-4), there can exist stereoisomers (enantiomers or diastereomers). Each of formulae (L4-1) to (L4-4) collectively represents all such stereoisomers. Such stereoisomers may be used alone or in admixture.

For example, the formula (L4-3) represents one or a mixture of two selected from groups having the following formulas (L4-3-1) and (L4-3-2).

(L4-3-1)

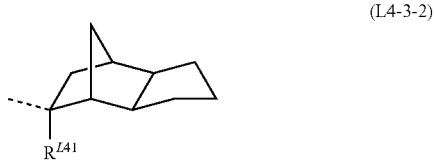

(L4-3-2)

Note that $R^{L41}$ is as defined above.

Similarly, the formula (L4-4) represents one or a mixture of two or more selected from groups having the following formulas (L4-4-1) to (L4-4-4).

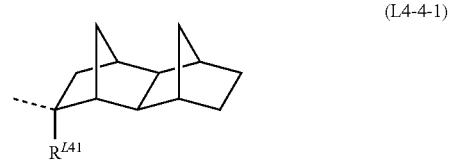

(L4-4-1)

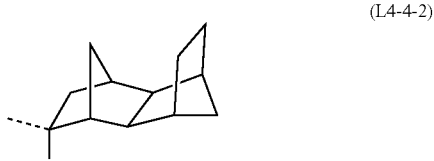

(L4-4-2)

(L4-4-3)

(L4-4-4)

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

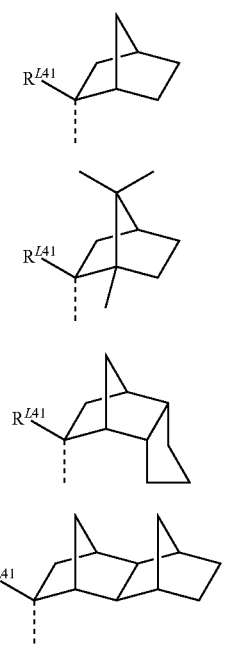

Note that $R^{L41}$ is as defined above.

Examples of the acid labile group of formula (L4) are given below, but are not limited thereto.

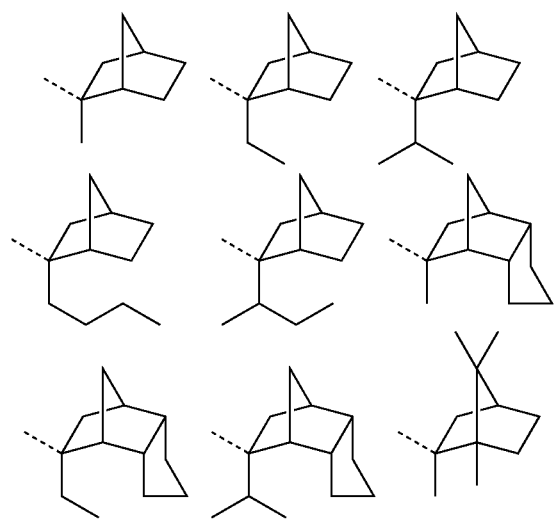

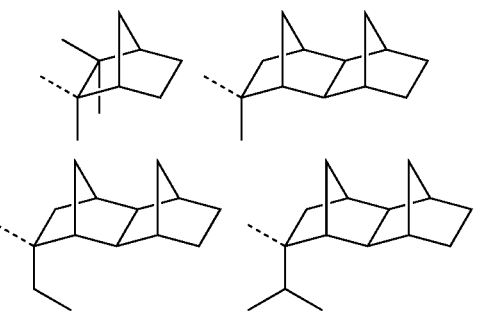

Examples of the acid labile group of formula (L5) include tert-butyl, tert-pentyl and the groups shown below, but are not limited thereto.

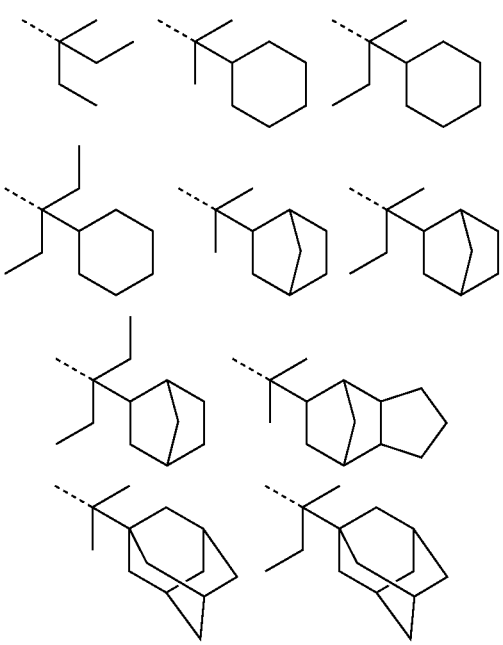

Examples of the acid labile group of formula (L6) are given below, but not limited thereto.

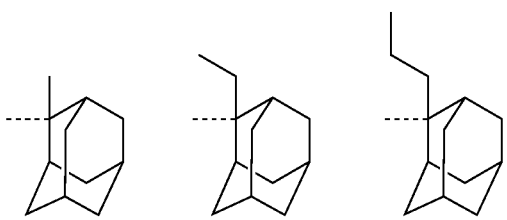

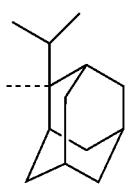
Examples of the acid labile group of formula (L7) are given below, but not limited thereto.
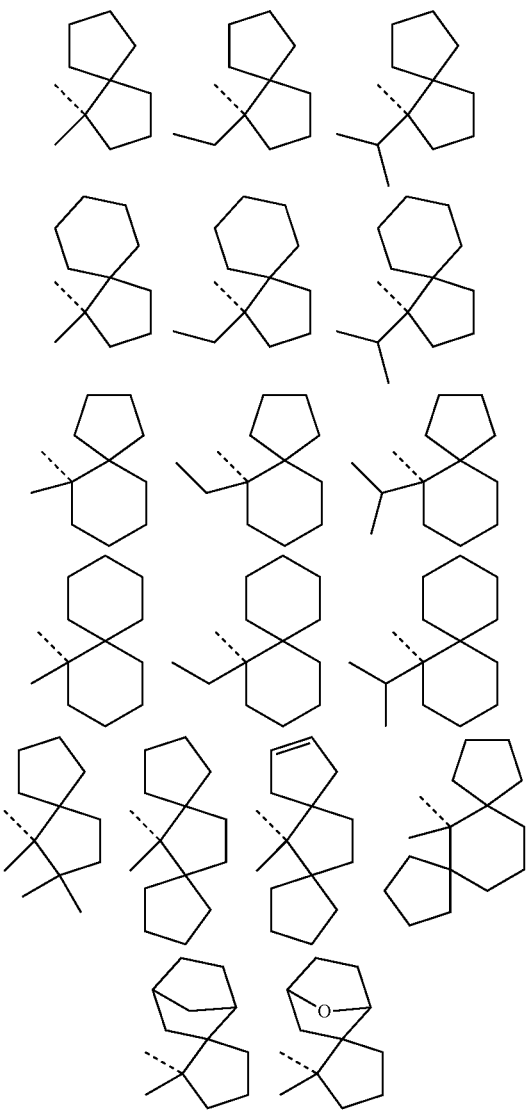
Examples of the acid labile group of formula (L8) are given below, but not limited thereto.
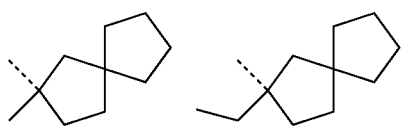
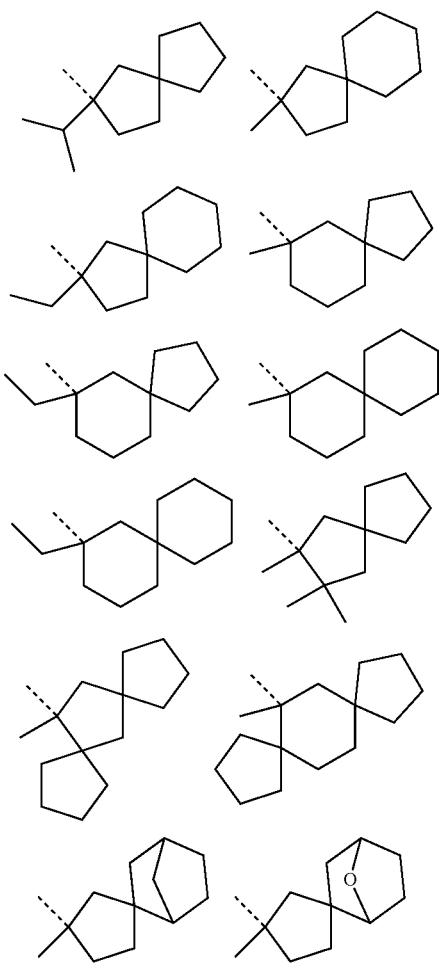
Examples of the acid labile group of formula (L9) are given below, but not limited thereto.
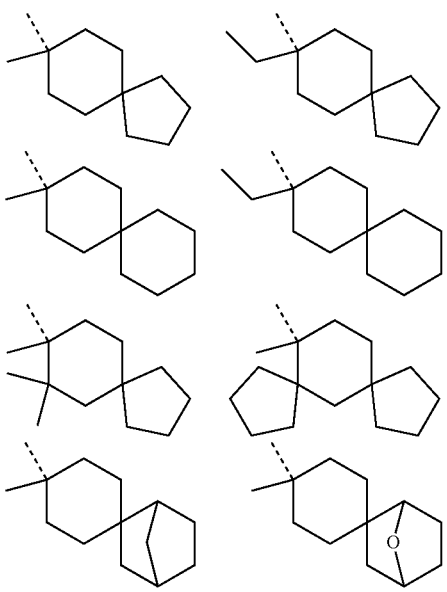

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{L04}$.
Examples of the recurring units having formula (2) are given below, but not limited thereto. $R^A$ is as defined above.
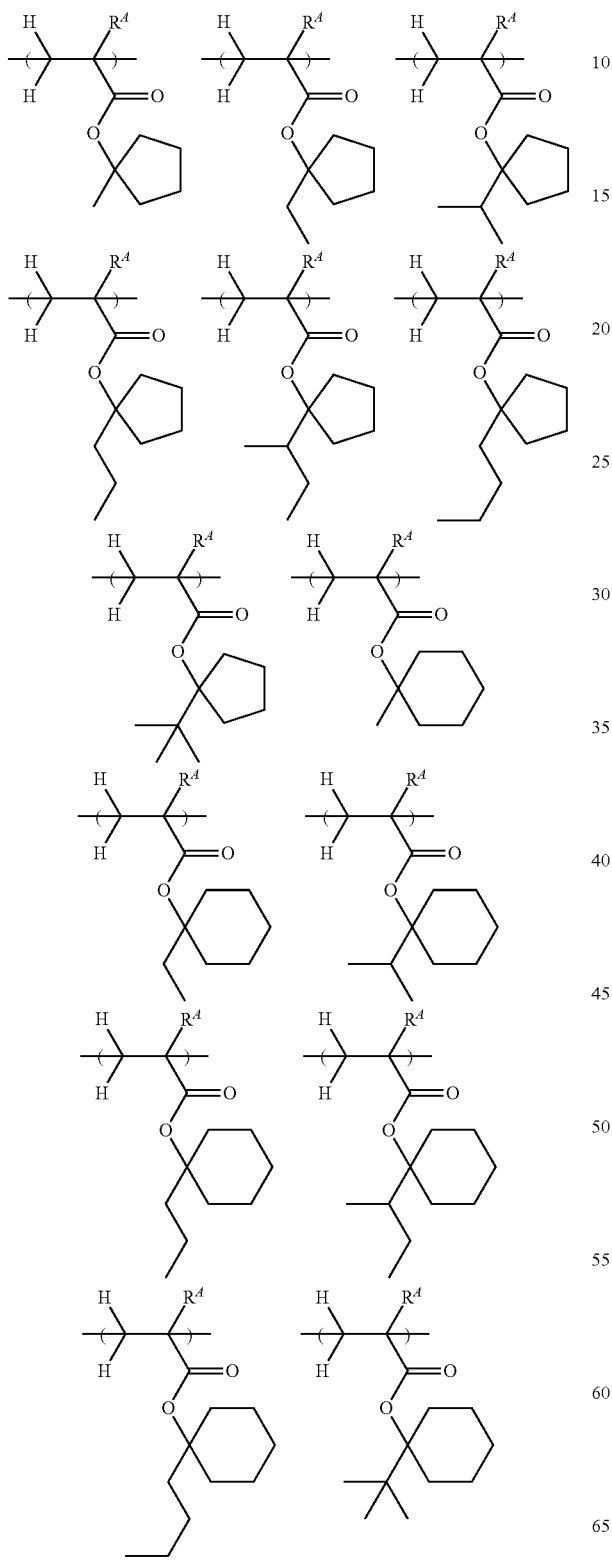
-continued
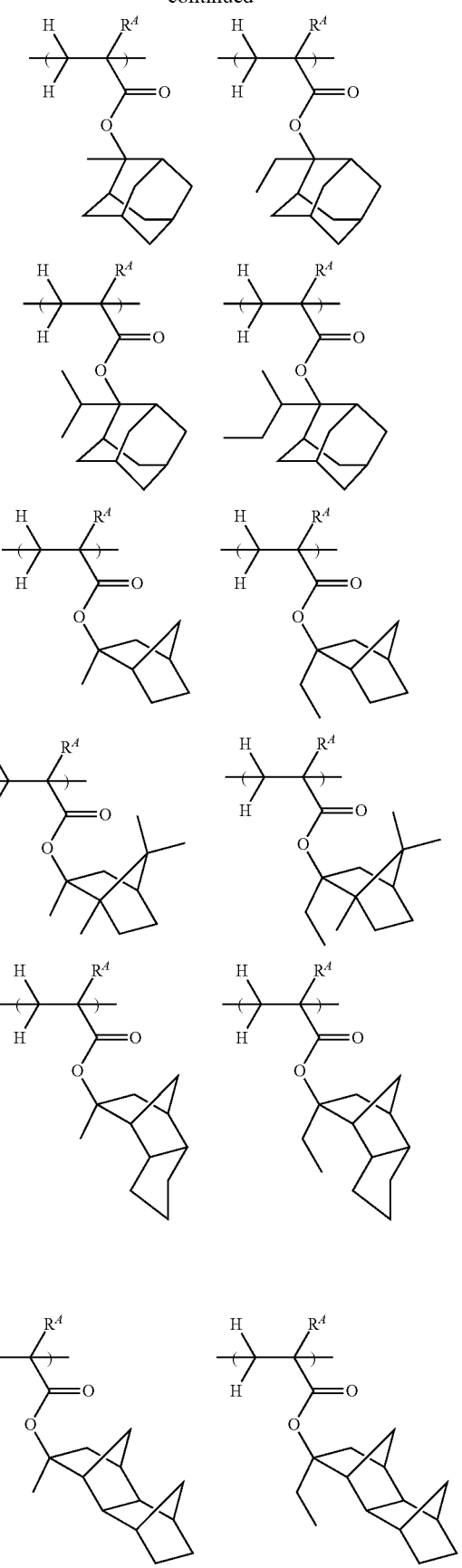

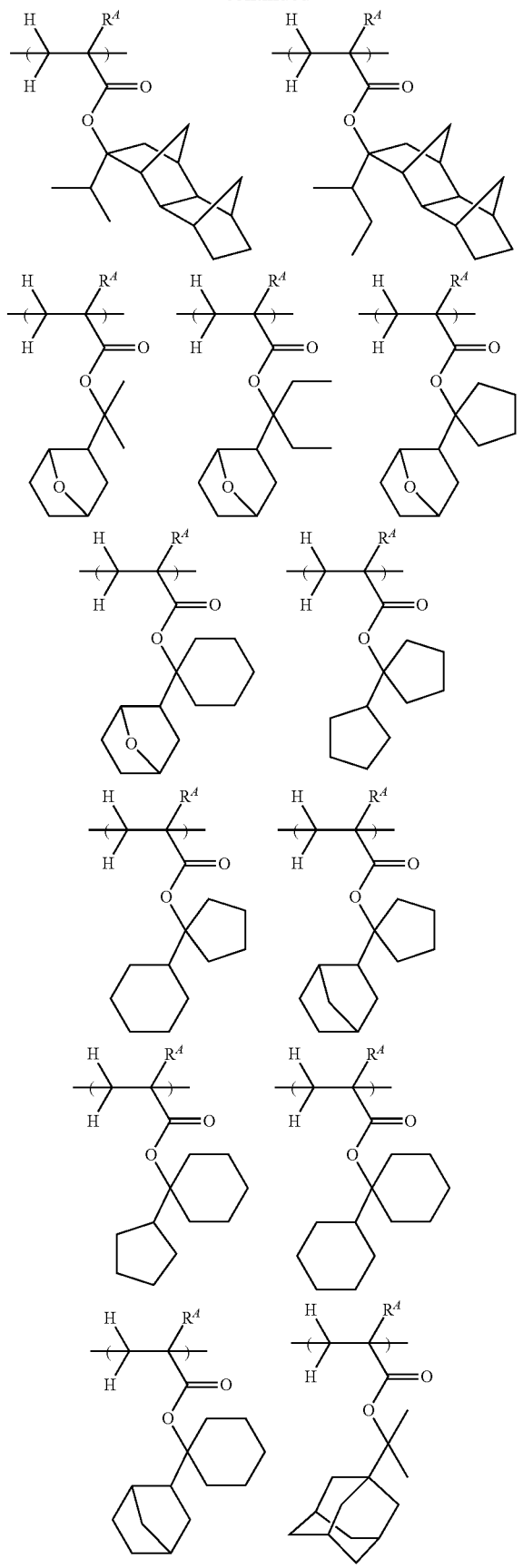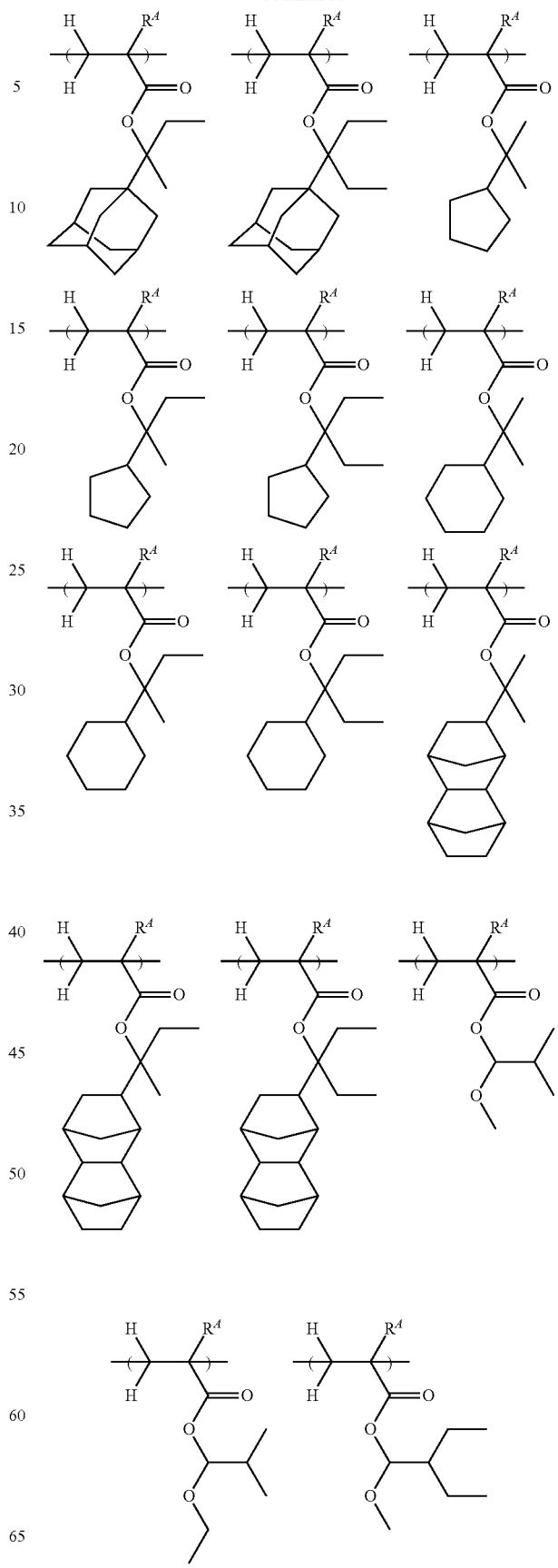

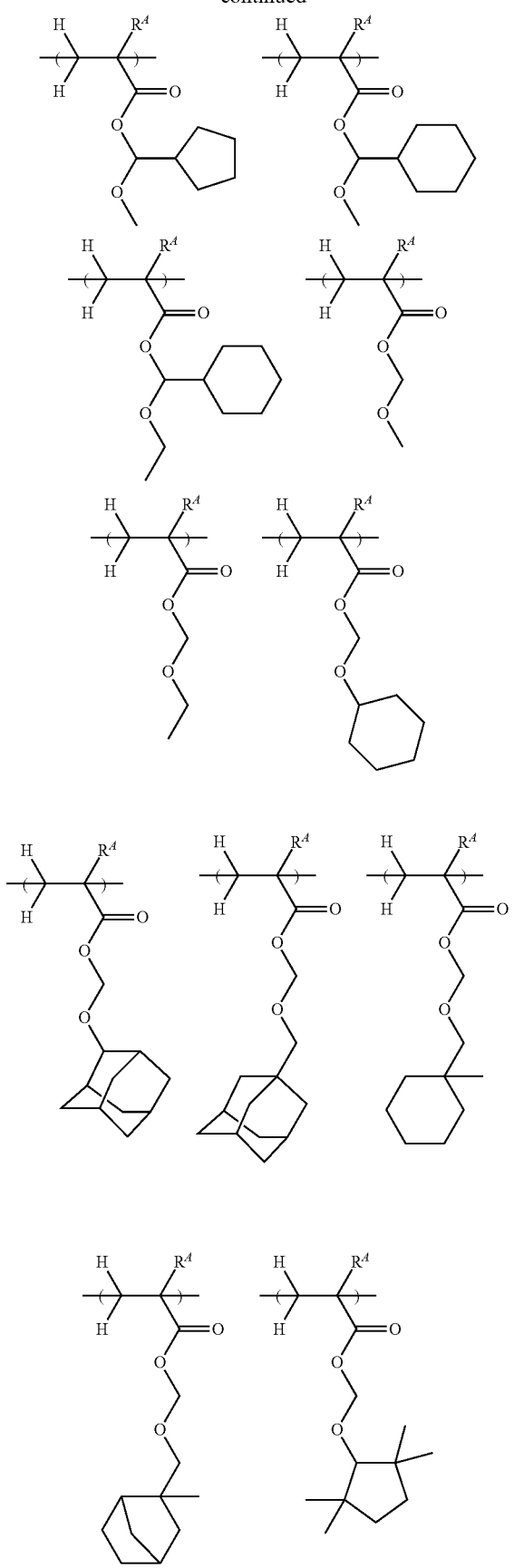
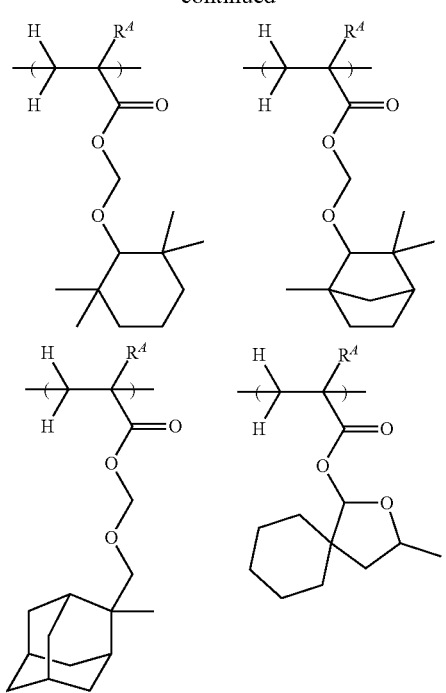
Resin A may further comprise recurring units of at least one type selected from recurring units having the formulae (3) to (5).
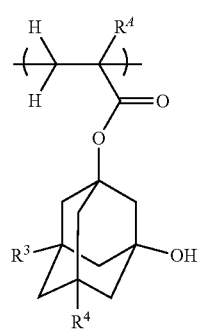
(3)
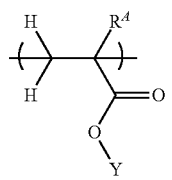
(4)

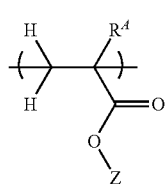
(5)

Herein $R^A$ is as defined above. $R^3$ and $R^4$ are each independently hydrogen or hydroxyl. Y is a substituent group containing a lactone structure different from formula (1) or a substituent group containing a sultone structure. Z is hydrogen, a $C_1$-$C_{15}$ fluorinated hydrocarbon group, or a $C_1$-$C_{15}$ fluoroalcohol-containing substituent group.

Examples of the recurring units having formula (3) are given below, but not limited thereto. Herein $R^A$ is as defined above.

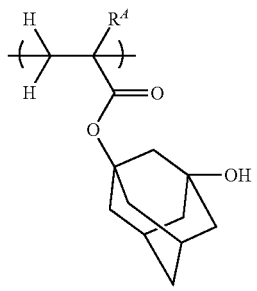

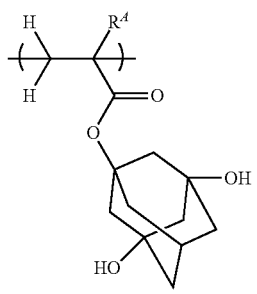

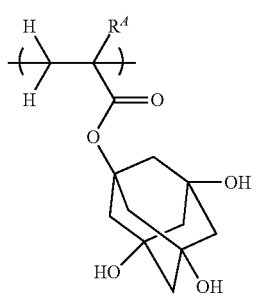

Examples of the recurring units having formula (4) are given below, but not limited thereto. Herein $R^A$ is as defined above.

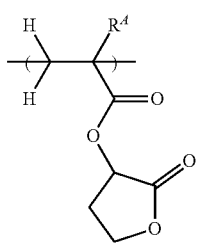 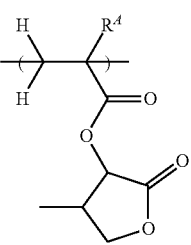

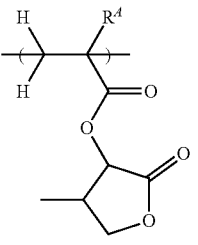 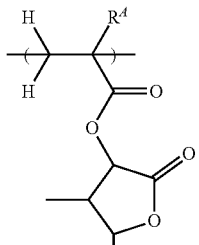

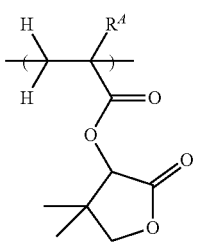 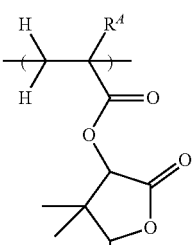

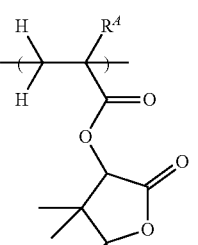 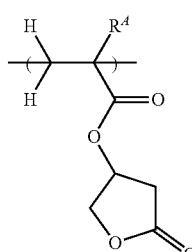

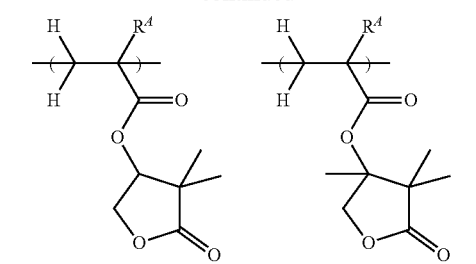
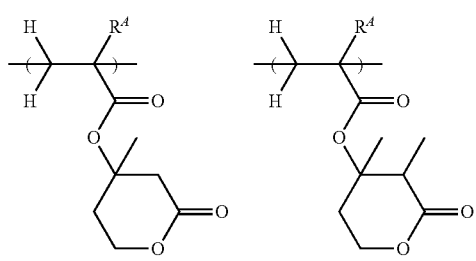
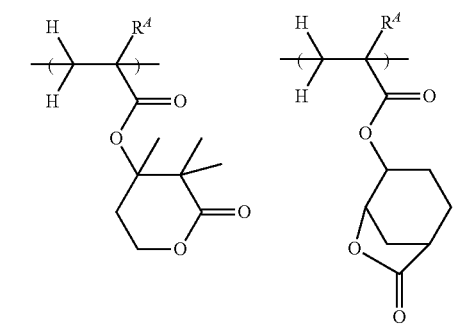
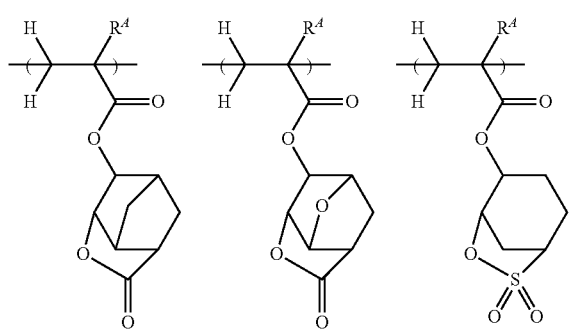
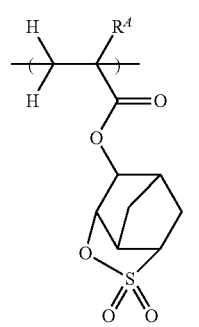
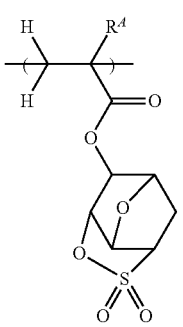
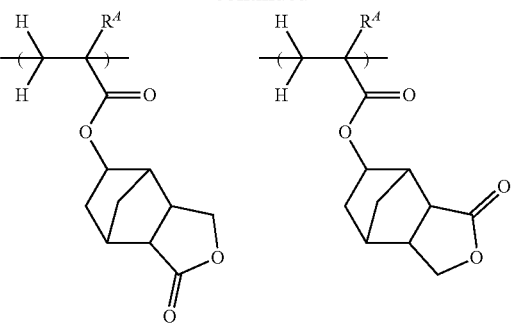
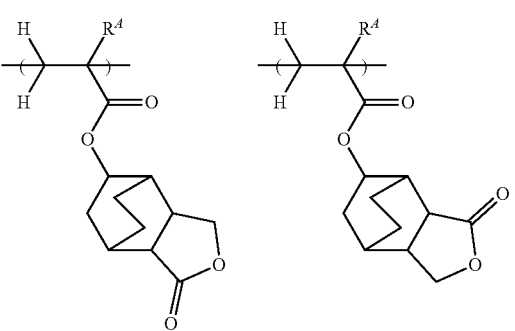
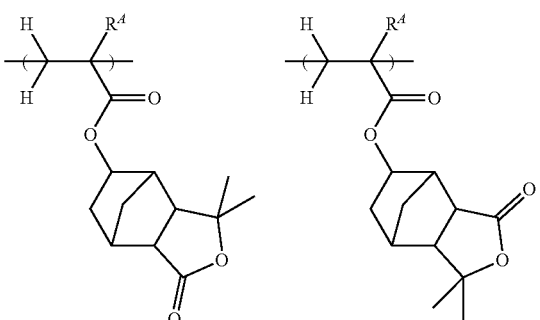
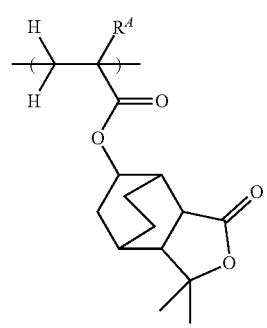
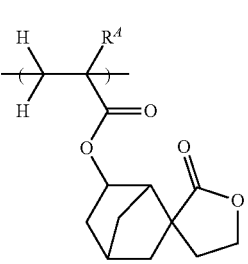

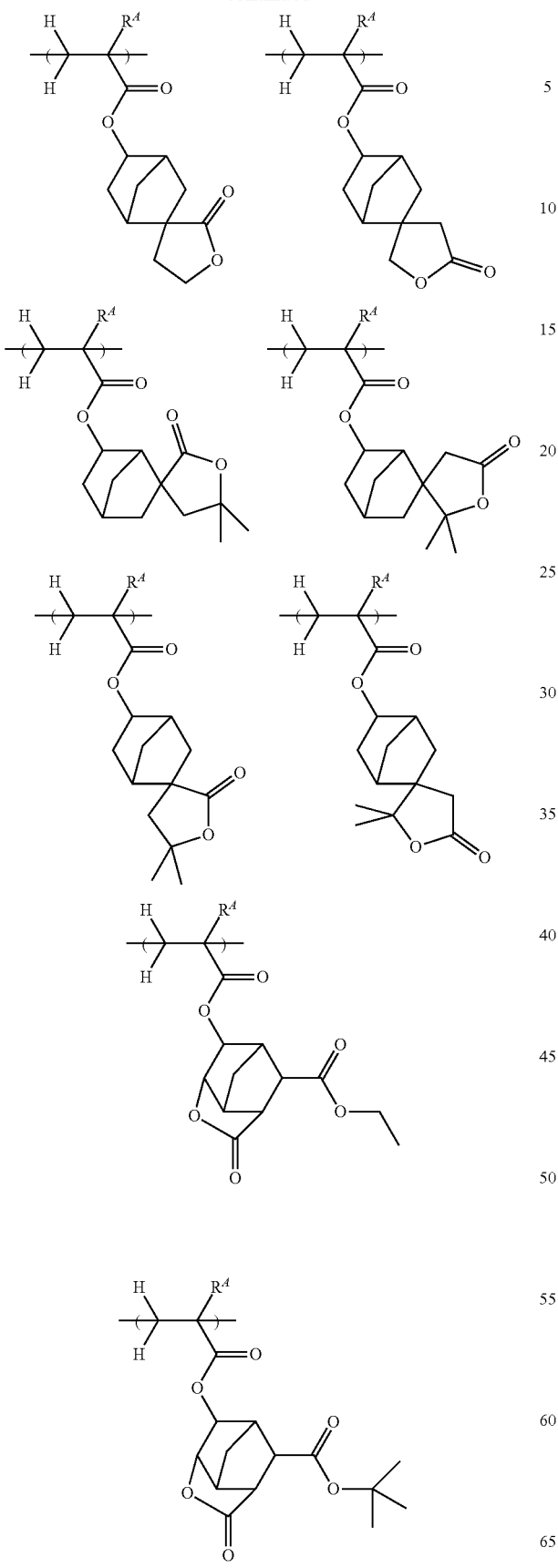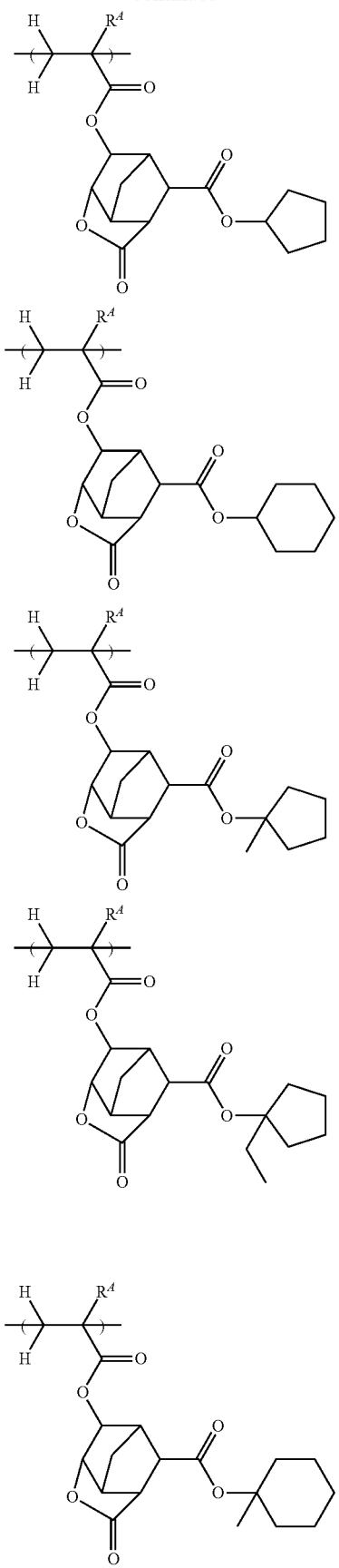

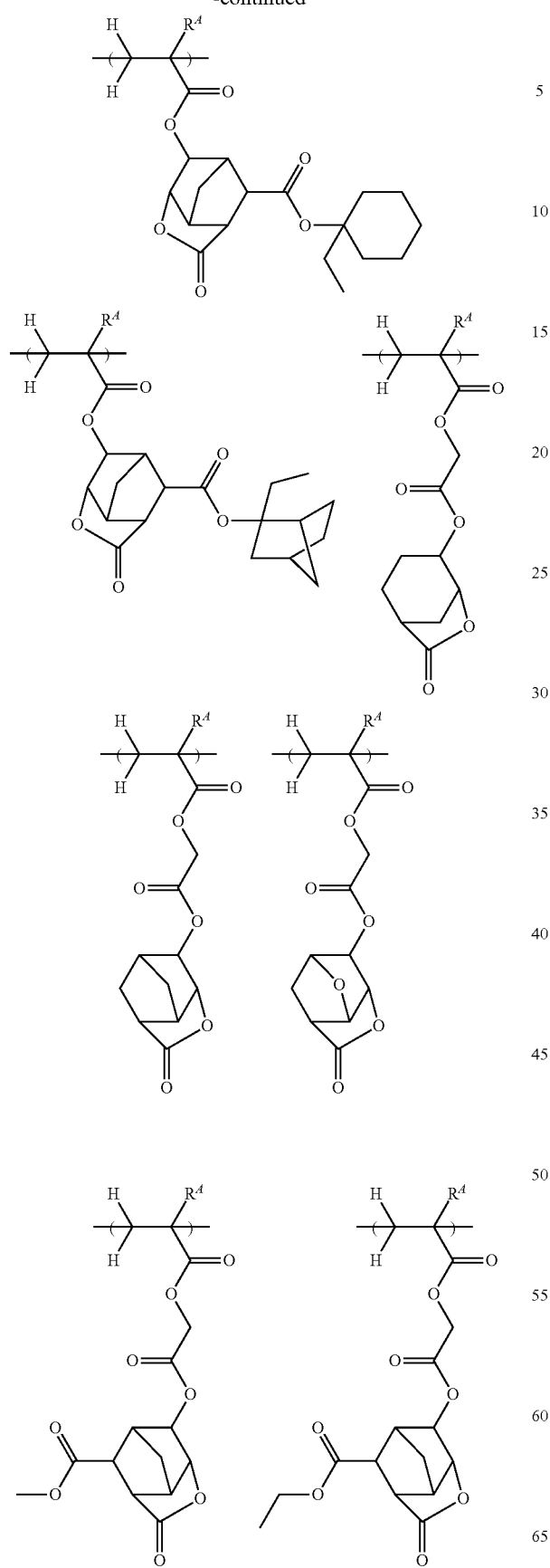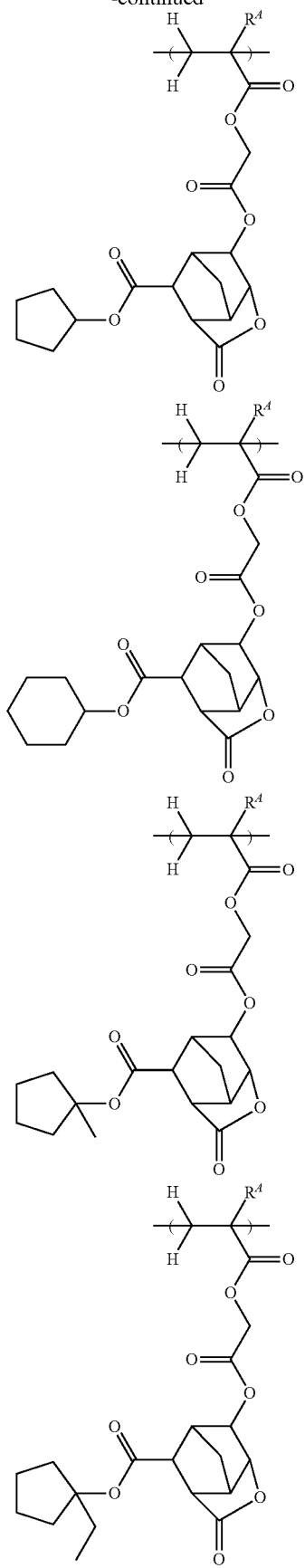

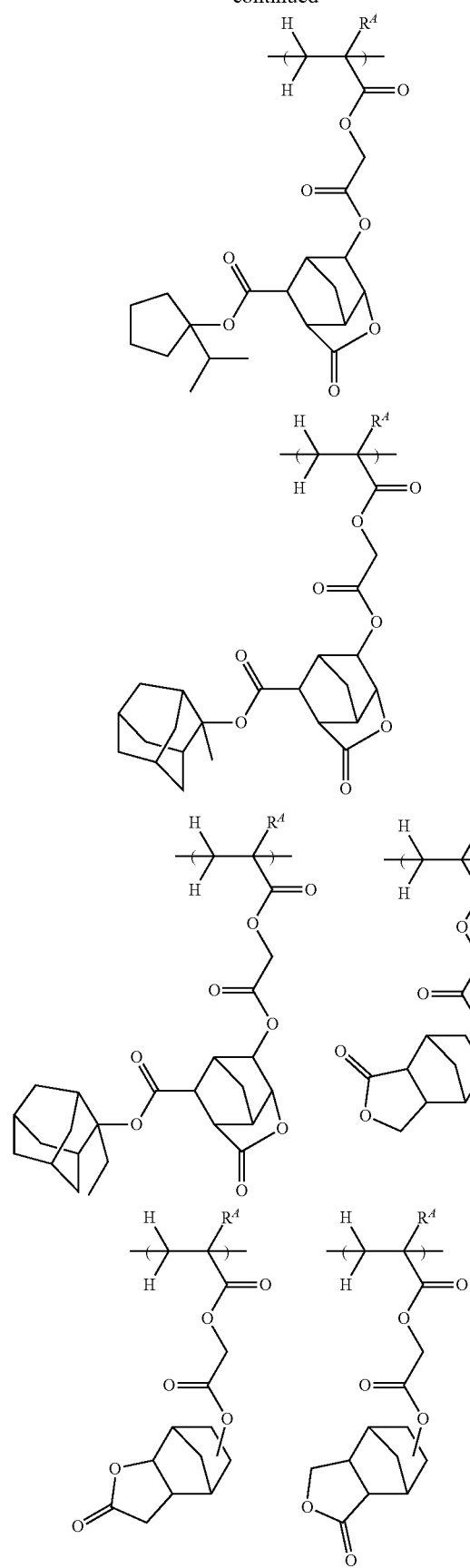
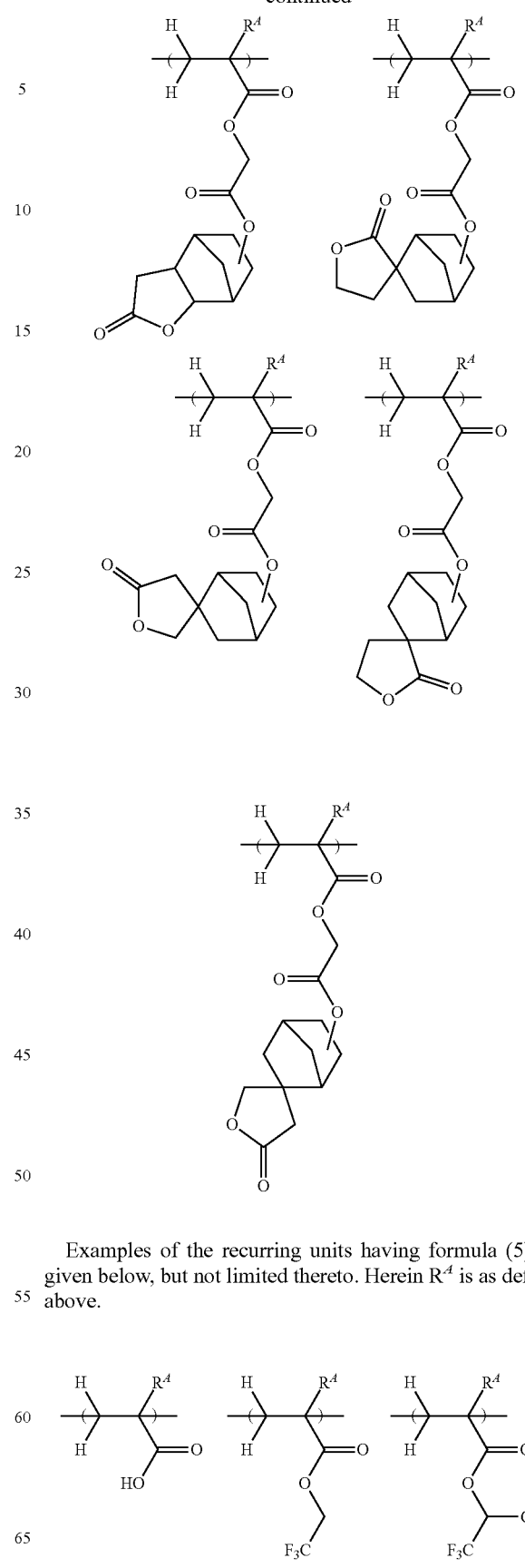
Examples of the recurring units having formula (5) are given below, but not limited thereto. Herein $R^A$ is as defined above.
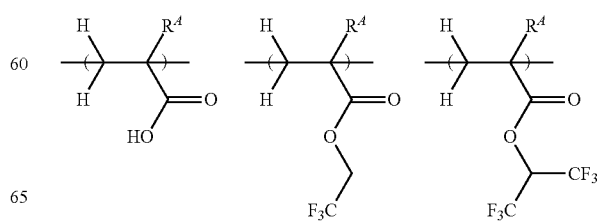

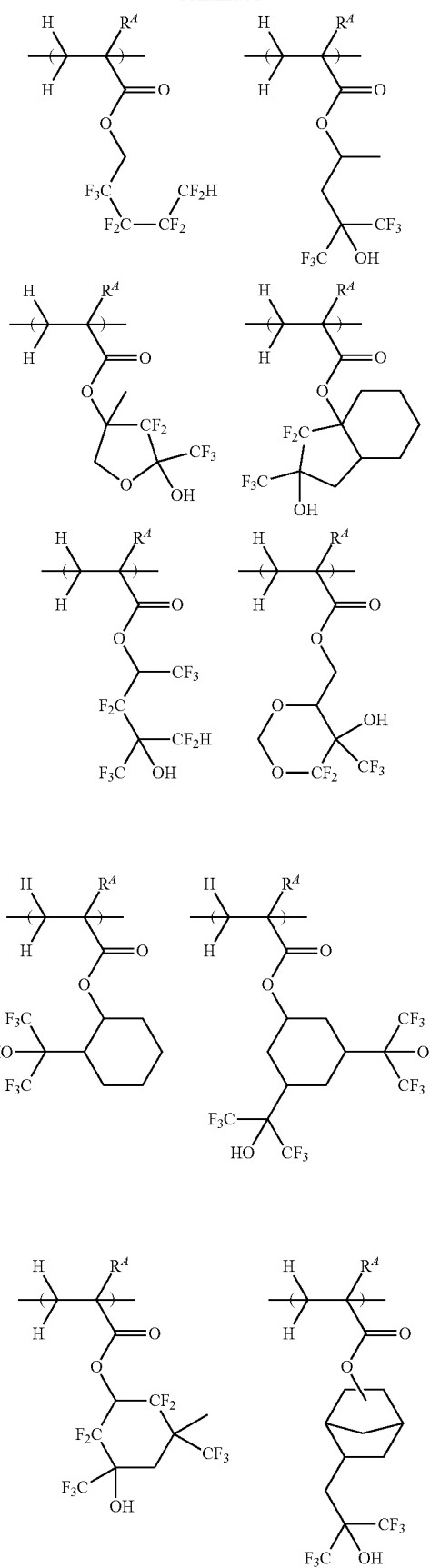

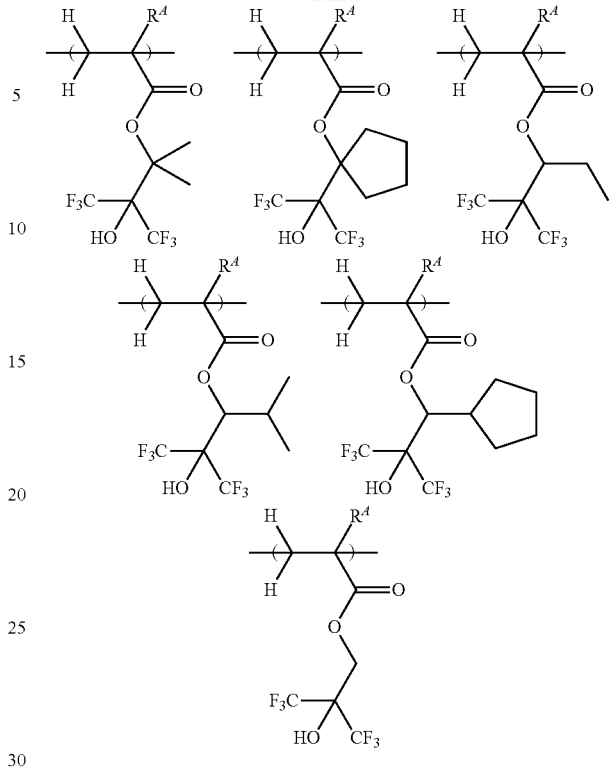

In addition to the foregoing units, Resin A may further comprise recurring units derived from carbon-to-carbon double bond-bearing monomers other than the above-described ones, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[4.4.0.1$^{2,5}$.1$^{7,10}$]dodecene derivatives, unsaturated acid anhydrides such as itaconic anhydride, and other monomers.

Resin A should preferably have a weight average molecular weight (Mw) in the range of 1,000 to 500,000, and more preferably 3,000 to 100,000, as measured versus polystyrene standards by GPC using tetrahydrofuran (THF) solvent. A Mw within the range eliminates such risks as a loss of etch resistance, a failure to provide a contrast before and after exposure, and a lowering of resolution.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, Resin A should preferably have a narrow dispersity (Mw/Mn) of 1.0 to 2.0, especially 1.0 to 1.5, in order to provide a resist composition suitable for micropatterning to a small feature size.

Resin A may be synthesized by any desired methods, for example, by dissolving one or more unsaturated bond-bearing monomers corresponding to the recurring unit having formula (1), the recurring unit having formula (2), and optionally recurring units selected from formulae (3) to (5) in an organic solvent, adding a radical initiator thereto, and heating for polymerization. Examples of the organic solvent which can be used for polymerization include toluene, benzene, THF, diethyl ether, dioxane, methyl ethyl ketone (MEK), propylene glycol monomethyl ether acetate (PGMEA), and γ-butyrolactone. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 150° C., preferably 60 to 100° C. for polymerization to take place. The reaction time is preferably 2 to 24 hours. The acid labile group that has been incorporated in the monomer may be kept as such, or polymerization may be followed by protection or partial protection. During the polymer synthesis, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

In Resin A, the recurring units derived from various monomers are preferably incorporated in the following molar fractions (mol %):

(I) 1 to 99 mol %, more preferably 20 to 95 mol %, and even more preferably 30 to 90 mol % of recurring units of formula (1);

(II) 1 to 99 mol %, more preferably 5 to 80 mol %, and even more preferably 10 to 70 mol % of recurring units of formula (2);

(III) 0 to 99 mol %, more preferably 1 to 90 mol %, and even more preferably 10 to 70 mol % of recurring units of at least one type selected from formulae (3) to (5); and (IV) 0 to 99 mol %, more preferably 0 to 70 mol %, and even more preferably 0 to 50 mol % of other recurring units. The proportion of units is not limited to the above range.

The base resin as component (A) may contain two or more Resins A which differ in compositional ratio, Mw or Mw/Mn, or another resin free of recurring units of formula (1) in addition to Resin A.

(B) PAG

The resist composition also comprises (B) a photoacid generator containing at least one compound selected from the following formulae (B-1) and (B-2).

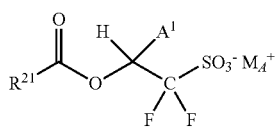

(B-1)

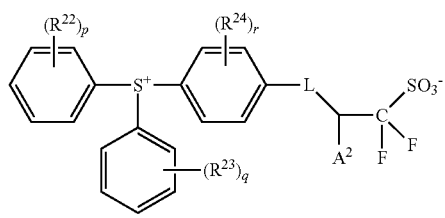

(B-2)

In formula (B-1), $A^1$ is hydrogen or trifluoromethyl. $R^{21}$ is a $C_1$-$C_{35}$ straight, branched or cyclic monovalent hydrocarbon group which may contain oxygen, a nitrogen-containing heterocyclic group, or a group having the formula (i) shown below. $M_A^+$ is an onium cation.

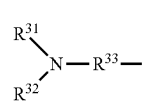

(i)

In formula (i), $R^{31}$ and $R^{32}$ are each independently hydrogen or a $C_1$-$C_{20}$ straight, branched or cyclic monovalent hydrocarbon group which may contain a heteroatom, $R^{31}$ and $R^{32}$ may bond together to form a ring with the nitrogen atom to which they are attached. $R^{33}$ is a $C_1$-$C_{20}$ straight, branched or cyclic divalent hydrocarbon group which may contain a heteroatom.

Examples of the monovalent hydrocarbon group which may contain oxygen, represented by $R^{21}$, include alkyl groups such as methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, 1-adamantyl, 1-adamantylmethyl, and steroid structure-containing alkyl groups; oxoalkyl groups such as 2-oxocyclopentyl, 2-oxocyclohexyl, 4-oxocyclohexyl, 2-oxopropyl, 2-oxoethyl, 2-cyclopentyl-2-oxoethyl, 2-cyclohexyl-2-oxoethyl, 2-(4-methylcyclohexyl)-2-oxoethyl, 4-oxatricyclo[4.2.1.0$^{3,7}$] nonan-5-on-9-yl, 4-oxo-1-adamantyl; aryl groups, for example, phenyl, 1-naphthyl, 2-naphthyl, anthranyl, thienyl, 4-hydroxyphenyl, alkoxyphenyl groups such as 4-methoxyphenyl, 3-methoxyphenyl, 2-methoxyphenyl, 4-ethoxyphenyl, 4-tert-butoxyphenyl, and 3-tert-butoxyphenyl; alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; dialkoxynaphthyl groups such as dimethoxynaphthyl and diethoxynaphthyl; aralkyl groups such as benzyl, 1-phenylethyl and 2-phenylethyl; aryloxoalkyl groups such as 2-aryl-2-oxoethyl groups, e.g., 2-phenyl-2-oxoethyl, 2-(1-naphthyl)-2-oxoethyl, and 2-(2-naphthyl)-2-oxoethyl. Also included are vinyl and isopropenyl groups.

Examples of the nitrogen-containing heterocyclic group represented by $R^{21}$ include aziridine, pyrrolidine, piperidine, morpholine, pyrrole, pyridine, azetidine, oxazole, isooxazole, thiazole, isothiazole, imidazole, pyrazole, pyridazine, pyrimidine, pyrazine, pyrroline, 2-imidazoline, imidazolidine, 3-pyrazoline, pyrazolidine, piperazine, triazine, oxadiazine, dithiazine, indole, isoindole, quinoline, isoquinoline, cinnoline, phthalazine, quinazoline, quinoxaline, 1,8-naphthylidine, purine, pteridine, indolizine, carbazole, acridine, phenazine, phenanthridine, 1,10-phenanthroline, phenoxazine, indoline, isoindoline, quinuclidine, benzo[e]indole, and benzo[cd]indole.

Of the foregoing groups $R^{21}$, tert-butyl, cyclohexyl, 1-adamantyl, 1-adamantylmethyl, 4-oxa-tricyclo[4.2.1.0$^{3,7}$] nonan-5-on-9-yl, 4-oxo-1-adamantyl, and steroid structure-containing alkyl groups are especially preferred.

In formula (i), examples of the monovalent hydrocarbon group represented by $R^{31}$ and $R^{32}$ include alkyl groups such as methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl; alkenyl groups such as vinyl, allyl, propenyl, butenyl, hexenyl and cyclohexenyl; aryl groups such as phenyl, naphthyl and thienyl; and aralkyl groups such as benzyl, 1-phenylethyl and 2-phenylethyl. In the foregoing hydrocarbon groups, one or more hydrogen may be substituted by a hydrocarbon moiety as mentioned above or a moiety containing a heteroatom (such as oxygen, sulfur, nitrogen or halogen), or one or more carbon may be substituted by a moiety containing a heteroatom (such as oxygen, sulfur or nitrogen), so that the group may contain a hydroxyl, cyano, carbonyl, ether, ester, sulfonic acid ester, carbonate, lactone ring, sultone ring, carboxylic acid anhydride, or haloalkyl moiety.

When $R^{31}$ and $R^{32}$ bond together to form a ring with the nitrogen atom to which they are attached, suitable rings include aziridine, pyrrolidine, piperidine, morpholine, pyrrole, pyridine, azetidine, oxazole, isooxazole, thiazole, isothiazole, imidazole, pyrazole, pyridazine, pyrimidine, pyrazine, pyrroline, 2-imidazoline, imidazolidine, 3-pyrazoline, pyrazolidine, piperazine, triazine, oxadiazine, dithiazine, indole, isoindole, quinoline, isoquinoline, cinnoline, phthalazine, quinazoline, quinoxaline, 1,8-naphthylidine, purine, pteridine, indolizine, carbazole, acridine, phenazine, phenanthridine, 1,10-phenanthroline, phenoxazine, indoline, isoindoline, quinuclidine, benzo[e]indole, and benzo[cd]indole. In the foregoing rings, one or more hydrogen may be substituted by a hydrocarbon moiety as mentioned above or a moiety containing a heteroatom (such as oxygen, sulfur, nitrogen or halogen), or one or more carbon may be substituted by a moiety containing a heteroatom (such as oxygen, sulfur or nitrogen), so that the ring may contain a hydroxyl, cyano, carbonyl, ether, ester, sulfonic acid ester, carbonate, lactone ring, sultone ring, carboxylic acid anhydride, or haloalkyl moiety.

In formula (i), $R^{33}$ is a $C_1$-$C_{20}$ divalent hydrocarbon group which may contain a heteroatom. Suitable divalent hydrocarbon groups include straight alkanediyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; branched alkanediyl groups corresponding to the foregoing straight alkanediyl groups to which a pendant such as methyl, ethyl, propyl, isopropyl, butyl, sec-butyl or tert-butyl is attached; saturated cyclic hydrocarbon groups such as cyclopentanediyl, cyclohexanediyl, norbornanediyl and adamantanediyl; and unsaturated cyclic hydrocarbon groups such as phenylene and naphthylene. In the foregoing hydrocarbon groups, one or more hydrogen may be substituted by a moiety containing a heteroatom (such as oxygen, sulfur, nitrogen or halogen), or one or more carbon may be substituted by a moiety containing a heteroatom (such as oxygen, sulfur or nitrogen), so that the group may contain a hydroxyl, cyano, carbonyl, ether, ester, sulfonic acid ester, carbonate, lactone ring, sultone ring, carboxylic acid anhydride, or haloalkyl moiety.

Exemplary structures of the anion moiety in the PAG having formula (B-1) are shown below, but not limited thereto. Herein $A^1$ is as defined above.

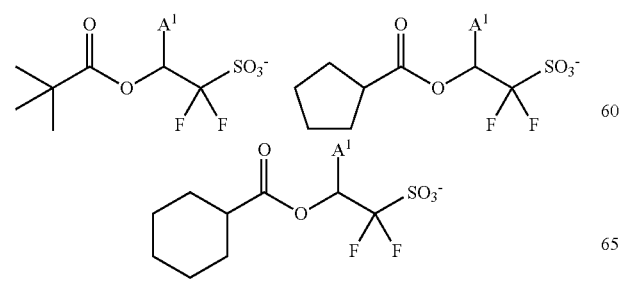

-continued

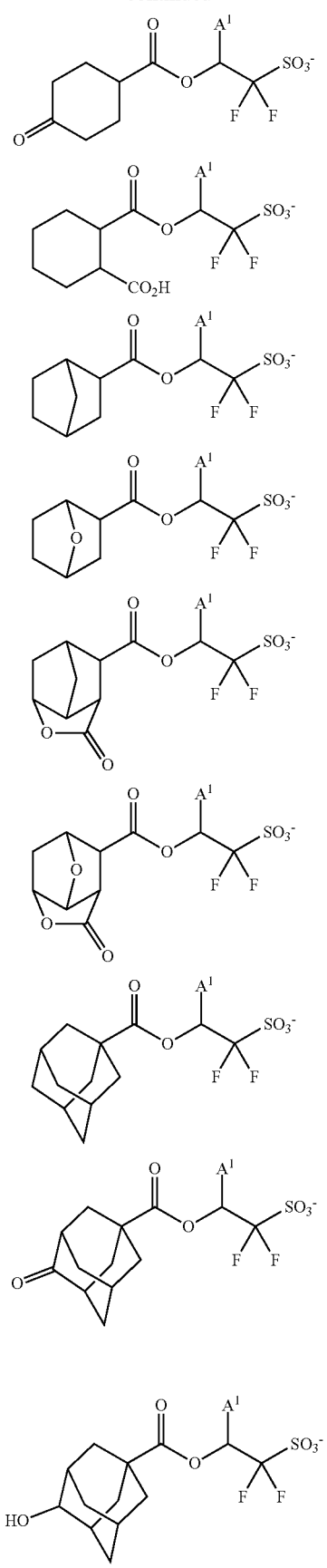

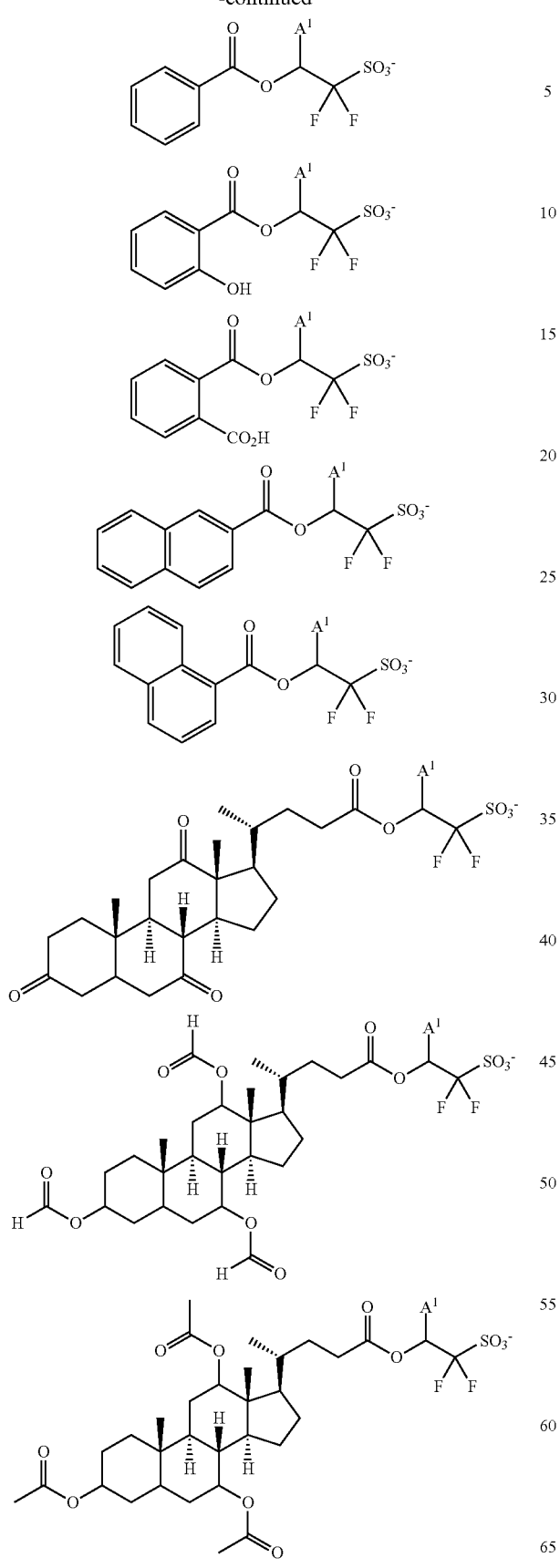
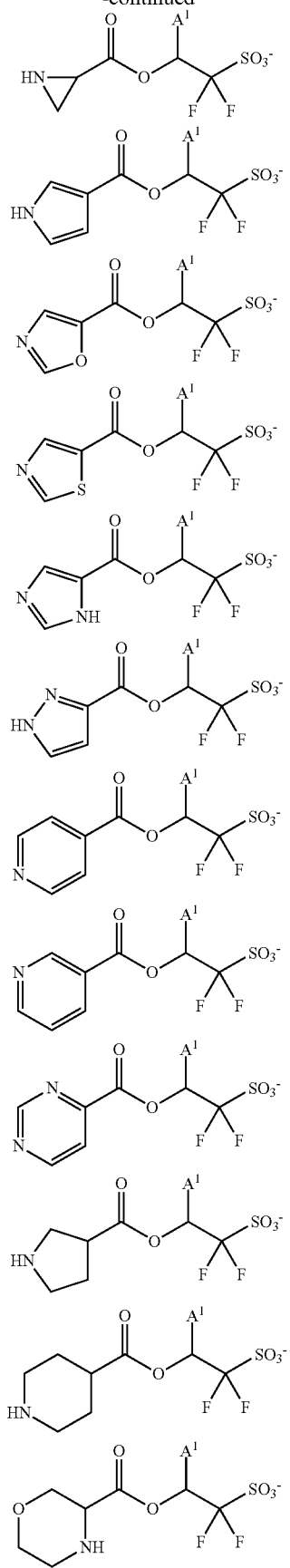

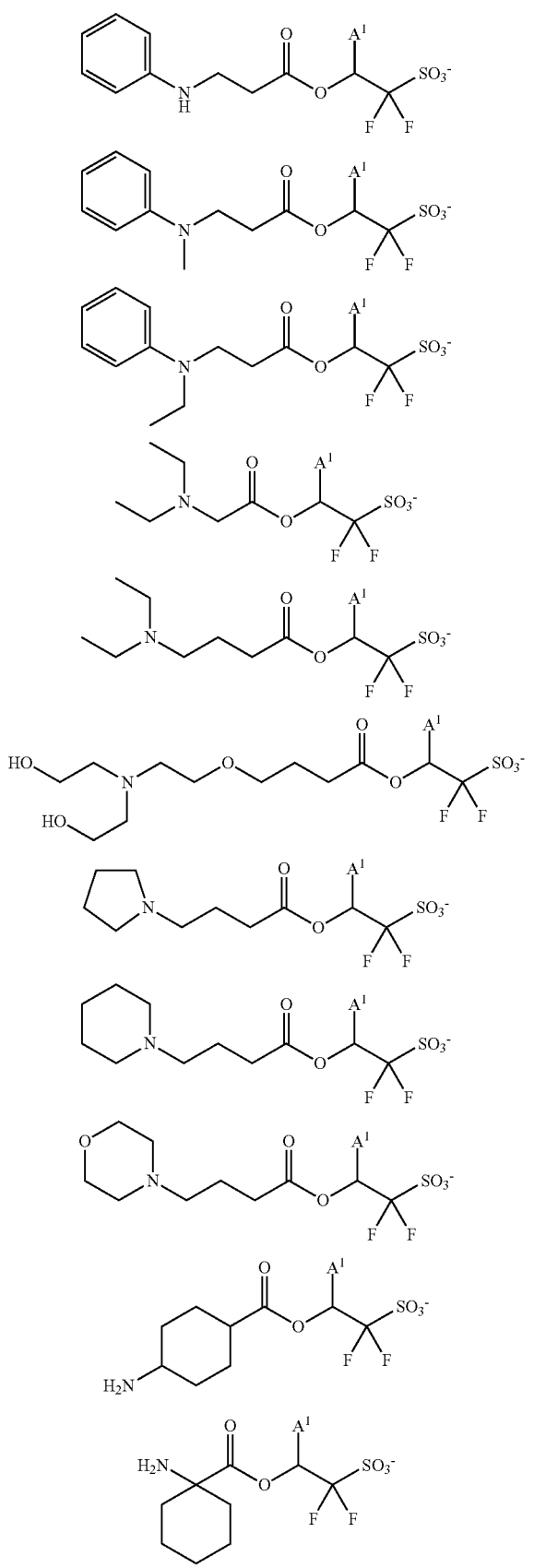
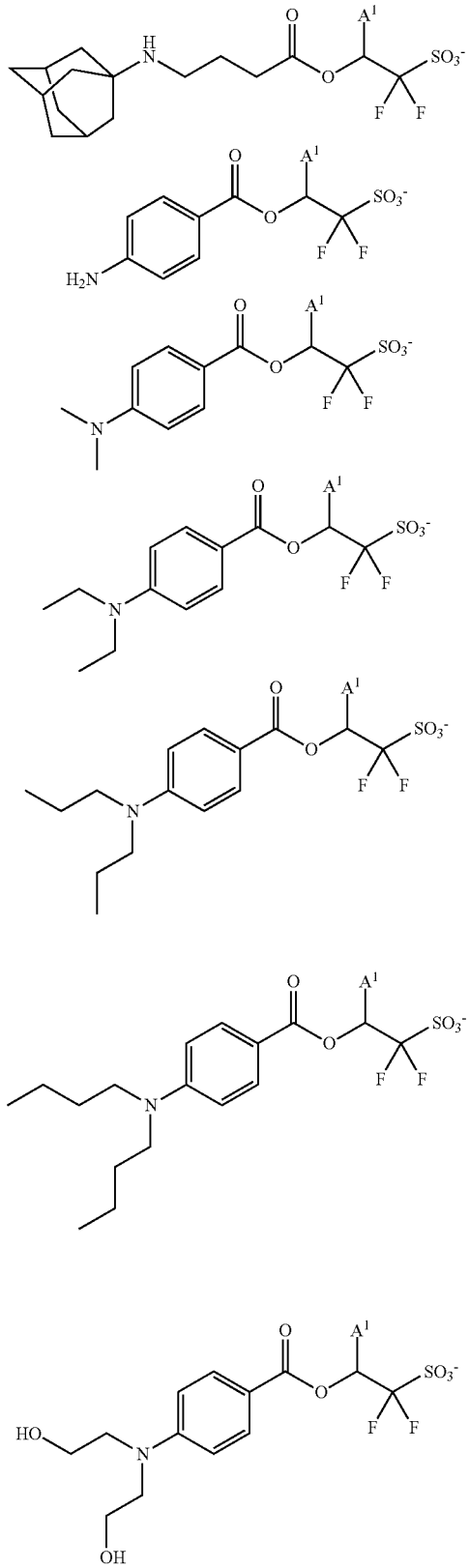
The onium cation $M_A^+$ in formula (B-1) is preferably at least one selected from cations having the following formulae (B-4) and (B-5).

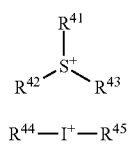

(B-4)

(B-5)

In formulae (B-4) and (B-5), $R^{41}$ to $R^{45}$ are each independently a $C_1$-$C_{20}$ straight, branched or cyclic monovalent hydrocarbon group which may contain a heteroatom. Any two of $R^{41}$, $R^{42}$ and $R^{43}$ may bond together to form a ring with the sulfur atom in the formula.

Examples of the monovalent hydrocarbon group, represented by $R^{41}$ to $R^{45}$, include alkyl groups such as methyl, ethyl, n-propyl, isopropyl, n-butyl, tert-butyl, cyclopropyl, cyclopentyl, cyclohexyl, cyclopropylmethyl, 4-methylcyclohexyl, cyclohexylmethyl, norbornyl, and adamantyl; alkenyl groups such as vinyl, allyl, propenyl, butenyl, hexenyl and cyclohexenyl; aryl groups such as phenyl, naphthyl and thienyl; and aralkyl groups such as benzyl, 1-phenylethyl and 2-phenylethyl, with the aryl groups being preferred. In the foregoing hydrocarbon groups, one or more hydrogen may be substituted by a moiety containing a heteroatom such as oxygen, sulfur, nitrogen or halogen, and one or more carbon may be substituted by a moiety containing a heteroatom such as oxygen, sulfur or nitrogen, so that the group may contain a hydroxyl, cyano, carbonyl, ether, ester, sulfonic acid ester, carbonate, lactone ring, sultone ring, carboxylic anhydride or haloalkyl moiety.

Examples of the sulfonium cation having formula (B-4) are shown below, but not limited thereto.

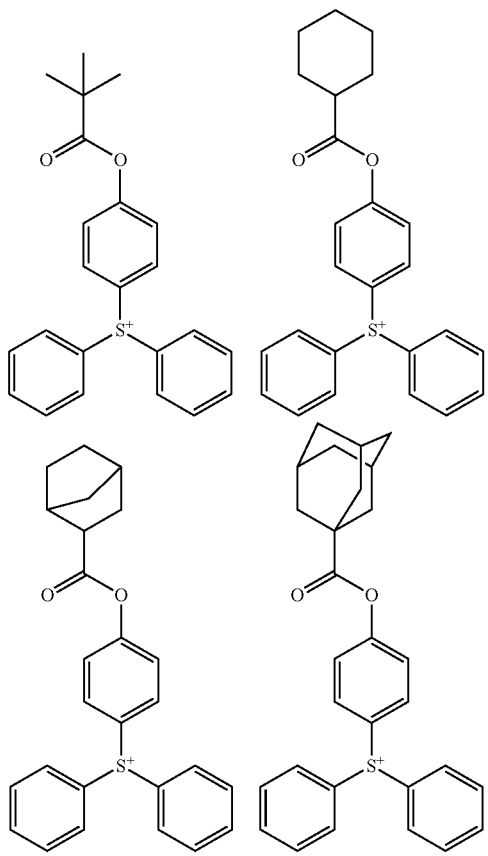

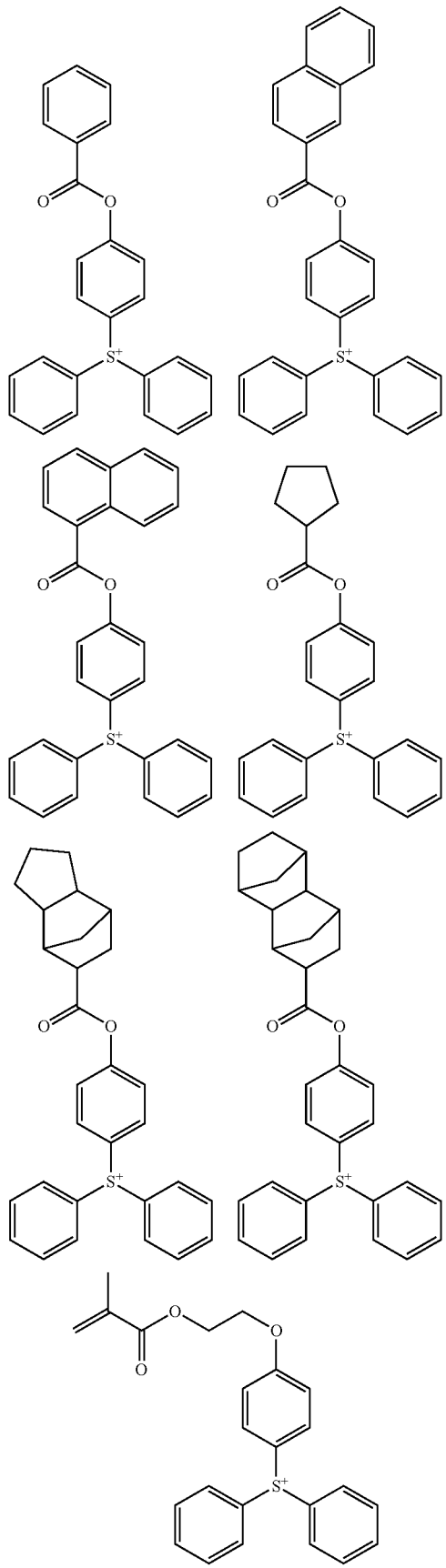

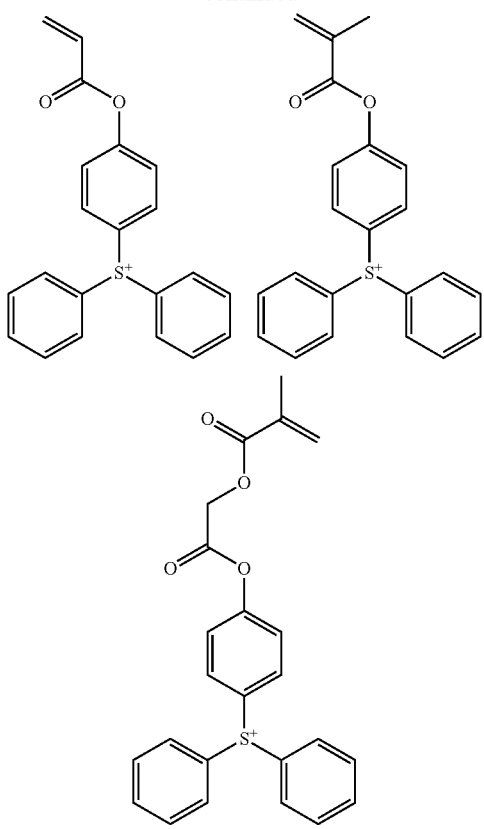
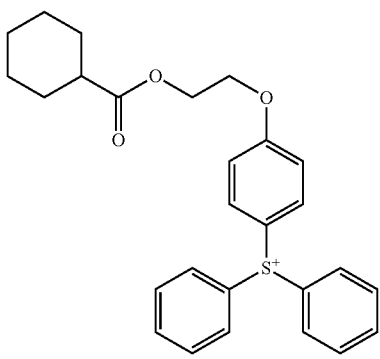
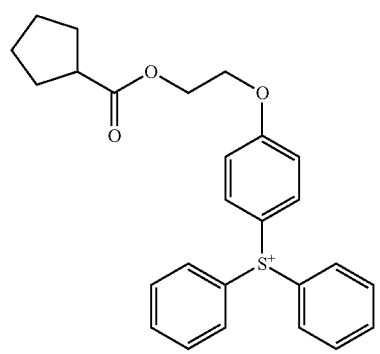
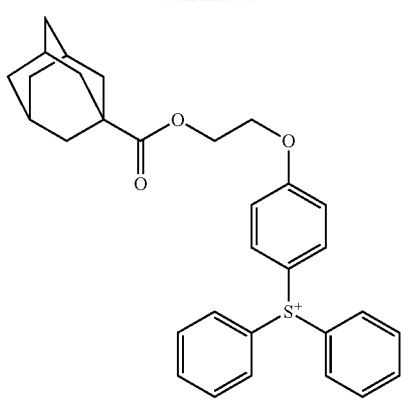
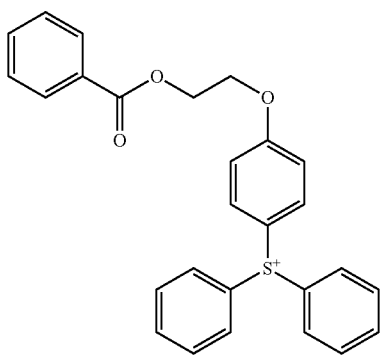
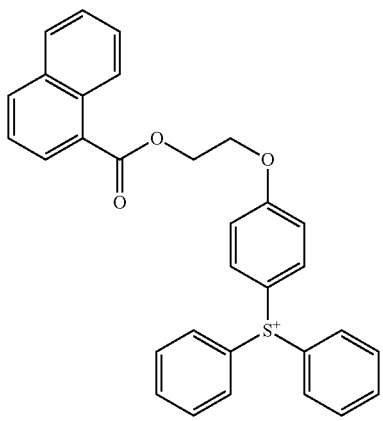
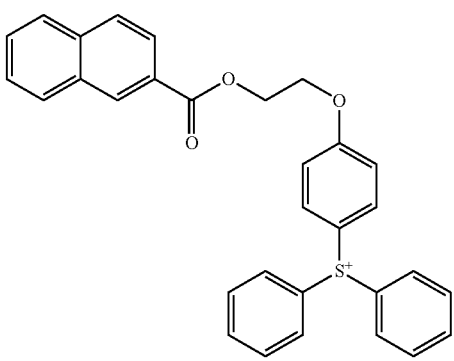

-continued
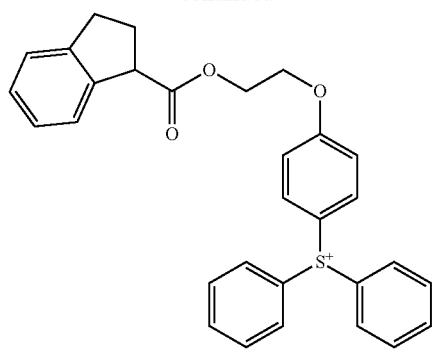
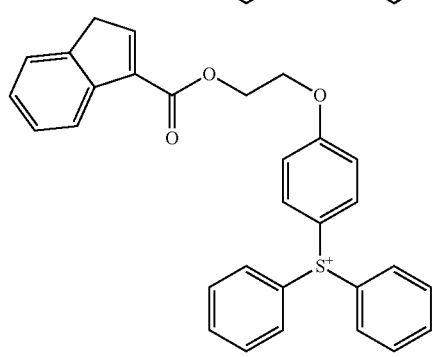
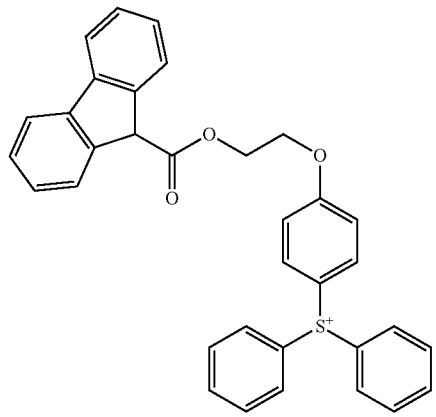
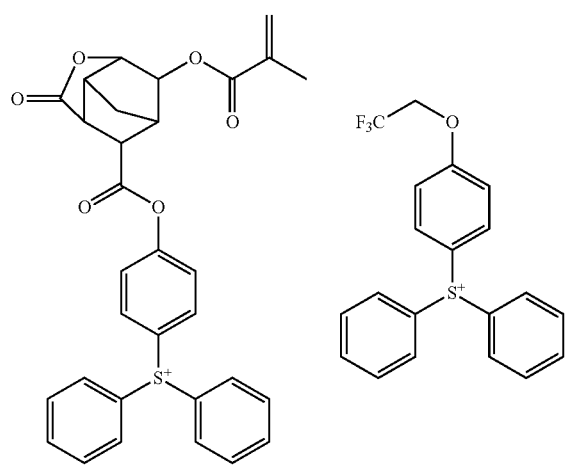
-continued
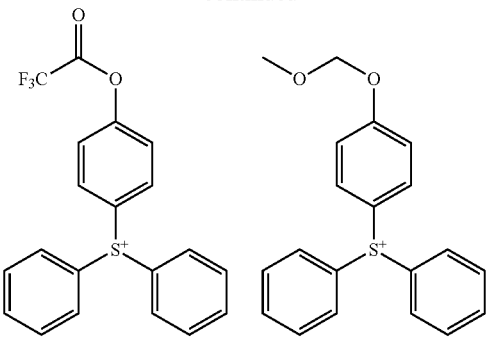
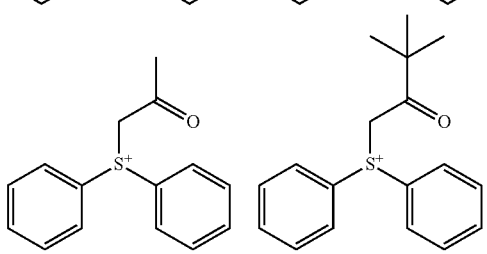
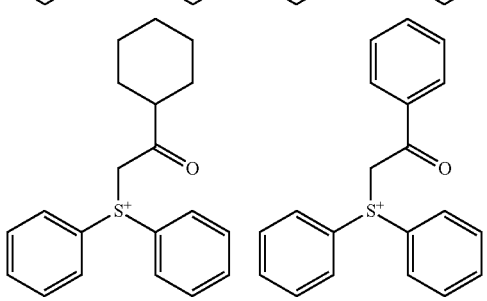
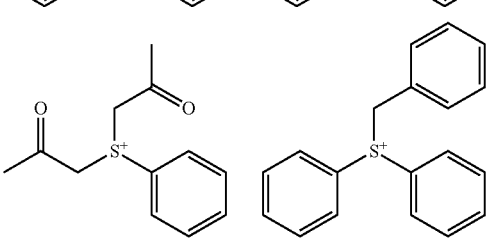
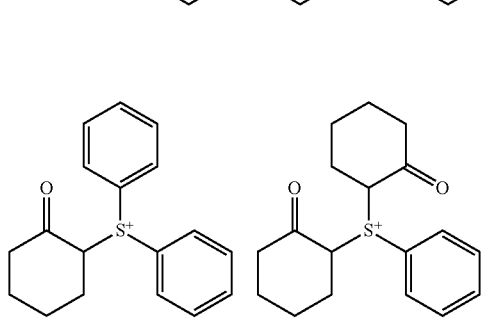
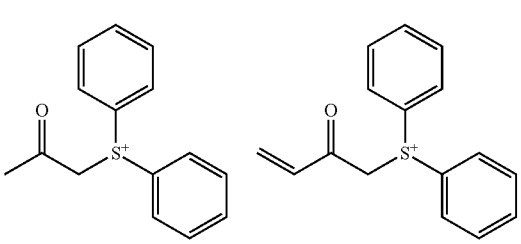

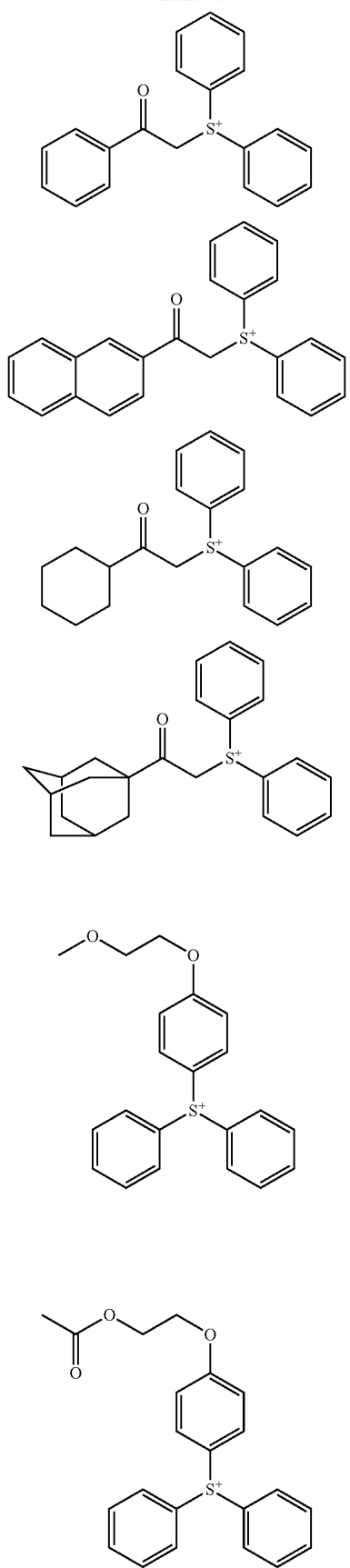
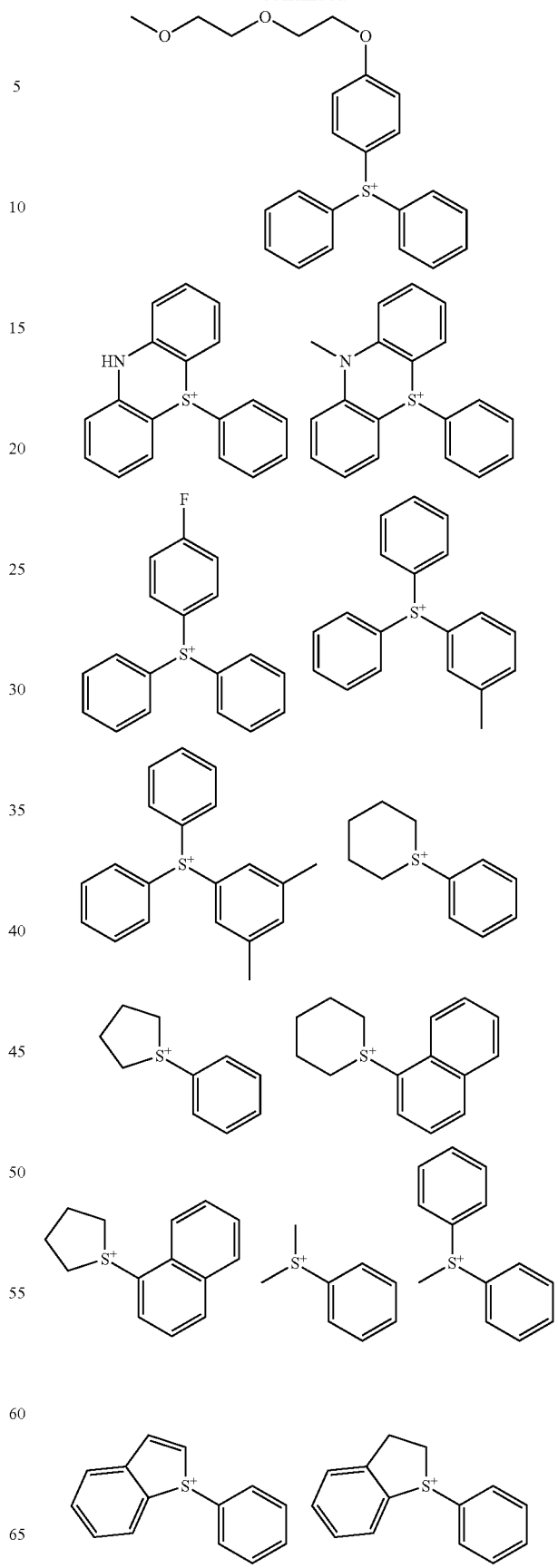

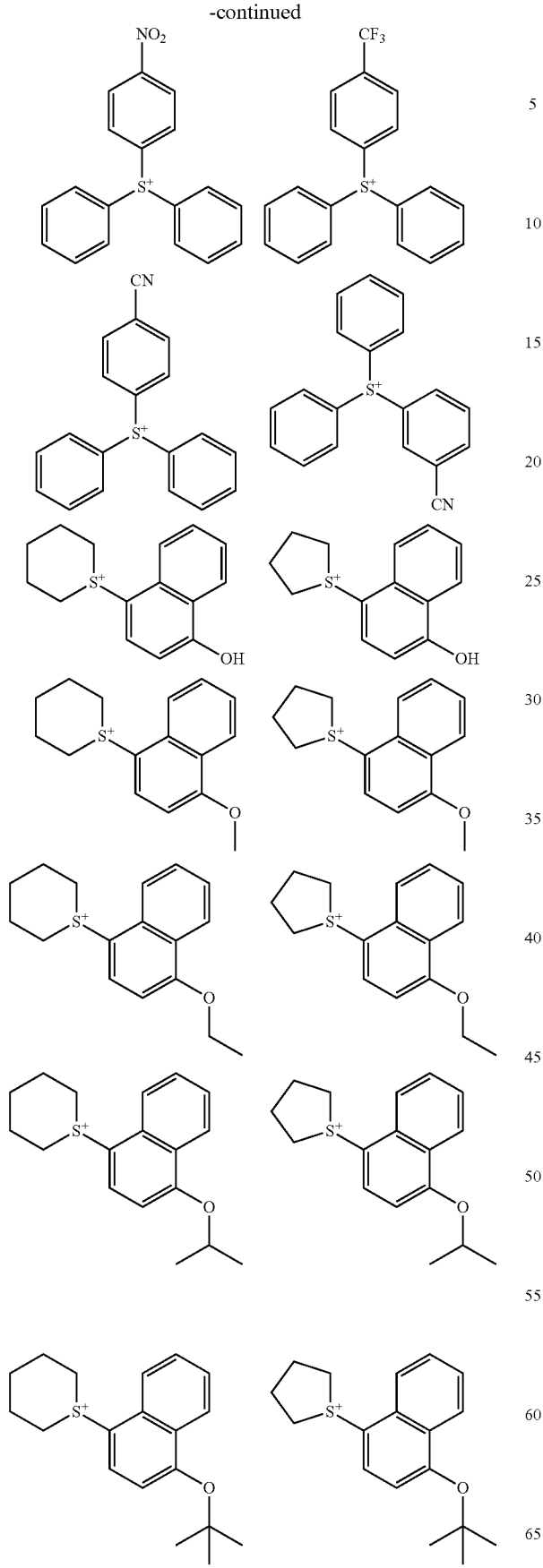
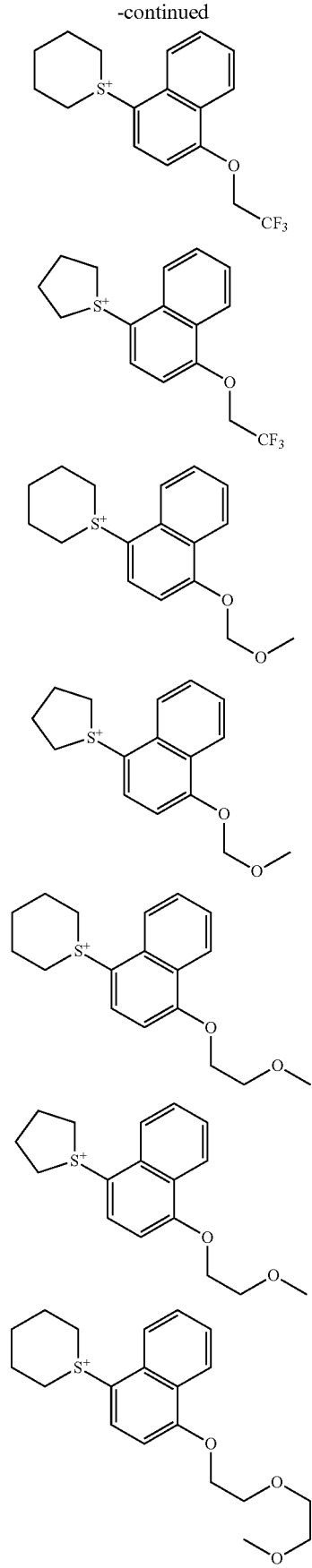

53
-continued
54
-continued
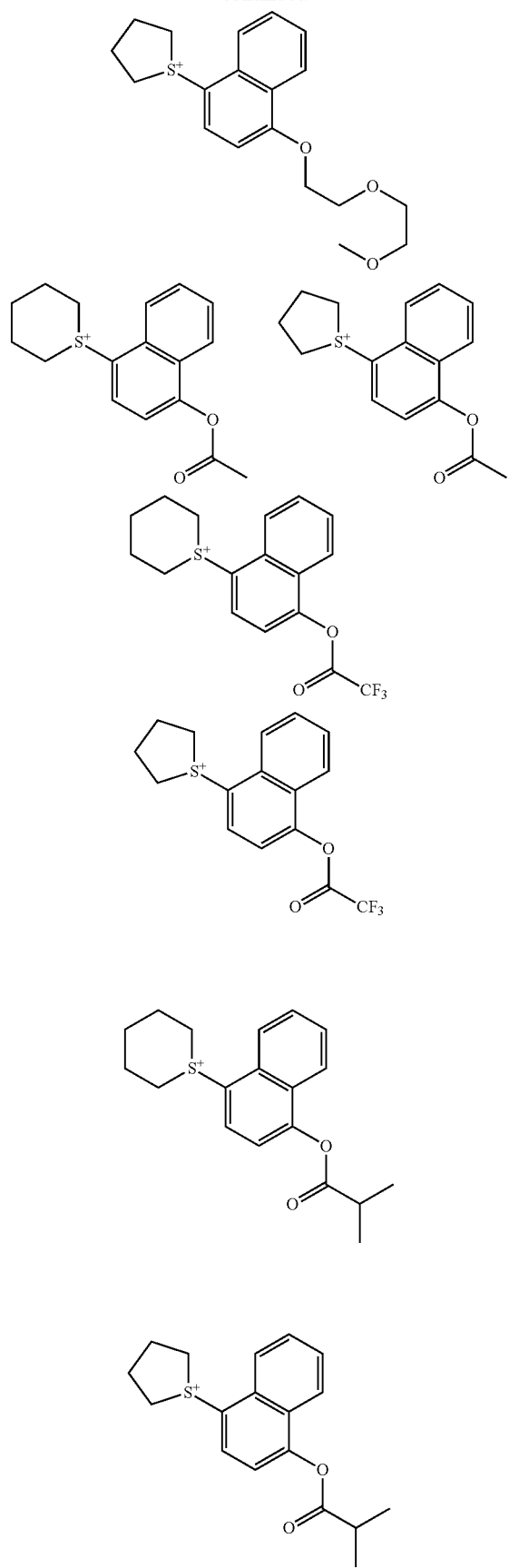
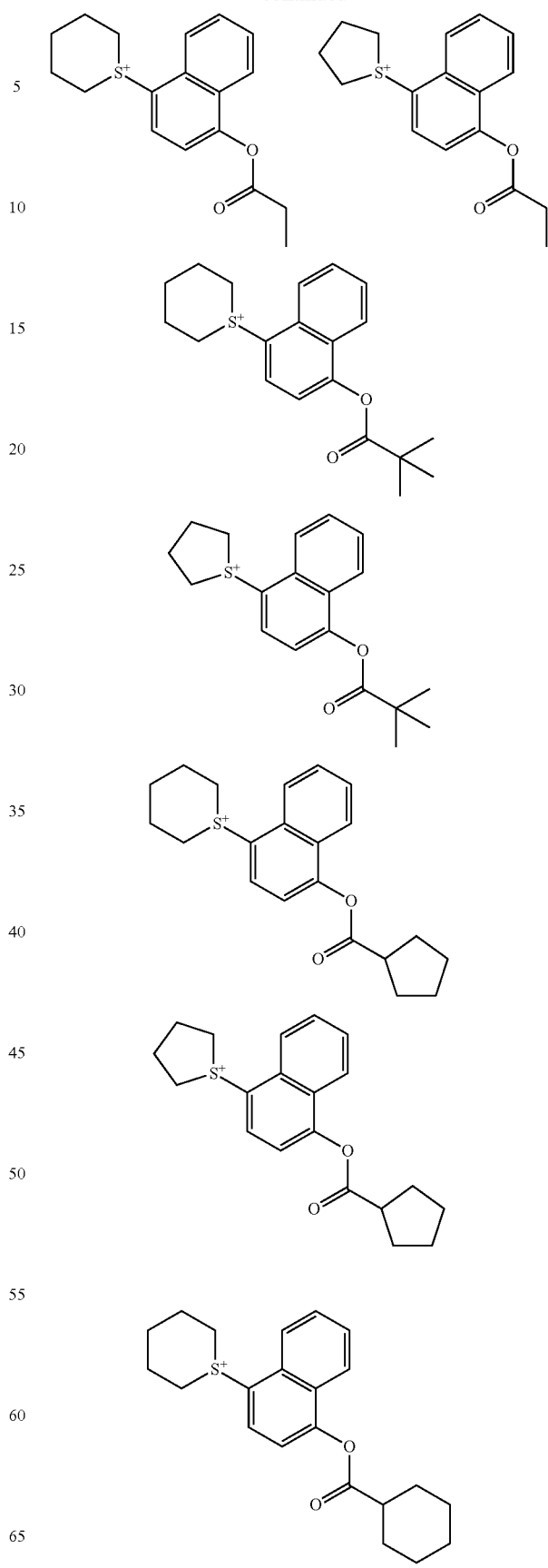

55
-continued
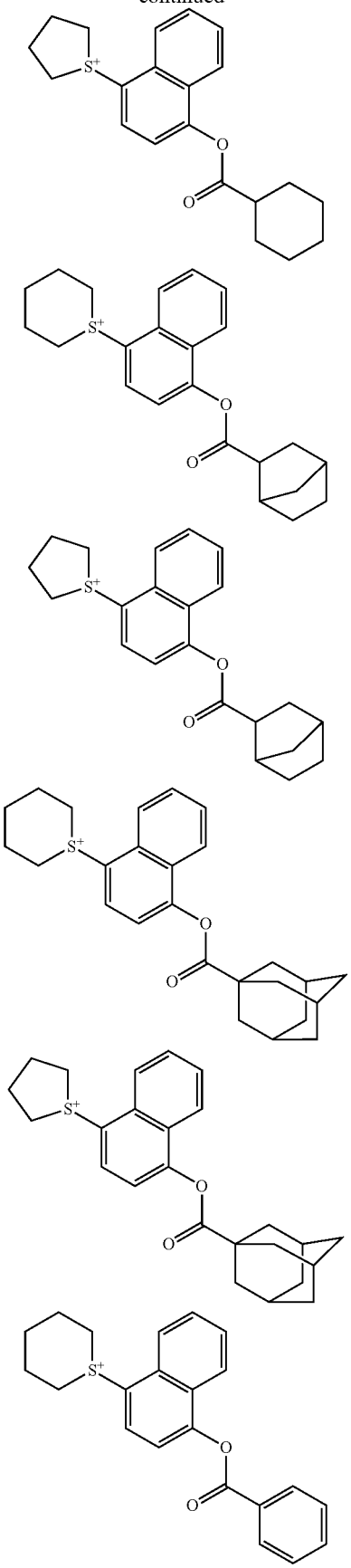
56
-continued
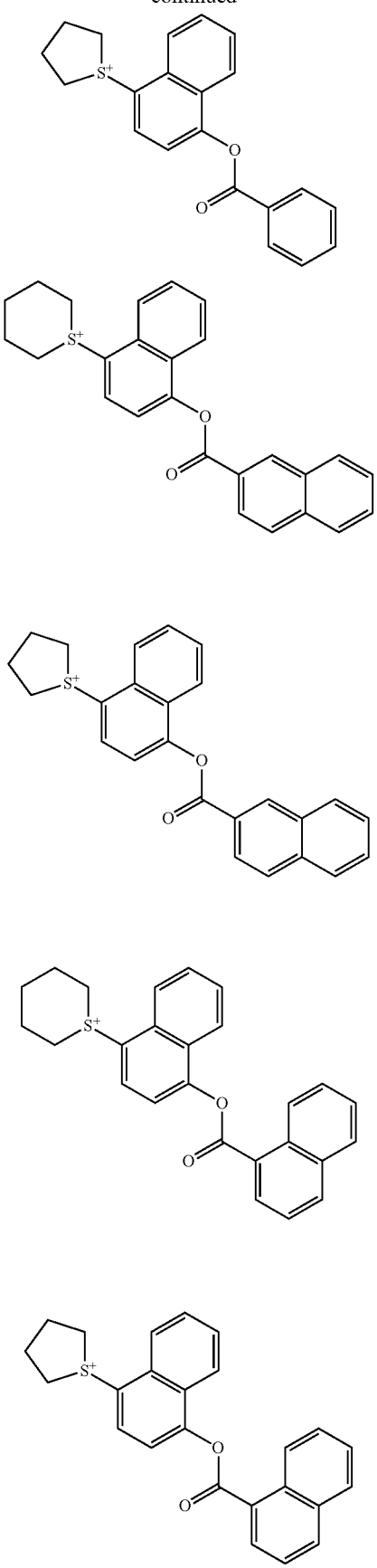

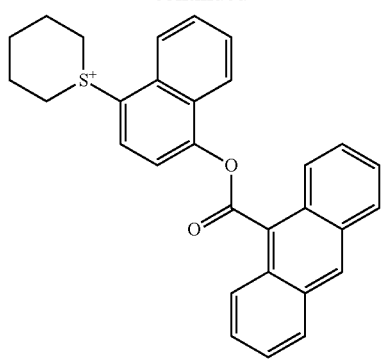
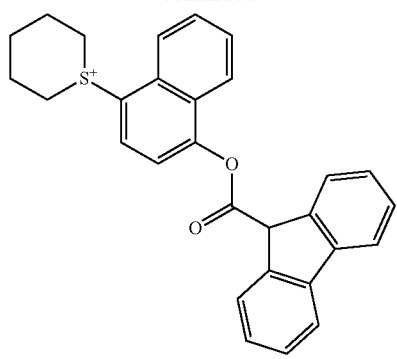
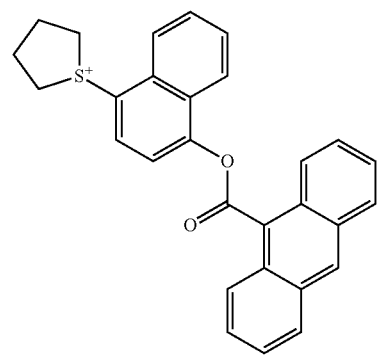
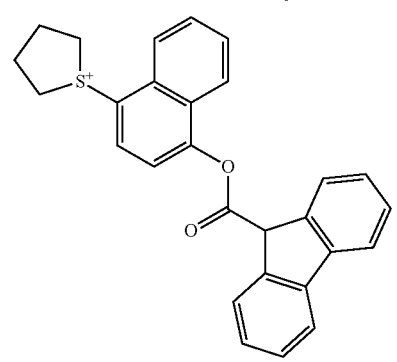
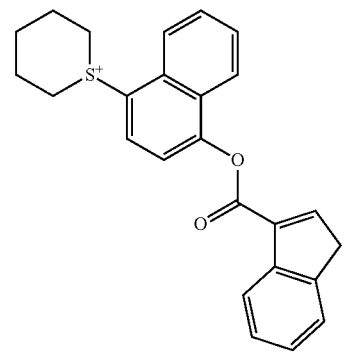
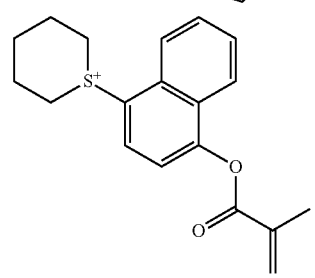
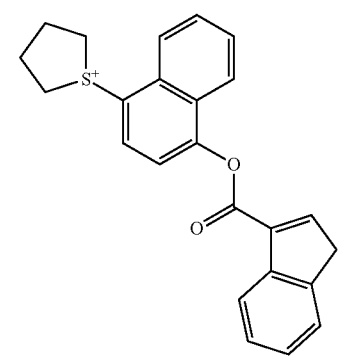
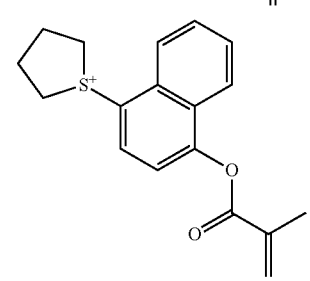
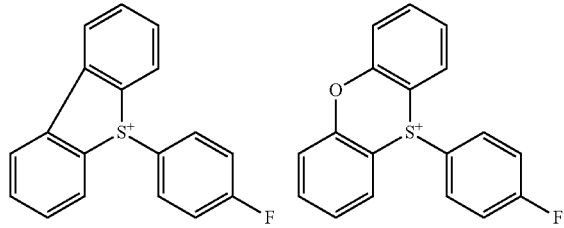
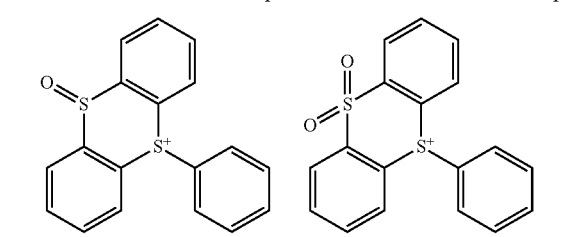

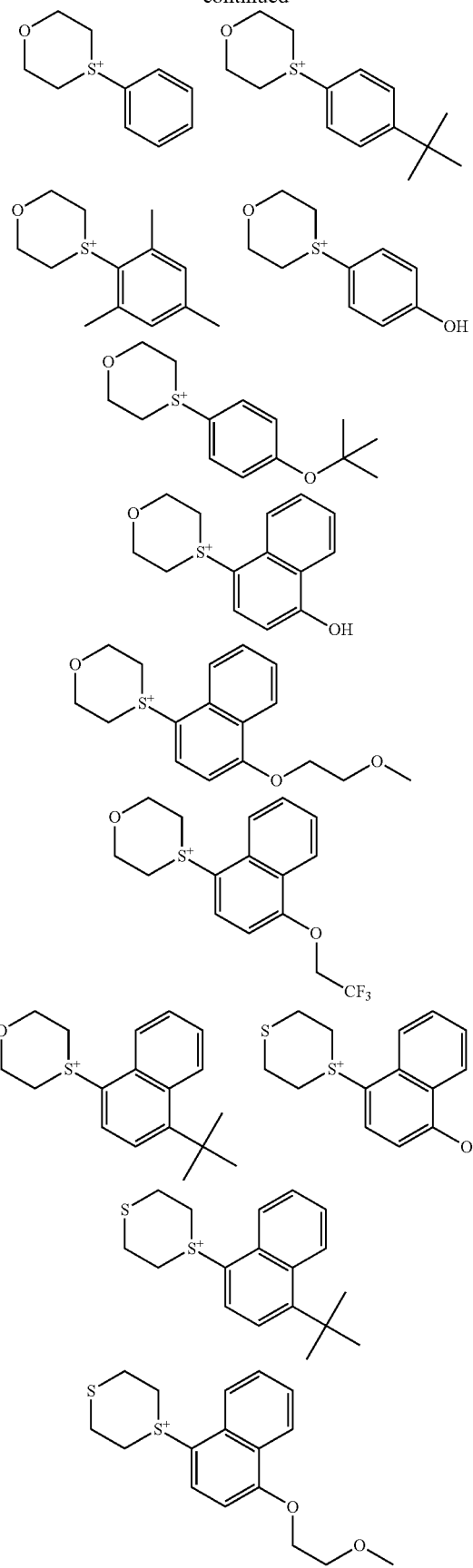
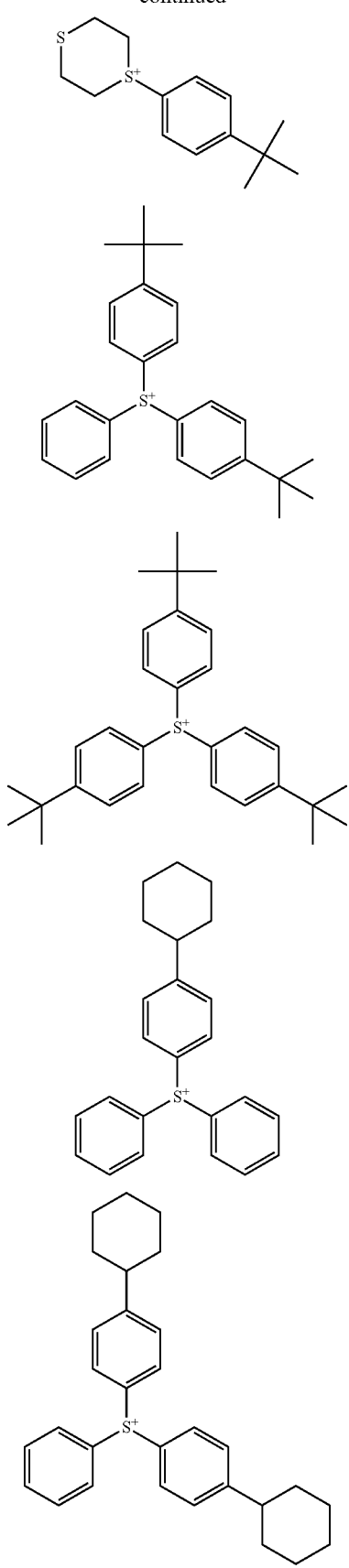

| 61 | 62 |
|---|---|
| -continued | -continued |
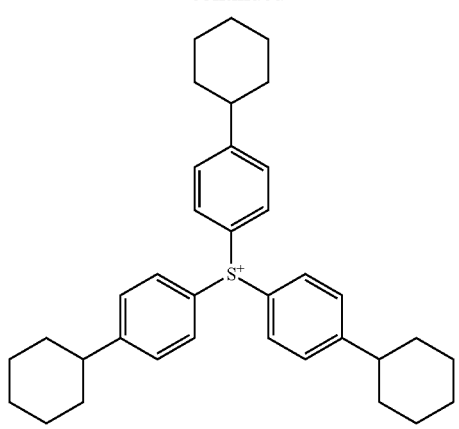
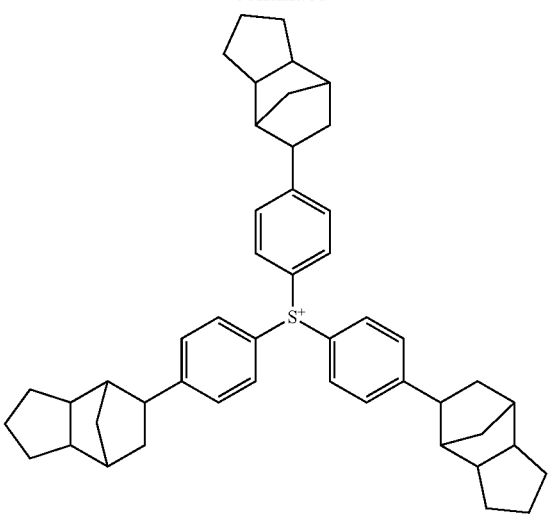
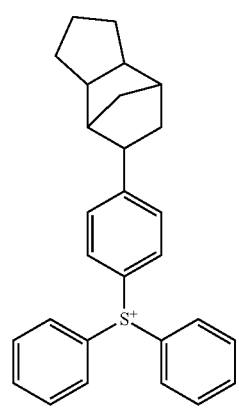
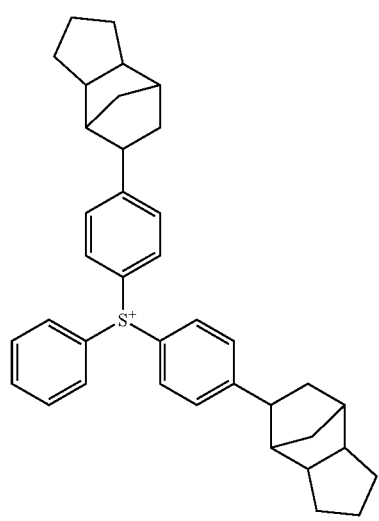
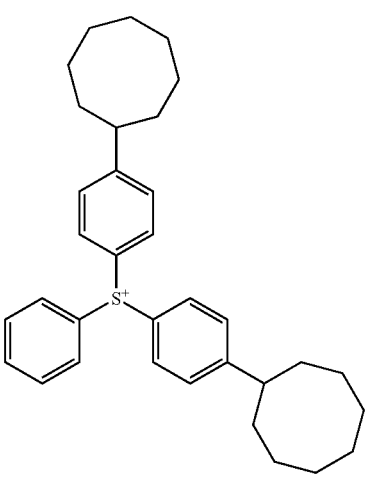

63
-continued
64
-continued
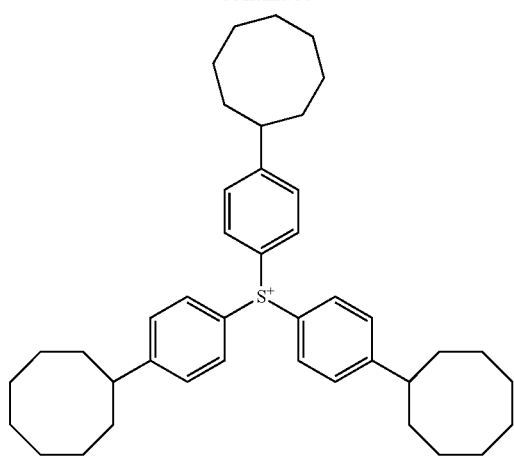
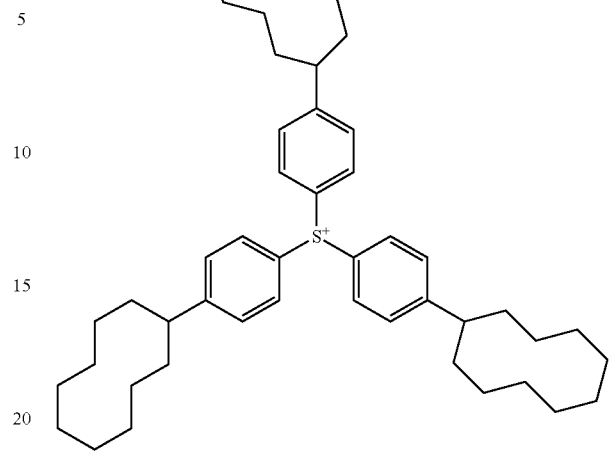
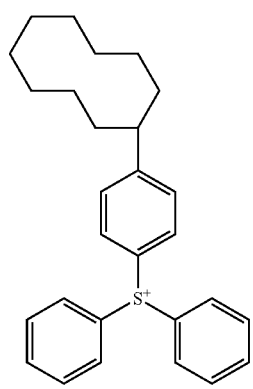
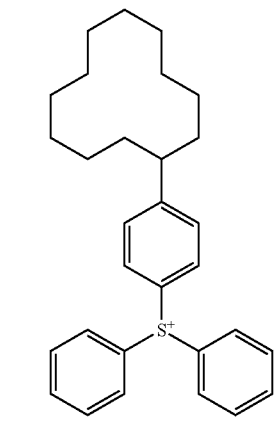
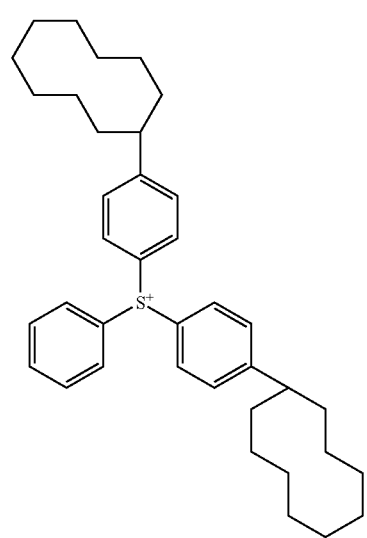
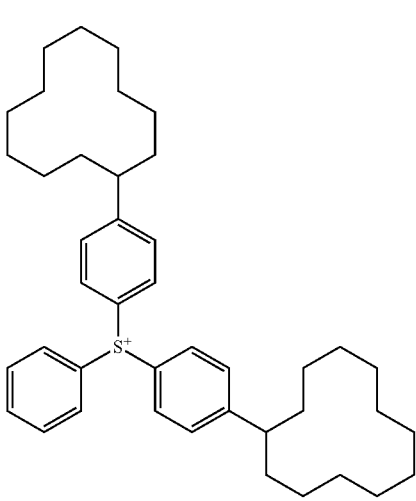

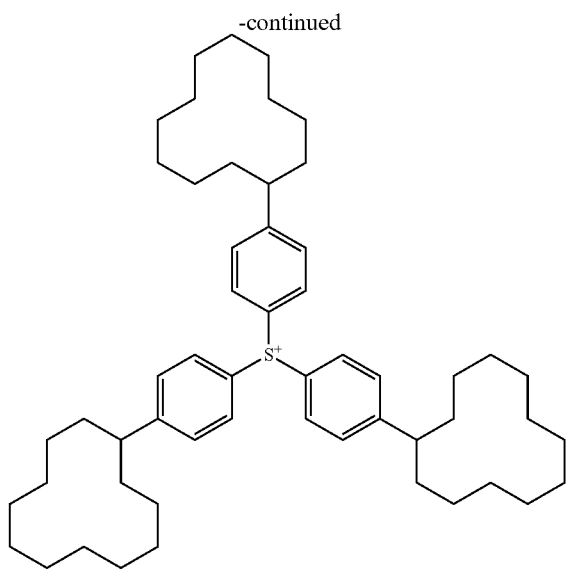

Examples of the iodonium cation having formula (B-5) are shown below, but not limited thereto.

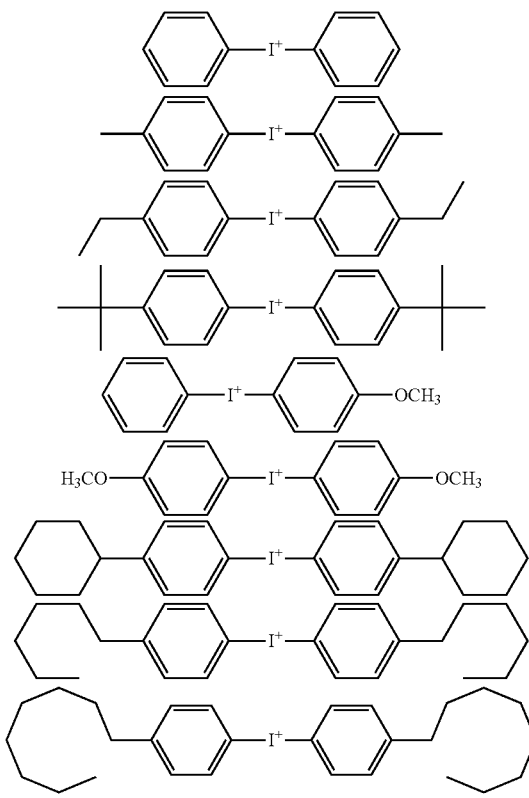

In formula (B-2), $A^2$ is hydrogen or trifluoromethyl. $R^{22}$, $R^{23}$, and $R^{24}$ are each independently hydrogen or a $C_1$-$C_{20}$ straight, branched or cyclic monovalent hydrocarbon group which may contain a heteroatom, p and q are each independently an integer of 0 to 5, r is an integer of 0 to 4. L is a single bond, ether group, or a $C_1$-$C_{20}$ straight, branched or cyclic divalent hydrocarbon group which may contain a heteroatom.

Examples of the monovalent hydrocarbon groups represented by $R^{22}$, $R^{23}$, and $R^{24}$ include alkyl groups such as methyl, ethyl, propyl, isopropyl, n-butyl, sec-butyl, tert-butyl, tert-pentyl, n-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, and adamantyl. In the foregoing groups, one or more hydrogen may be substituted by a moiety containing a heteroatom such as oxygen, sulfur, nitrogen or halogen, and one or more carbon may be substituted by a moiety containing a heteroatom such as oxygen, sulfur or nitrogen, so that the group may contain a hydroxyl, cyano, carbonyl, ether, ester, sulfonic acid ester, carbonate, lactone ring, sultone ring, carboxylic anhydride or haloalkyl moiety. Of these, methyl, methoxy, tert-butyl and tert-butoxy are preferred as $R^2$, $R^{23}$, and $R^{24}$.

Examples of the divalent hydrocarbon group represented by L are as exemplified above for $R^{33}$. L may be a combination of two or more such groups. In the foregoing groups, one or more hydrogen may be substituted by a moiety containing a heteroatom such as oxygen, sulfur, nitrogen or halogen, and one or more carbon may be substituted by a moiety containing a heteroatom such as oxygen, sulfur or nitrogen, so that the group may contain a hydroxyl, cyano, carbonyl, ether, ester, sulfonic acid ester, carbonate, lactone ring, sultone ring, carboxylic anhydride or haloalkyl moiety.

Examples of the PAG having formula (B-2) are shown below, but not limited thereto. Herein $A^2$ is as defined above.

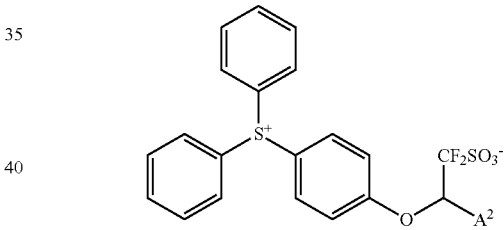

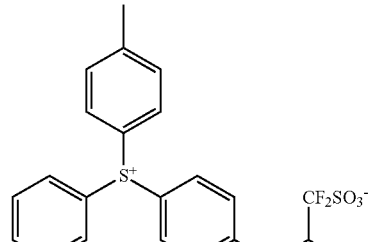

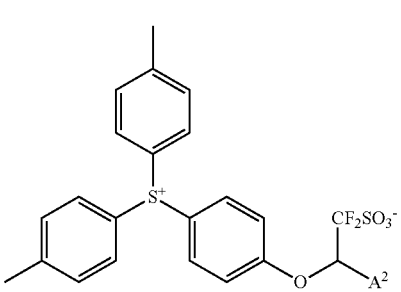

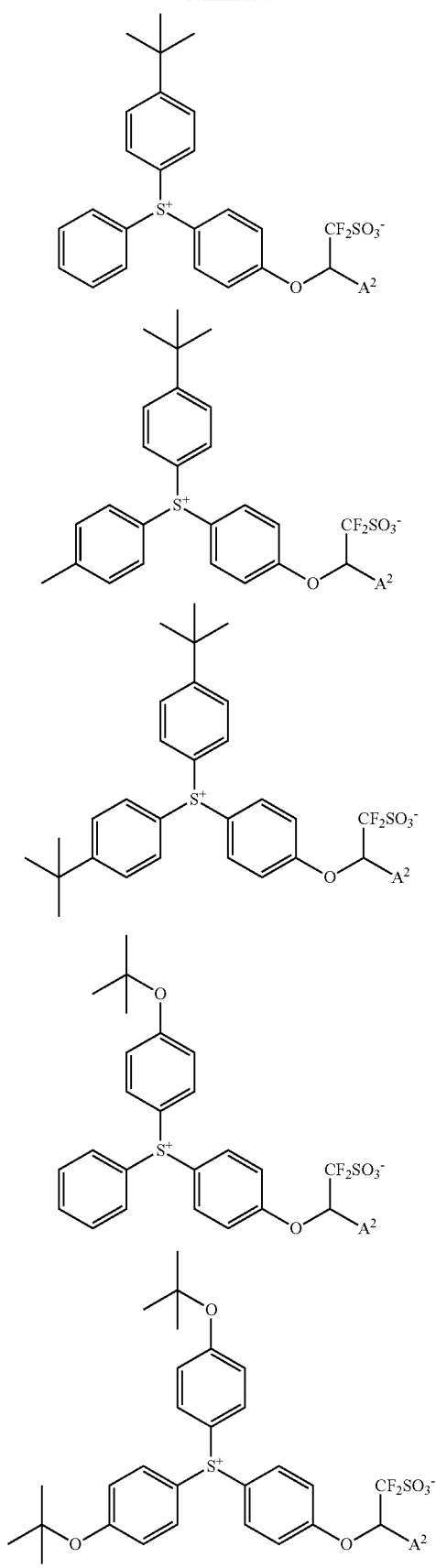
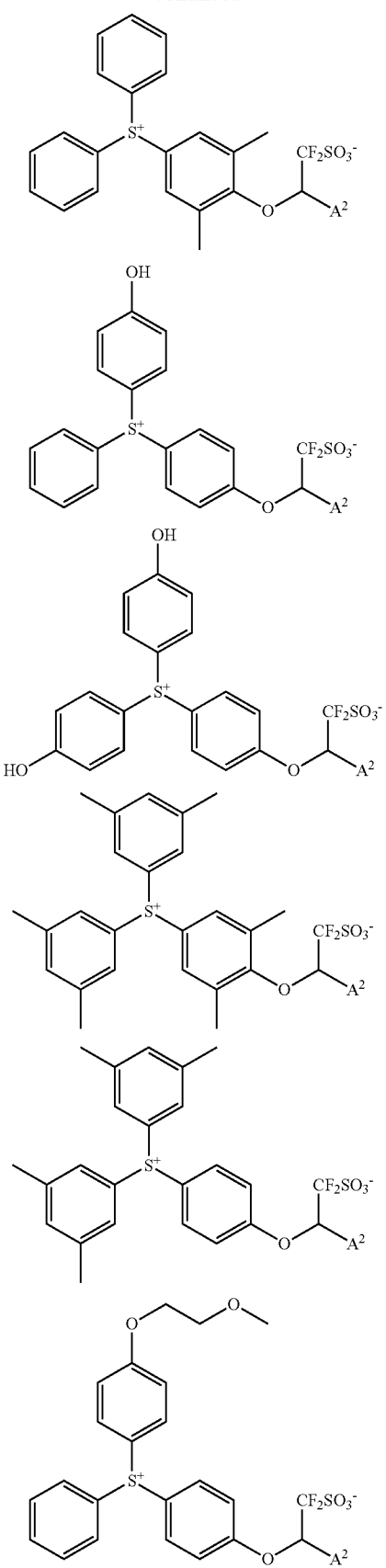

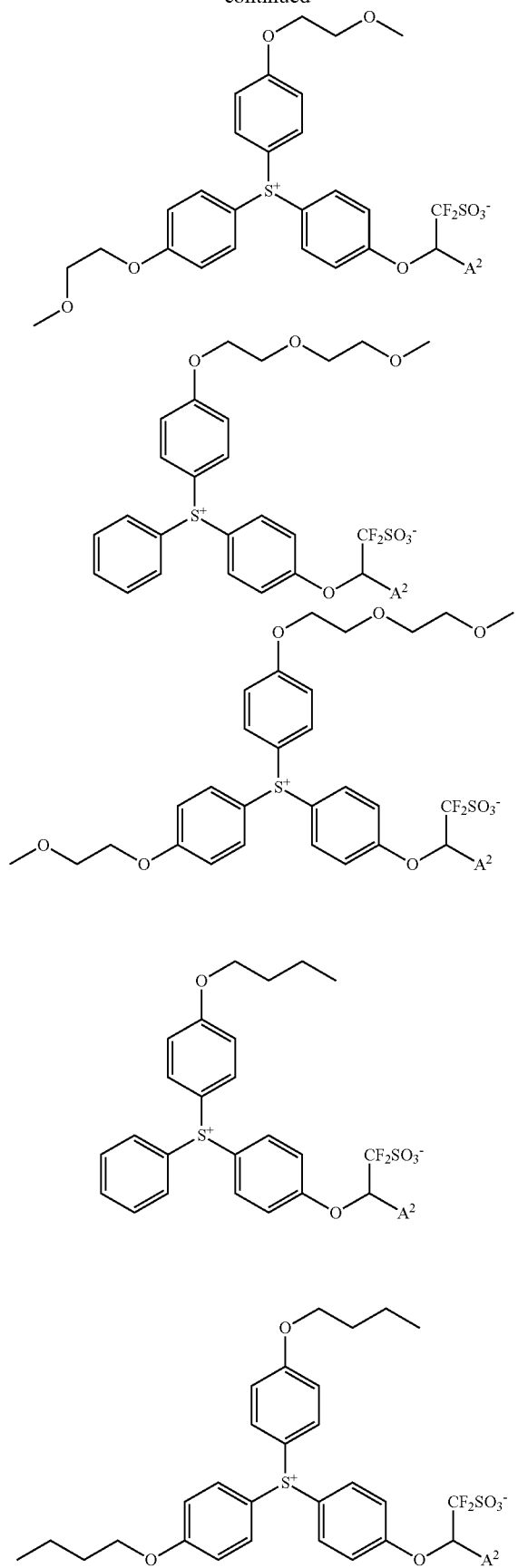
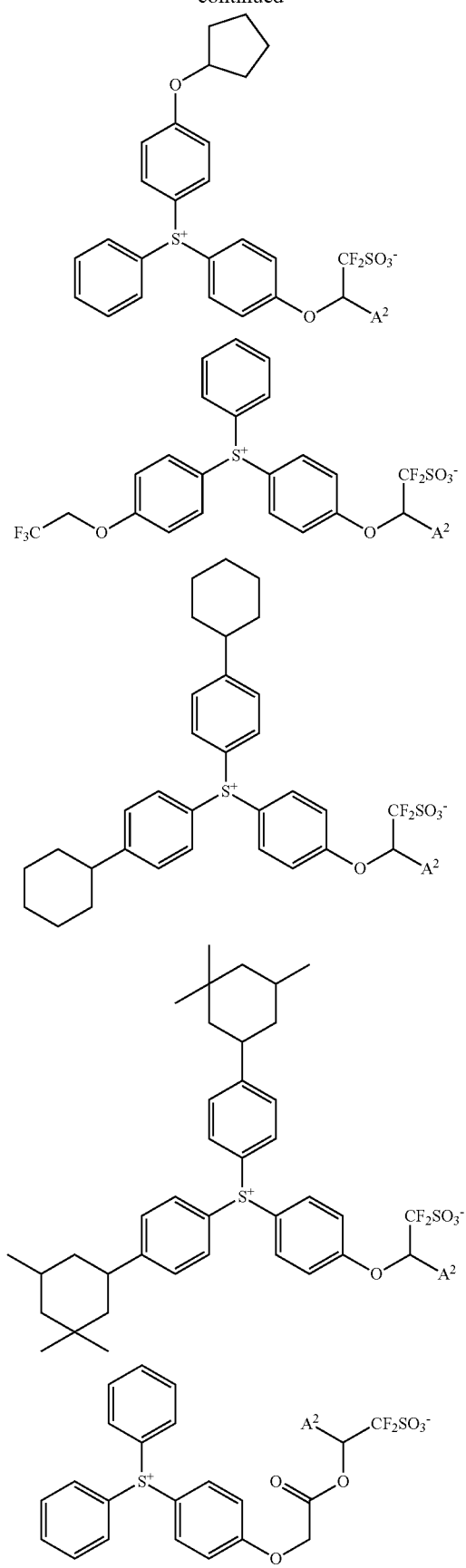

-continued

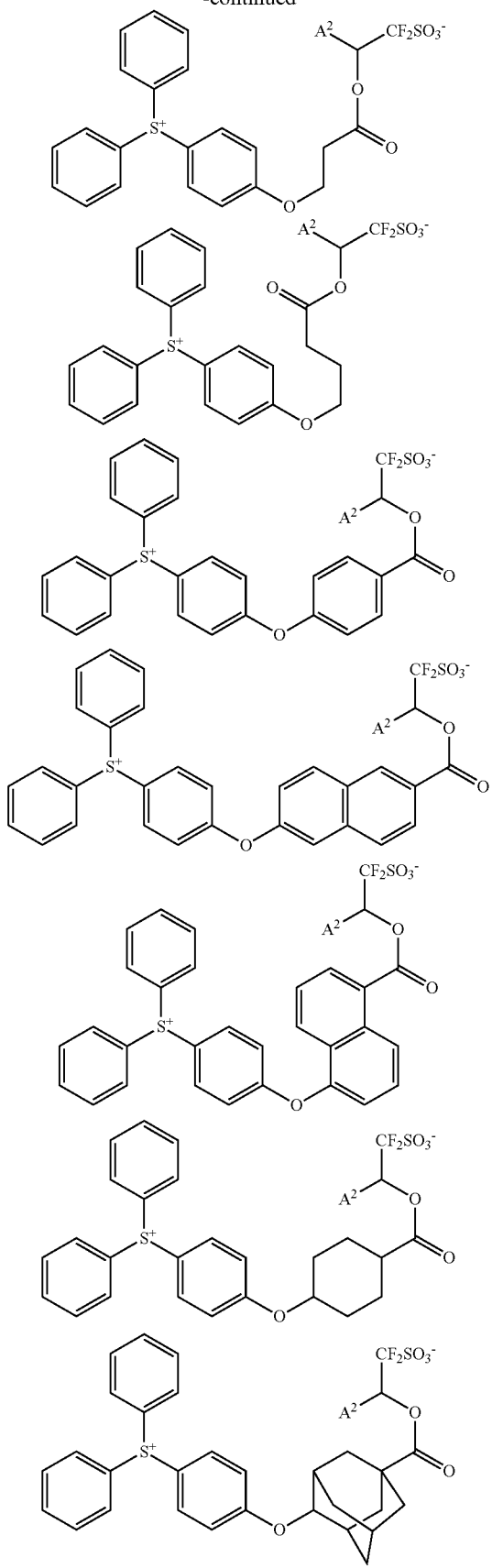

The PAG as component (B) may further contain a compound having the following formula (B-3).

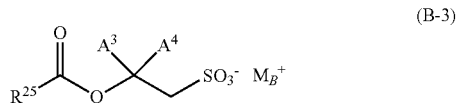

Herein $A^3$ and $A^4$ are each independently hydrogen or trifluoromethyl, excluding that both $A^3$ and $A^4$ are hydrogen at the same time. $R^{25}$ is a $C_1$-$C_{35}$ straight, branched or cyclic monovalent hydrocarbon group which may contain oxygen, a nitrogen-containing heterocyclic group, or a group of the formula (i). $M_B^+$ is an onium cation.

Examples of the monovalent hydrocarbon group and nitrogen-containing heterocyclic group represented by $R^{25}$ are as exemplified above for $R^{21}$. Examples of the onium cation $M_B^+$ are as exemplified above for $M_A^+$.

Exemplary structures of the anion moiety in the PAG having formula (B-3) are shown below, but not limited thereto.

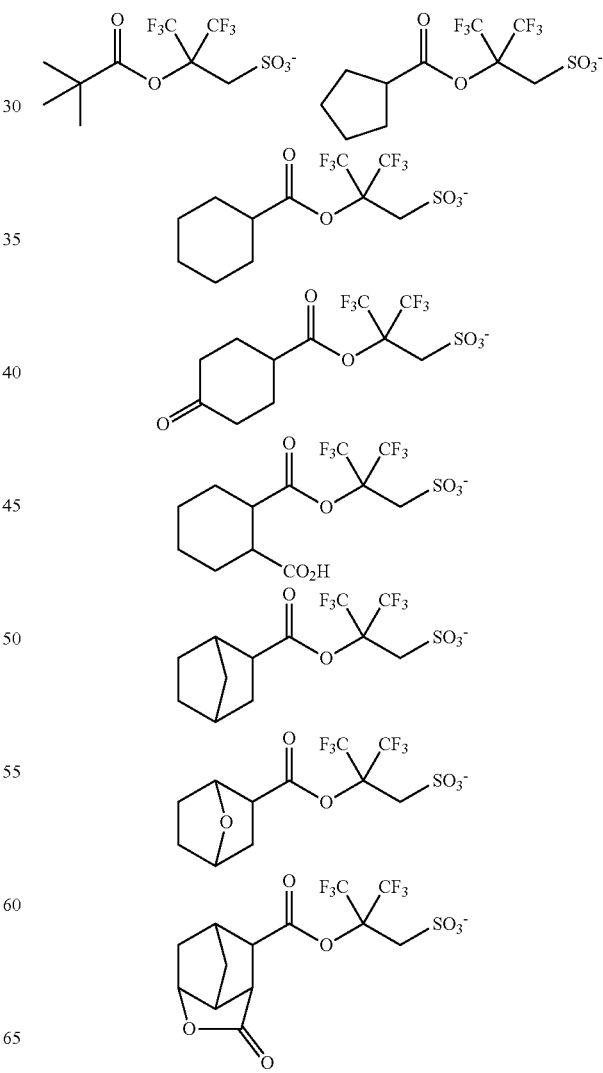

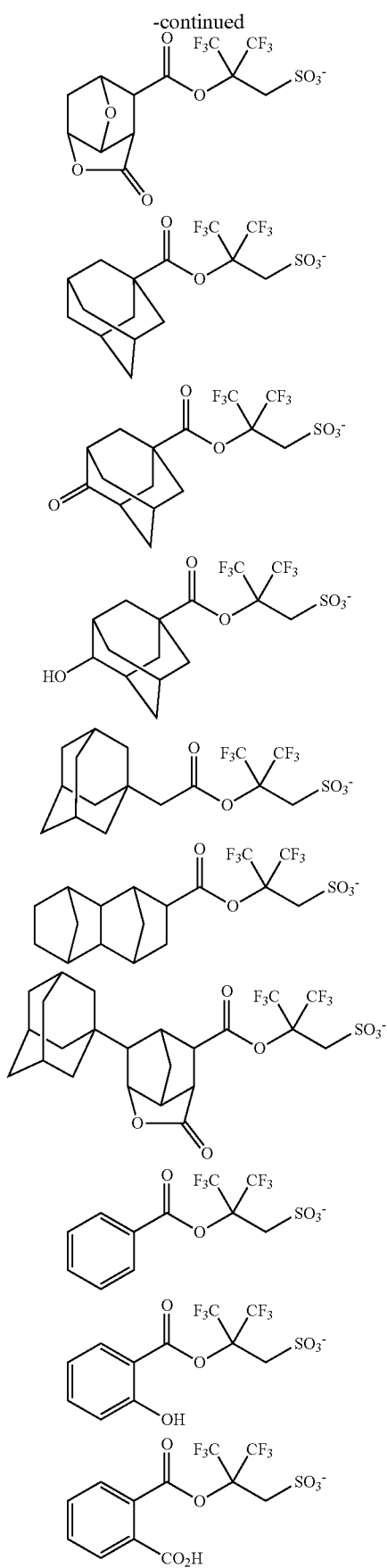
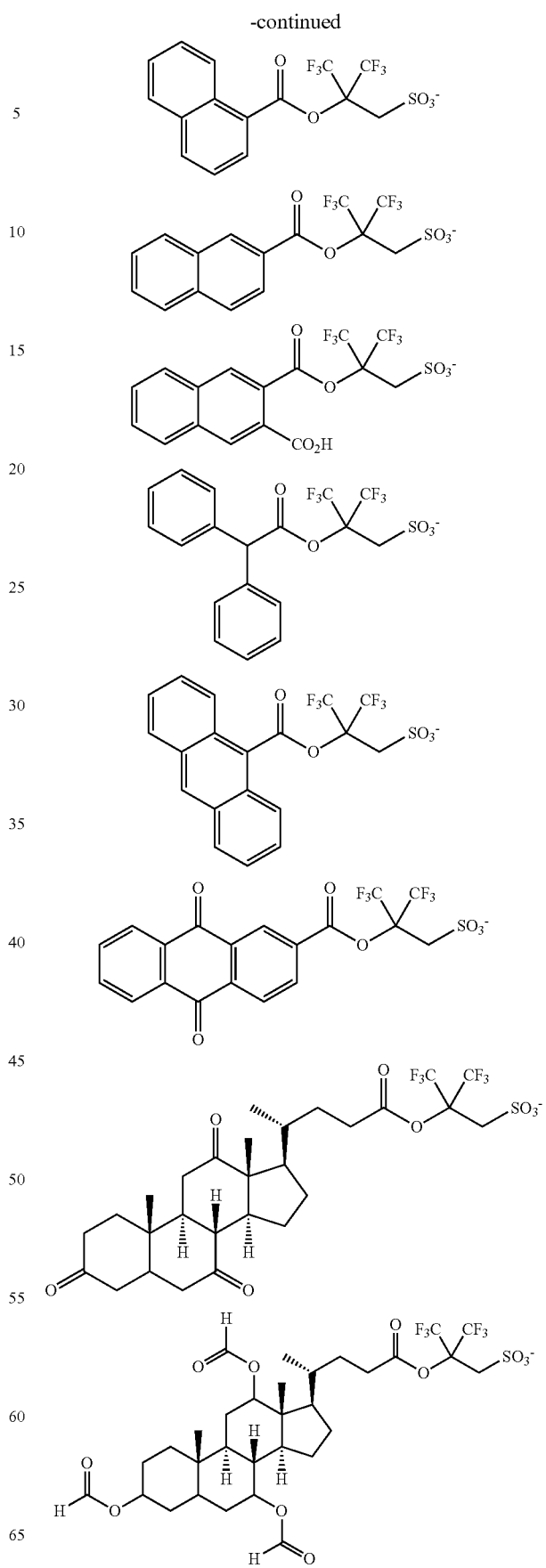

-continued

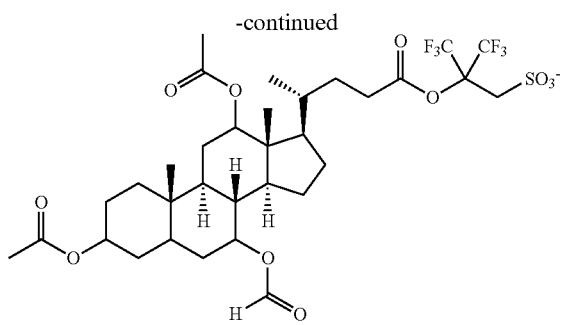

Preferably the PAG as component (B) is used in an amount of 0.1 to 40 parts, more preferably 0.2 to 20 parts, and even more preferably 0.3 to 15 parts by weight per 100 parts by weight of the base resin as component (A). An amount of the PAG within the range may avoid such problems as degraded resolution and foreign particles after resist development or during stripping. It is noted that the content of the compound having formula (B-3) is preferably 0 to 20% by weight of the PAG as component (B).

Since the PAG defined herein has a fluorinated structure, typically trifluoromethyl in the anion moiety, it is highly hydrophobic and is least leached in immersion water. Also, because of a fluorinated structure, the PAG has a high solvent solubility. Thus any residues after organic solvent development may be minimized, indicating that defects after development are reduced. This is advantageous as a resist composition for the ArF immersion lithography.

In the resist composition, a PAG other than the PAGs defined above may be included for the purpose of fine adjustment of lithography performance. The other PAG may be any compound capable of generating an acid upon exposure to high-energy radiation. It may be any of well-known acid generators used in conventional resist compositions, especially chemically amplified resist compositions. Suitable PAGs include sulfonium salts, iodonium salts, sulfonyldiazomethane, N-sulfonyloxyimide, and oxime-O-sulfonate acid generators, which may be used alone or in admixture. Examples of the acid generated by the other PAG include strong acids such as sulfonic acids, bis(perfluoroalkanesulfonyl)imide and tris(perfluoromethanesulfonyl)methide, and weak acids such as carboxylic acids.

Examples of the other PAG include the compounds described in JP-A 2008-111103, paragraphs [0122]-[0142], especially the compounds described in JP-A 2014-001259, paragraphs [0088]-[0092], the compounds described in JP-A 2012-041320, paragraphs [0015]-[0017], and the compounds described in JP-A 2012-106986, paragraphs [0015]-[0029]. The PAGs capable of generating partially fluorinated sulfonic acids described in these patent documents are advantageously used in ArF lithography because the generated acid has an appropriate strength and diffusion length.

(C) Solvent

The resist composition contains a solvent as component (C). Suitable solvents include those described in JP-A 2008-111103, paragraphs [0144]-[0145], for example, ketones such as cyclohexanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, methyl lactate, ethyl pyruvate, butyl acetate, methyl 3-methoxypropionate, ethyl 3-ethoxypropionate, t-butyl acetate, tert-butyl propionate, and propylene glycol mono-t-butyl ether acetate; lactones such as γ-butyrolactone; alcohols such as diacetone alcohol, which may be used alone or in admixture. Where an acid labile group of acetal form is used, a high-boiling alcohol solvent such as diethylene glycol, propylene glycol, glycerol, 1,4-butanediol or 1,3-butanediol may be added for accelerating deprotection reaction of acetal.

An appropriate amount of the solvent (C) used is 100 to 10,000 parts, more preferably 300 to 8,000 parts by weight per 100 parts by weight of the base resin (A).

(D) Fluoro-Resin

The resist composition may contain (D) a fluoro-resin different from Resin A, the fluoro-resin comprising recurring units of at least one type selected from the formulae (D-1), (D-2) and (D-3).

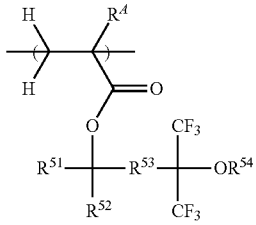

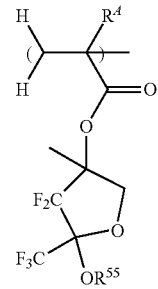

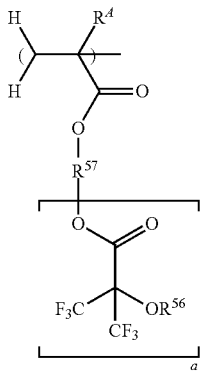

Herein $R^A$ is as defined above. $R^{51}$ and $R^{52}$ are each independently hydrogen or a $C_1$-$C_{10}$ straight, branched or cyclic monovalent hydrocarbon group. $R^{53}$ is a single bond or a $C_1$-$C_5$ straight or branched divalent hydrocarbon group. $R^{54}$, $R^{55}$ and $R^{56}$ are each independently hydrogen or a $C_1$-$C_{15}$ straight, branched or cyclic monovalent hydrocarbon, fluorinated hydrocarbon or acyl group, or an acid labile group, with the proviso that when $R^{54}$, $R^{55}$ or $R^{56}$ is a monovalent hydrocarbon or fluorinated hydrocarbon group, at least one carbon atom in the group may be substituted by an ether or carbonyl moiety. $R^{57}$ is a $C_1$-$C_{20}$ straight, branched or cyclic (a+1)-valent hydrocarbon or fluorinated hydrocarbon group, and a is an integer of 1 to 3.

Examples of the $C_1$-$C_{10}$ monovalent hydrocarbon group represented by $R^{51}$ and $R^{52}$ include alkyl groups such as methyl, ethyl, n-propyl, isopropyl, cyclopropyl, n-butyl, isobutyl, sec-butyl, t-butyl, cyclobutyl, n-pentyl, cyclopentyl, n-hexyl, cyclohexyl, n-heptyl, n-octyl, n-nonyl, n-decyl, adamantyl and norbornyl. Inter alia, $C_1$-$C_6$ straight, branched or cyclic hydrocarbon groups are preferred.

Examples of the $C_1$-$C_5$ divalent organic group $R^{53}$ include methylene, ethylene, trimethylene, propylene, tetramethylene and pentamethylene.

Of the groups represented by $R^{54}$, $R^{55}$ and $R^{56}$, suitable $C_1$-$C_{15}$ monovalent hydrocarbon groups include alkyl, alkenyl, and alkynyl groups. Inter alia, alkyl groups are preferred, examples of which include those exemplified above for $R^{51}$ and n-undecyl, n-dodecyl, tridecyl, tetradecyl, and pentadecyl. Suitable monovalent fluorinated hydrocarbon groups are the foregoing monovalent hydrocarbon groups in which at least one hydrogen atom (one or more or even all hydrogen atoms) is substituted by fluorine. In these groups, one or more carbon may be substituted by an ether or carbonyl moiety as mentioned above.

When $R^{54}$, $R^{55}$ and $R^{56}$ each are an acid labile group, exemplary acid labile groups include groups of formulae (L1) to (L9), $C_4$-$C_{20}$, preferably $C_4$-$C_{15}$ tertiary alkyl groups, trialkylsilyl groups in which each alkyl moiety has 1 to 6 carbon atoms, and $C_4$-$C_{20}$ oxoalkyl groups, as defined and exemplified above.

Suitable (a+1)-valent hydrocarbon or fluorinated hydrocarbon groups represented by $R^{57}$ include the above-mentioned hydrocarbon or fluorinated hydrocarbon groups, with the number "a" of hydrogen atoms being eliminated.

Examples of the recurring unit having formula (D-1) are shown below, but not limited thereto. Herein $R^A$ is as defined above.

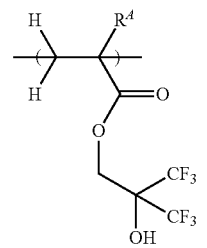
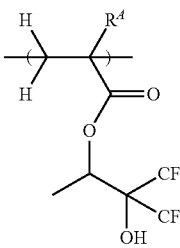

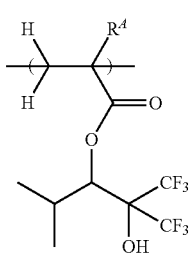
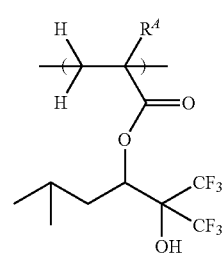

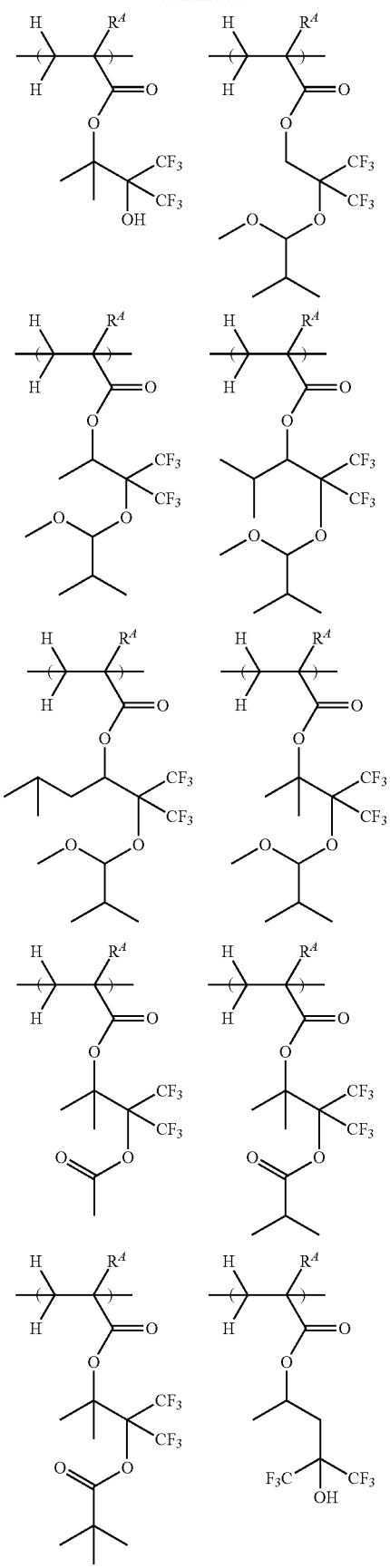

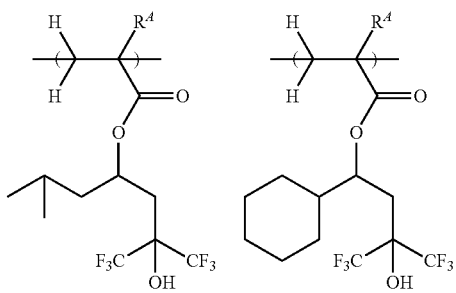
Examples of the recurring unit having formula (D-2) are shown below, but not limited thereto. Herein $R^A$ is as defined above.
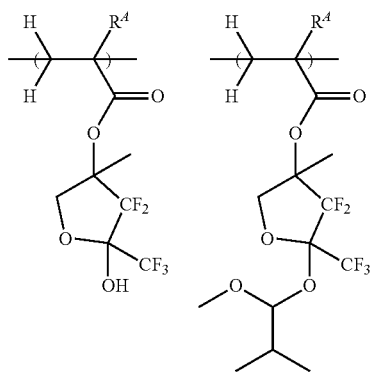
Examples of the recurring unit having formula (D-3) are shown below, but not limited thereto. Herein $R^A$ is as defined above.
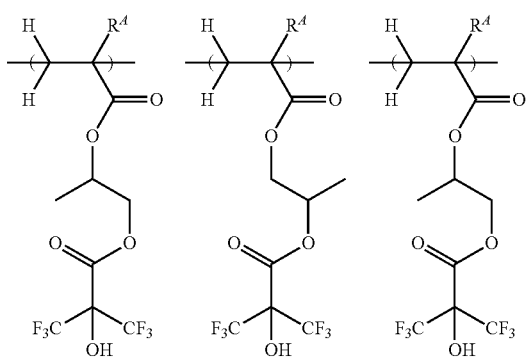
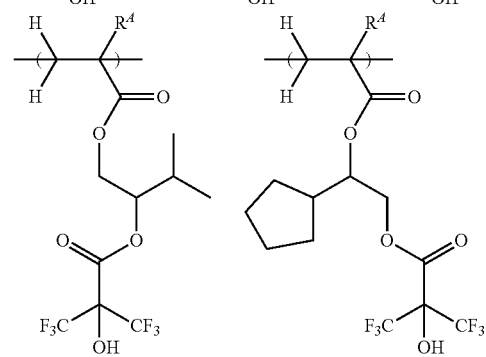
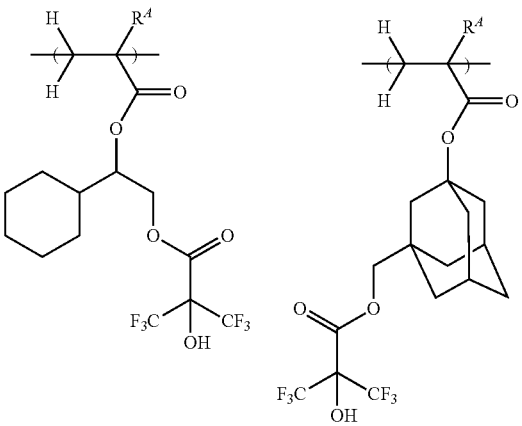
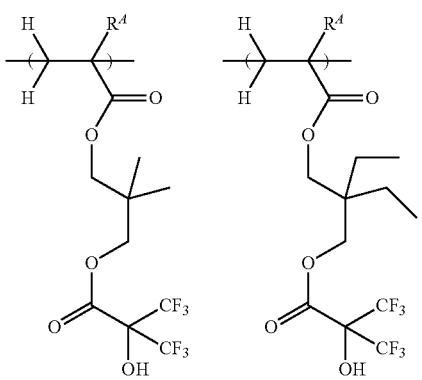
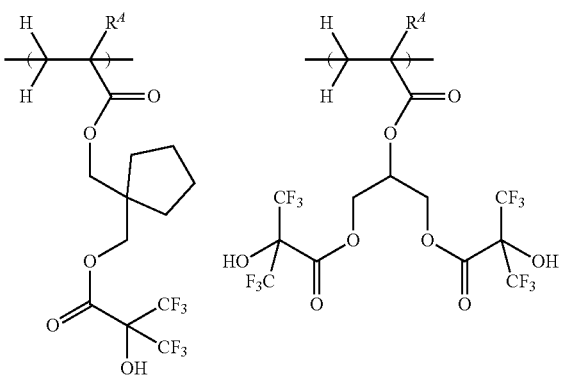
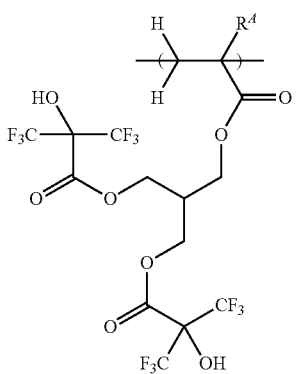

-continued

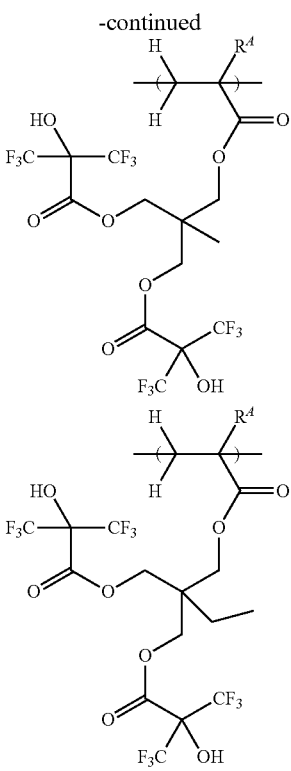

The fluoro-resin as component (D) preferably has a Mw of 1,000 to 100,000, more preferably 3,000 to 15,000 and a dispersity Mw/Mn of 1.0 to 2.0, more preferably 1.0 to 1.6.

The fluoro-resin (D) may be synthesized by any desired methods, for example, by dissolving one or more unsaturated bond-bearing monomers corresponding to the recurring units having formula (D-1) to (D-3) and optionally additional recurring units in an organic solvent, adding a radical initiator thereto, and heating for polymerization. Examples of the organic solvent which can be used for polymerization include toluene, benzene, THF, diethyl ether, dioxane, MEK, propylene glycol monomethyl ether, and PGMEA. Examples of the polymerization initiator used herein include AIBN, 2,2'-azobis(2,4-dimethylvaleronitrile), dimethyl 2,2-azobis(2-methylpropionate), benzoyl peroxide, and lauroyl peroxide. Preferably the reaction temperature is in a range of 50 to 100° C. and the reaction time is 4 to 24 hours. The acid labile group that has been incorporated in the monomer may be kept as such, or polymerization may be followed by protection or partial protection. During the polymer synthesis, any known chain transfer agent such as dodecyl mercaptan or 2-mercaptoethanol may be added for molecular weight control purpose. The amount of chain transfer agent added is preferably 0.01 to 10 mol % based on the total moles of monomers.

When the fluoro-resin (D) is added to the resist composition, an amount of the fluoro-resin is preferably 0.1 to 50 parts, more preferably 0.5 to 10 parts by weight per 100 parts by weight of the base resin (A). An amount of the fluoro-resin within the range is effective for improving the contact angle of resist film surface with water, preventing formation of defects by residual immersion water and leaching-out of acid generator and quencher, adjusting the solubility of resist film surface, and achieving improved CDU.

Other Components

In the resist composition, an amine compound, sulfonic acid salt or carboxylic acid salt may be included as a quencher if necessary. As used herein, the quencher is a compound capable of suppressing the diffusion rate when the acid generated by the PAG diffuses through the resist film.

Examples of the quencher include primary, secondary, and tertiary amine compounds as described in JP-A 2008-111103 (U.S. Pat. No. 7,537,880), paragraphs [0146]-[0164], specifically amine compounds having a hydroxyl, ether, ester, lactone, cyano or sulfonic ester group, and primary or secondary amine compounds protected in carbamate form as described in JP 3790649. The protected amine compounds are effective particularly when the resist composition contains a base labile component.

Typical of the sulfonic acid salt are compounds having the formula (Z1). Typical of the carboxylic acid salt are compounds having the formula (Z2).

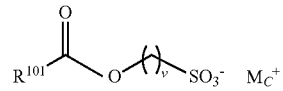
(Z1)

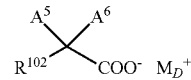
(Z2)

Herein $A^5$ and $A^6$ each are hydrogen or trifluoromethyl. $R^{101}$O is a $C_1$-$C_{35}$ straight, branched or cyclic monovalent hydrocarbon group which may contain oxygen, a nitrogen-containing heterocyclic group, or a group having formula (i); v is an integer of 1 to 3. $R^{102}$ is hydrogen, hydroxyl, or a $C_1$-$C_{35}$ straight, branched or cyclic monovalent hydrocarbon group which may contain oxygen. $M_C^+$ and $M_D^+$ each are an onium cation.

Examples of the monovalent hydrocarbon group and nitrogen-containing heterocyclic group represented by $R^{101}$ or $R^{102}$ are as exemplified above for $R^{21}$. Examples of the onium cation represented by $M_C^+$ and $M_D^+$ are as exemplified above for $M_A^+$.

Examples of the sulfonic acid salt having formula (Z1) are shown below, but not limited thereto.

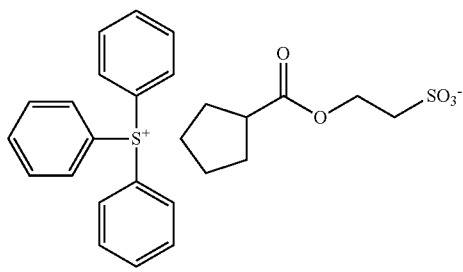

83
-continued
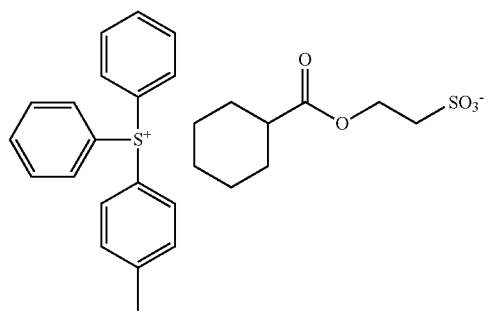
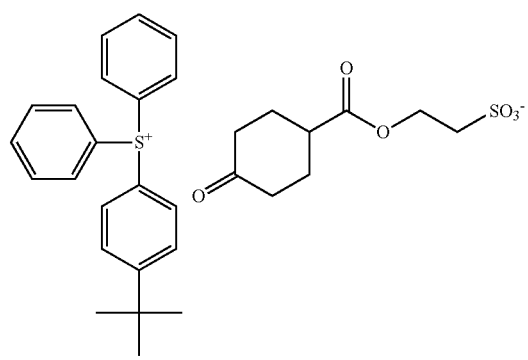
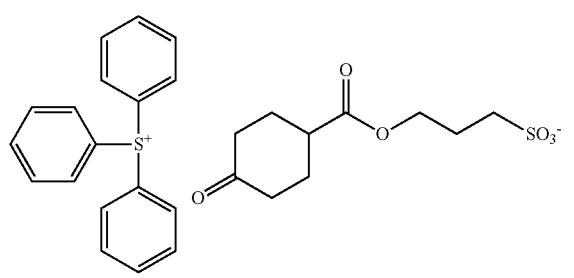
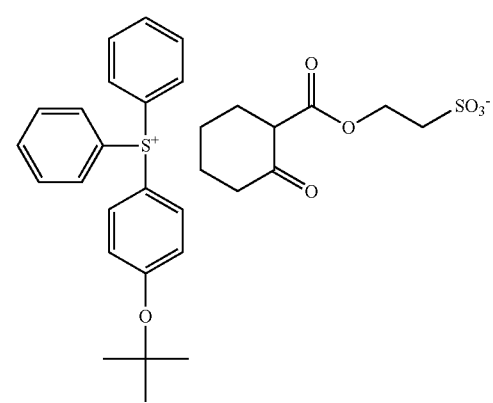
84
-continued
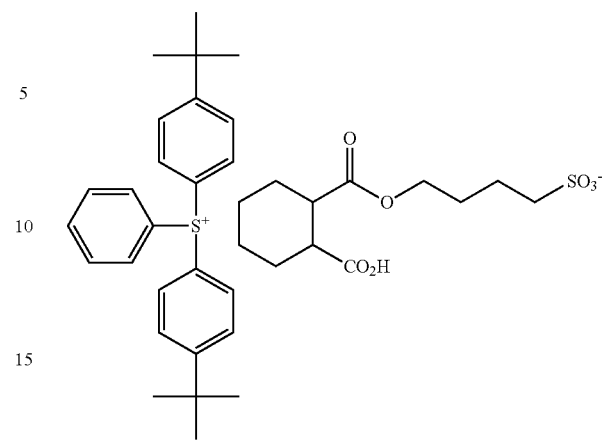
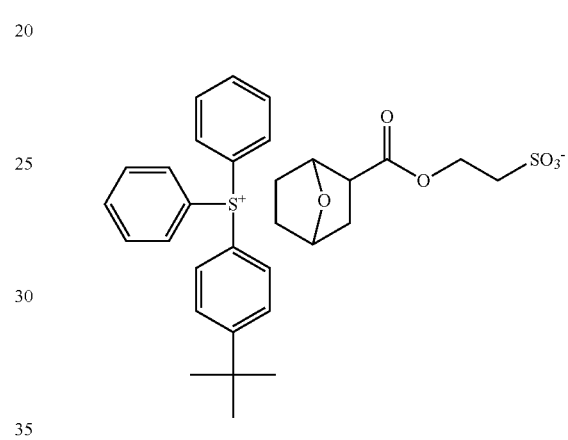
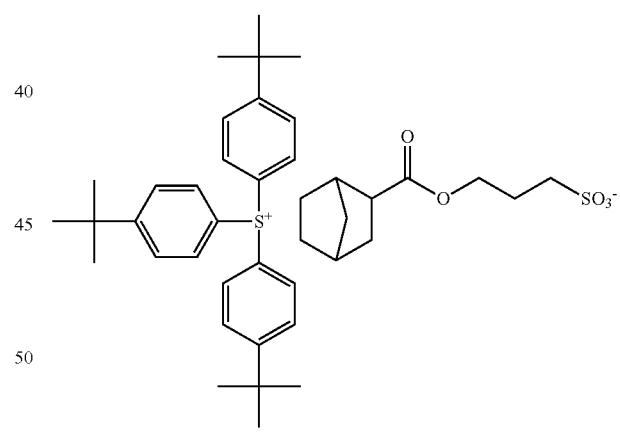
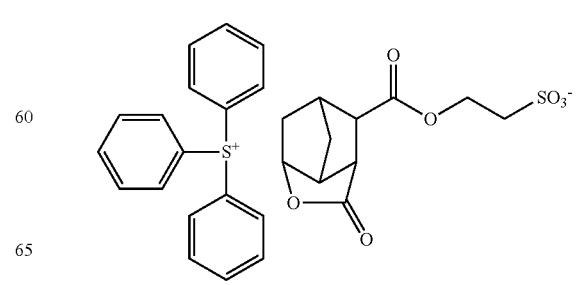

85
-continued
86
-continued
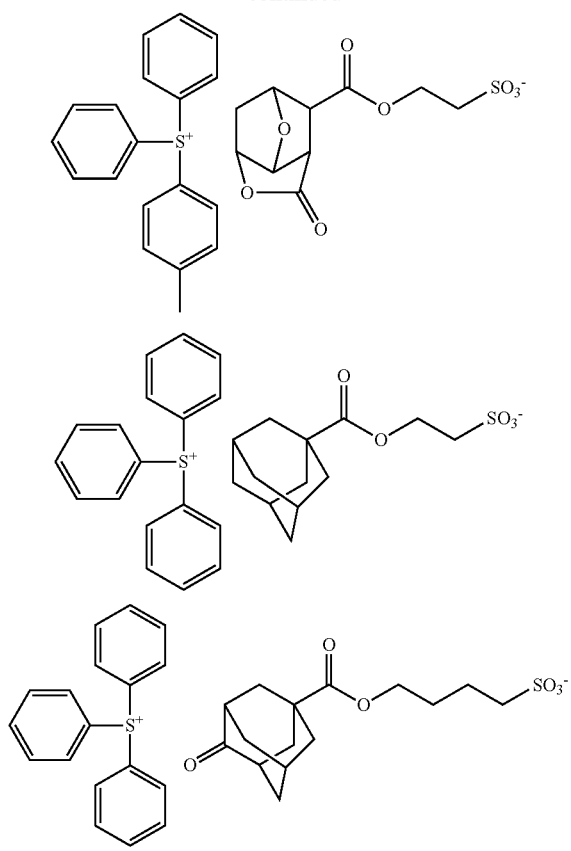
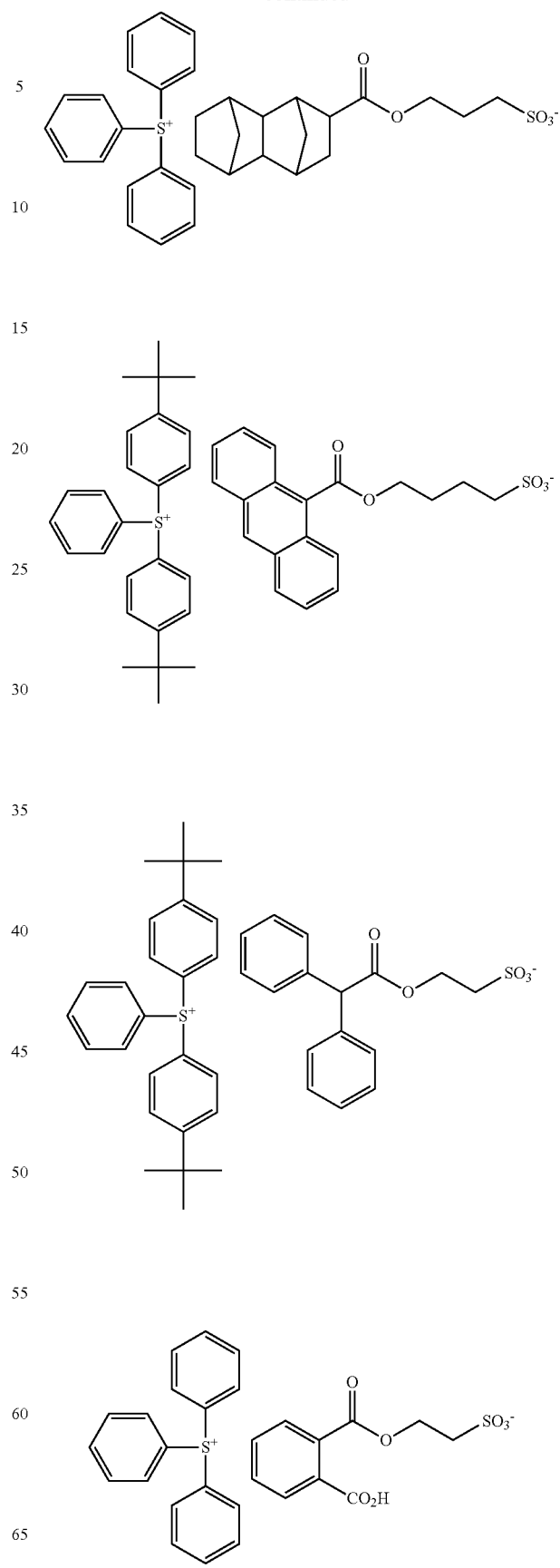

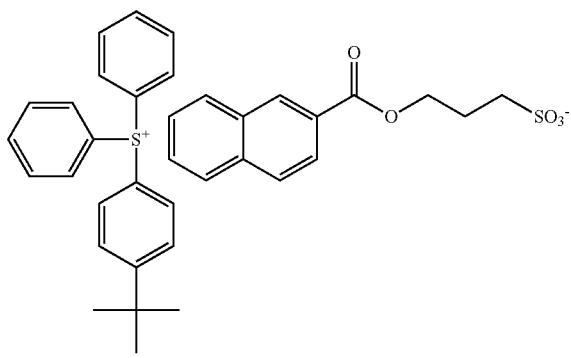
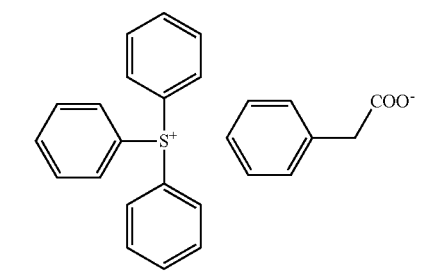
Examples of the carboxylic acid salt having formula (Z2) are shown below, but not limited thereto.
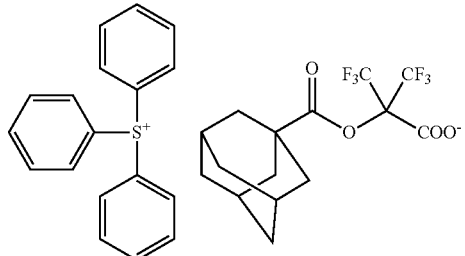
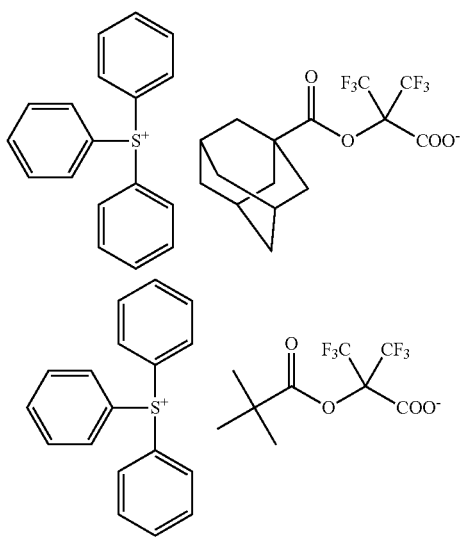
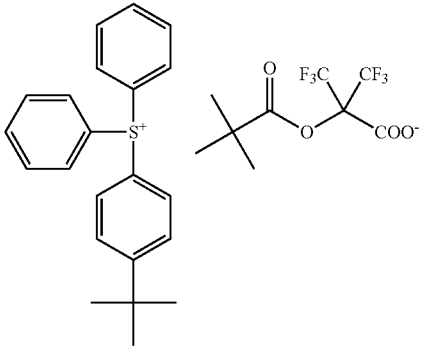
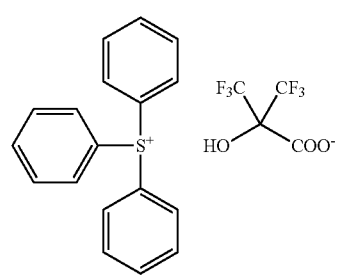
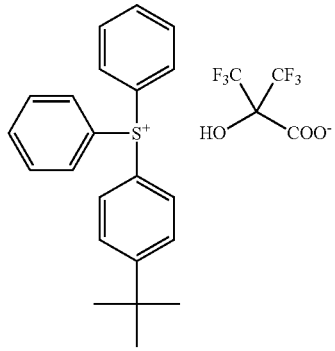
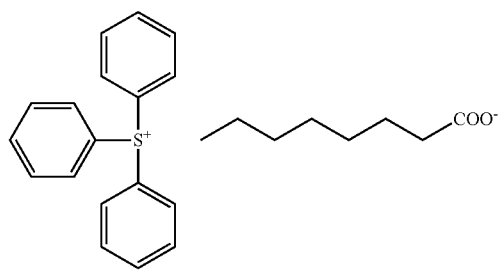
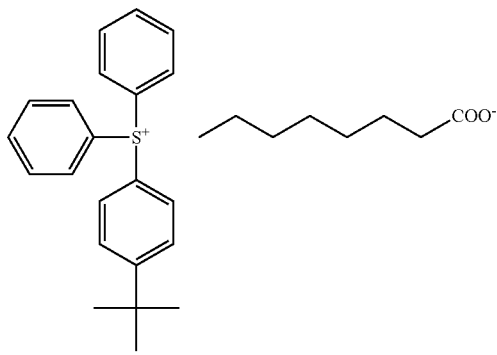

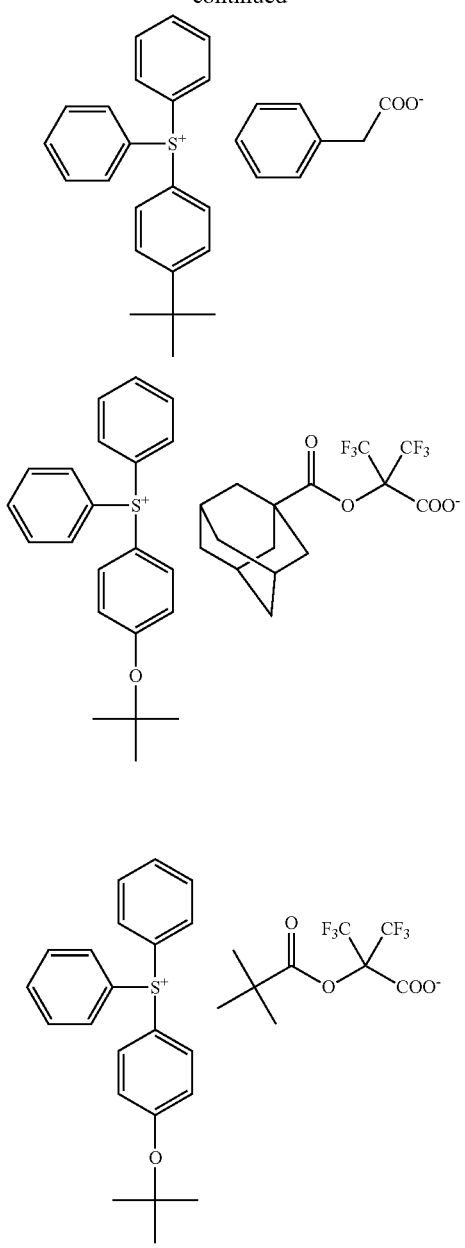

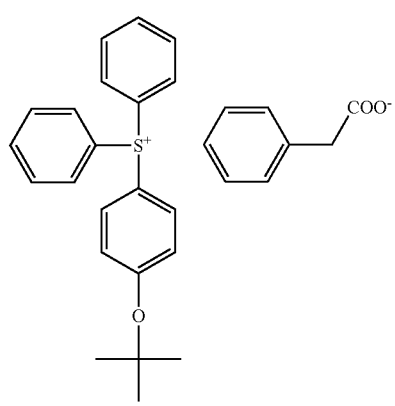

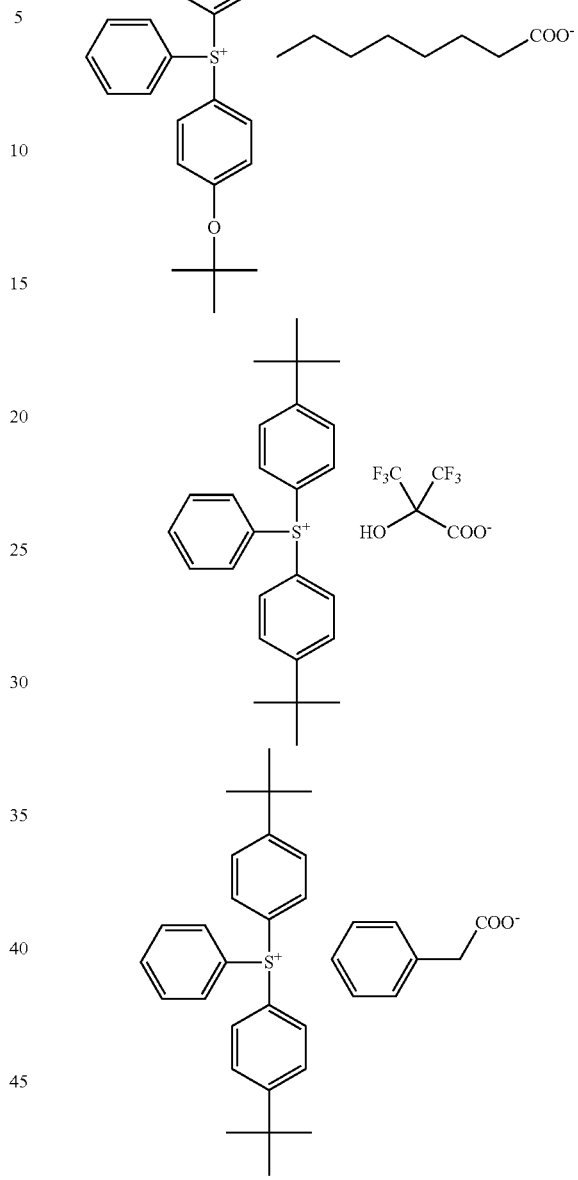

When used, the quencher is preferably added in an amount of 0.001 to 12 parts, more preferably 0.01 to 8 parts by weight per 100 parts by weight of the base resin (A). The inclusion of the quencher allows for easy control of resist sensitivity and holds down the diffusion rate of acid in the resist film, which leads to many advantages including improved resolution, minimized sensitivity change following exposure, reduced substrate poisoning and environment dependency, and improved exposure latitude and pattern profile. The quencher is also effective for improving adhesion to the substrate. The quencher may be used alone or in admixture.

Surfactant

The resist composition may further comprise a surfactant which is insoluble or substantially insoluble in water and soluble in alkaline developer, and/or a surfactant which is insoluble or substantially insoluble in water and alkaline developer. For the surfactant, reference should be made to the compounds described as component (S) in JP-A 2010-215608 and JP-A 2011-016746.

While many examples of the surfactant which is insoluble or substantially insoluble in water and alkaline developer are described in the patent documents cited above, preferred examples are FC-4430 (3M), Surflon® S-381 (AGC Seimi Chemical), Surfynol® E1004 (Air Products), KH-20 and KH-30 (Asahi Glass), which may be used alone or in admixture. Partially fluorinated oxetane ring-opened polymers having the formula (surf-1) are also useful.

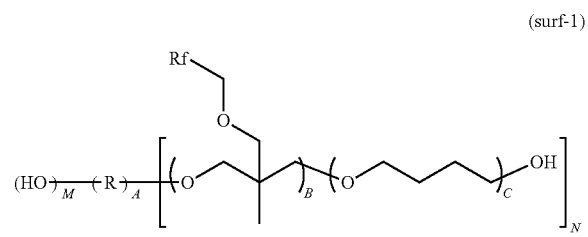

(surf-1)

It is provided herein that R, Rf, A, B, C, M, and N are applied to only formula (surf-1), independent of their descriptions other than for the surfactant. R is a di- to tetra-valent $C_2$-$C_5$ aliphatic group. Exemplary divalent groups include ethylene, tetramethylene, propylene, 2,2-dimethyl-1,3-propanediyl and pentamethylene. Exemplary tri- and tetra-valent groups are shown below.

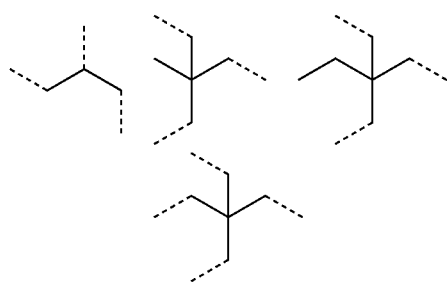

Herein the broken line denotes a valence bond. These formulae are partial structures derived from glycerol, trimethylol ethane, trimethylol propane, and pentaerythritol, respectively. Of these, tetramethylene and 2,2-dimethyl-1,3-propanediyl are preferably used.

Rf is trifluoromethyl or pentafluoroethyl, and preferably trifluoromethyl. M is an integer of 0 to 3, N is an integer of 1 to 4, and the sum of M and N, which represents the valence of R, is an integer of 2 to 4. A is equal to 1, B is an integer of 2 to 25, and C is an integer of 0 to 10. Preferably, B is an integer of 4 to 20, and C is 0 or 1. Note that the formula (surf-1) does not prescribe the arrangement of respective constituent units while they may be arranged either blockwise or randomly. For the preparation of surfactants in the form of partially fluorinated oxetane ring-opened polymers, reference should be made to U.S. Pat. No. 5,650,483, for example.

Process

A further embodiment of the invention is a pattern forming process using the resist composition defined above. A pattern may be formed from the resist composition using any well-known lithography process.

Specifically, the resist composition is applied onto a substrate for integrated circuitry fabrication (e.g., Si, $SiO_2$, SiN, SiON, TiN, WSi, BPSG, SOG, organic antireflective film, etc.) or a substrate for mask circuitry fabrication (e.g., Cr, CrO, CrON, $MoSi_2$, $SiO_2$, etc.) by a suitable coating technique such as spin coating. The coating is prebaked on a hotplate at a temperature of 60 to 150° C. for 1 to 10 minutes, preferably 80 to 140° C. for 1 to 5 minutes. The resulting resist film is generally 0.05 to 2 μm thick.

Through a mask having a desired pattern disposed over the substrate, the resist film is then exposed to high-energy radiation such as KrF excimer laser, ArF excimer laser or EUV in an exposure dose preferably in the range of 1 to 200 $mJ/cm^2$, more preferably 10 to 100 $mJ/cm^2$. Alternatively, pattern formation may be performed by writing with EB directly in a dose of preferably 0.1 to 100 $\mu C/cm^2$, more preferably 0.5 to 50 $\mu C/cm^2$. Light exposure may be done by a conventional lithography process or in some cases, by an immersion lithography process of providing a liquid having a refractive index of at least 1.0 between the projection lens and the resist film. The preferred liquid is water. In the case of immersion lithography, a protective film which is insoluble in water may be formed on the resist film.

The resist film is then baked (PEB) on a hotplate at 60 to 150° C. for 1 to 5 minutes, and preferably at 80 to 140° C. for 1 to 3 minutes. Finally, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. In this way the desired pattern is formed on the substrate.

While the water-insoluble protective film which is used in the immersion lithography serves to prevent any components from being leached out of the resist film and to improve water slippage at the film surface, it is generally divided into two types. The first type is an organic solvent-strippable protective film which must be stripped, prior to alkaline development, with an organic solvent in which the resist film is not dissolvable. The second type is an alkali-soluble protective film which is soluble in an alkaline developer so that it can be removed simultaneously with the removal of solubilized regions of the resist film. The protective film of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective film of the second type is formed.

Any desired step may be added to the pattern forming process. For example, after a resist film is formed, a step of rinsing with pure water (post-soaking) may be introduced to extract the acid generator or the like from the film surface or wash away particles. After exposure, a step of rinsing (post-soaking) may be introduced to remove any water remaining on the film after exposure.

In the pattern forming process, an alkaline aqueous solution, typically an aqueous solution of 0.1 to 5 wt %, more preferably 2 to 3 wt % TMAH is often used as the developer. The negative tone development technique using an organic solvent instead is also applicable wherein the unexposed region is developed and dissolved in the organic solvent.

In the organic solvent development, the organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, phenyl acetate, propyl formate, butyl formate, isobutyl formate, pentyl formate, isopentyl formate, methyl valerate, methyl pentenoate, methyl crotonate, ethyl crotonate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

EXAMPLE

Examples and Comparative Examples are given below by way of illustration and not by way of limitation. The abbreviation "pbw" is parts by weight. For all polymers, Mw and Mn are determined by GPC versus polystyrene standards using THF solvent. Monomer 1 used herein is identified below.

Monomer 1

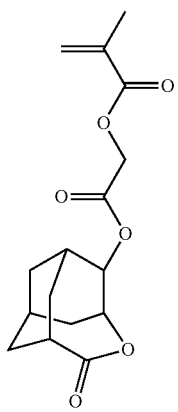

1) Synthesis of Polymers

Synthesis Example 1

Synthesis of Polymer 1

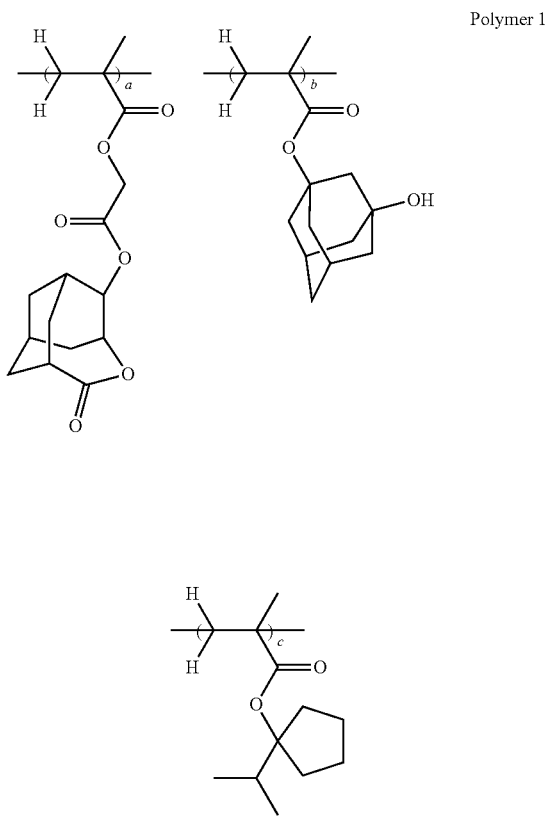

Polymer 1

$a = 0.40, b = 0.10, c = 0.50$
Mw = 8,500
Mw/Mn = 1.55

Under nitrogen atmosphere, a solution was prepared by dissolving 25.2 g of Monomer 1, 4.80 g of 3-hydroxyadamantyl methacrylate, 20.0 g of 1-isopropylcyclopentyl methacrylate, and 3.29 g of dimethyl 2,2'-azobisisobutyrate in 70 g of PGMEA. Under nitrogen atmosphere, the solution was added dropwise over 4 hours to 23 g of PGMEA while stirring at 80° C. After the completion of dropwise addition, stirring was continued at 80° C. for 2 hours. The reaction solution was cooled to room temperature and added dropwise to 800 g of methanol. The thus precipitated solid was collected by filtration and vacuum dried at 50° C. for 20 hours, obtaining Polymer 1 in white powder solid form. Amount 38.8 g, yield 78%.

Synthesis Examples 2 to 8 and Comparative Synthesis Examples 1 to 8

Synthesis of Polymers 2 to 8 and Comparative Polymers 1 to 8

Polymers 2 to 8 and Comparative Polymers 1 to 8 were synthesized by the same procedure as in Synthesis Example 1 aside from changing the type and amount of monomers.

Polymer 2
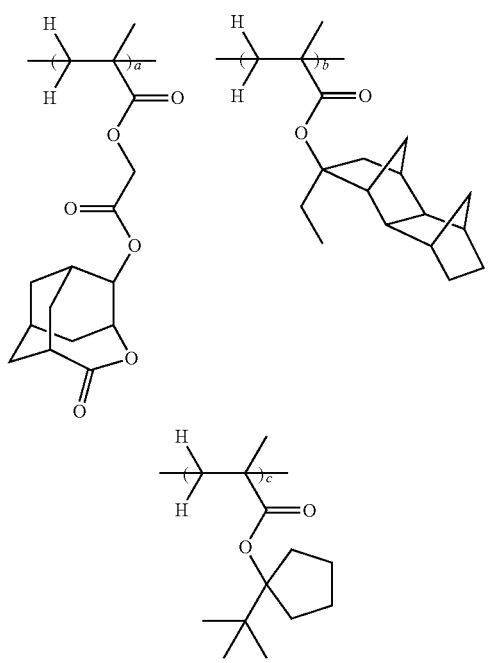
a = 0.50, b = 0.10,
c = 0.40
Mw = 9,450
Mw/Mn = 1.60
Polymer 3
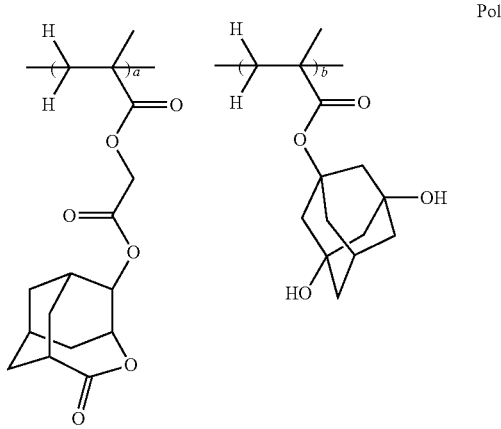
a = 0.45, b = 0.05,
c = 0.15, d = 0.35
Mw = 7,200
Mw/Mn = 1.65
-continued
Polymer 4
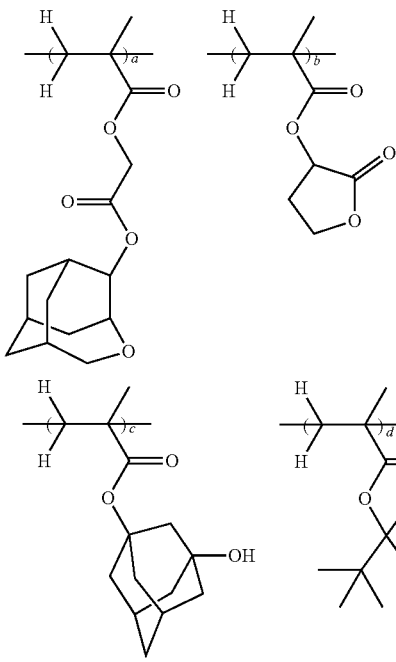
a = 0.35, b = 0.10,
c = 0.10, d = 0.45
Mw = 12,000
Mw/Mn = 1.60
Polymer 5
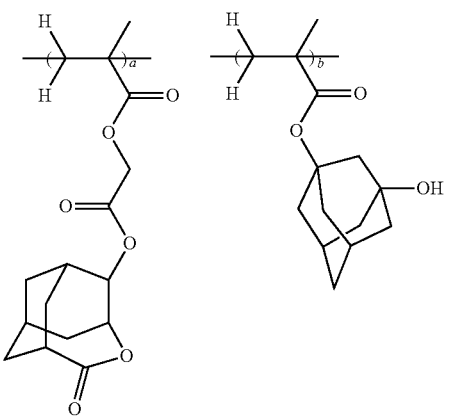
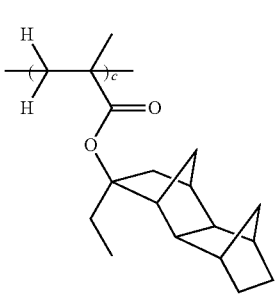
a = 0.55, b = 0.10, c = 0.35
Mw = 8,400
Mw/Mn = 1.70

Polymer 6
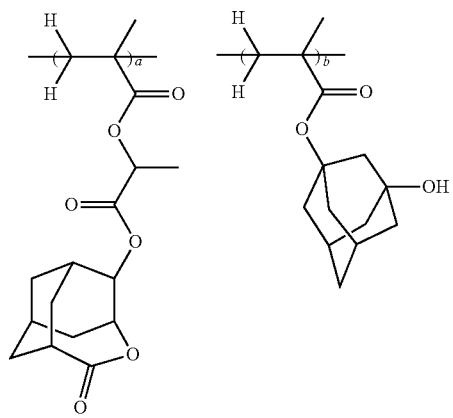
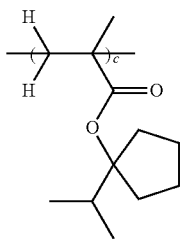
a = 0.40, b = 0.10, c = 0.50
Mw = 7,800
Mw/Mn = 1.60
Polymer 7
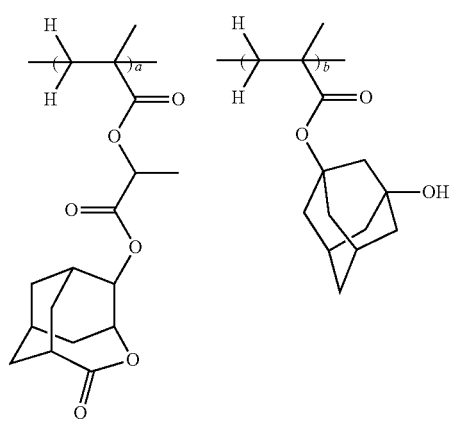
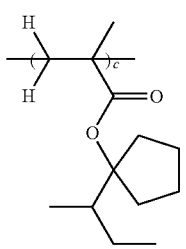
a = 0.45, b = 0.10, c = 0.45
Mw = 9,800
Mw/Mn = 1.65
Polymer 8
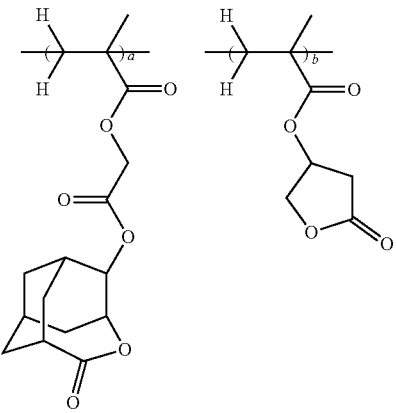
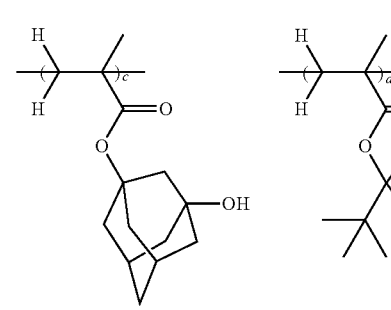
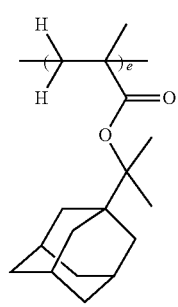
a = 0.30, b = 0.15, c = 0.05, d = 0.30, e = 0.20
Mw = 6,800
Mw/Mn = 1.60
Comparative Polymer 1
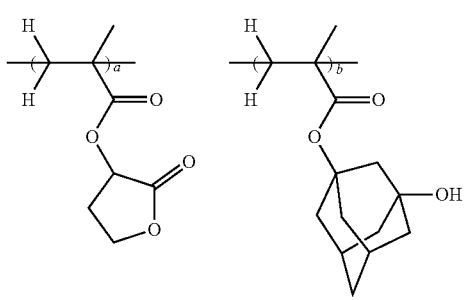

-continued
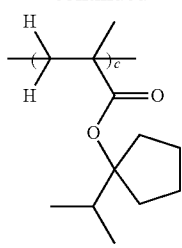
a = 0.40, b = 0.10,
c = 0.50
Mw = 7,900
Mw/Mn = 1.60
Comparative Polymer 2
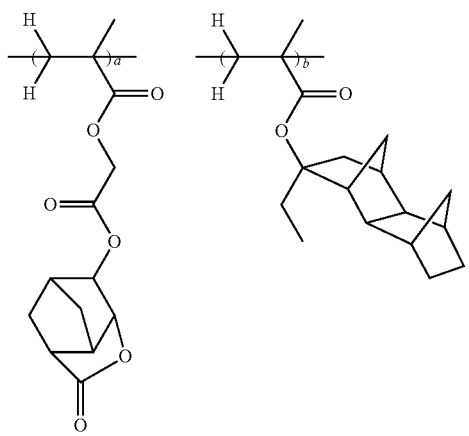
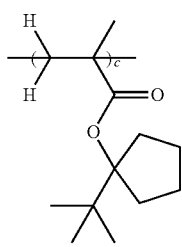
a = 0.50, b = 0.10,
c = 0.40
Mw = 8,100
Mw/Mn = 1.55
Comparative Polymer 3
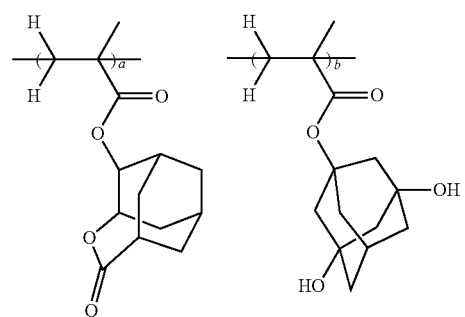
-continued
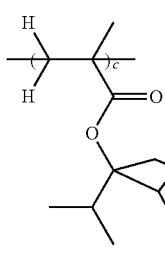
a = 0.45, b = 0.05,
c = 0.15, d = 0.35
Mw = 6,400
Mw/Mn = 1.65
Comparative Polymer 4
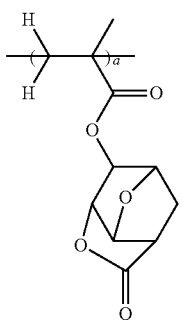
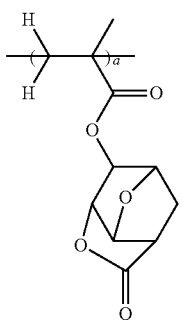
a = 0.35, b = 0.10,
c = 0.10, d = 0.45
Mw = 10,000
Mw/Mn = 1.60
Comparative Polymer 5
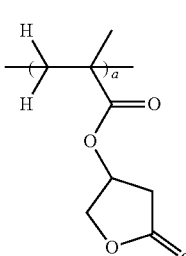
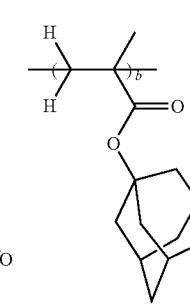

-continued
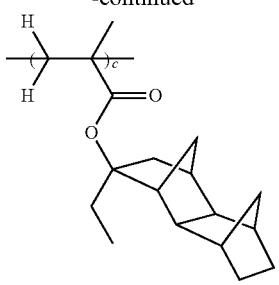
a = 0.55, b = 0.10,
c = 0.35
Mw = 9,200
Mw/Mn = 1.70
Comparative Polymer 6
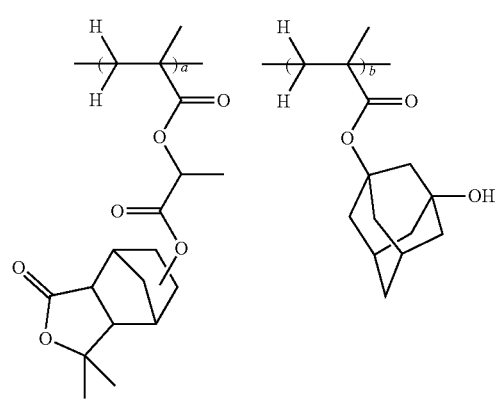
a = 0.40, b = 0.10,
c = 0.50
Mw = 10,100
Mw/Mn = 1.60
Comparative Polymer 7
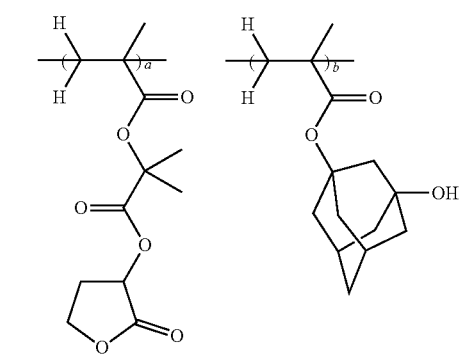
-continued
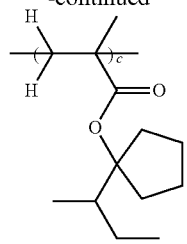
a = 0.45, b = 0.10,
c = 0.45
Mw = 8,300
Mw/Mn = 1.55
Comparative Polymer 8
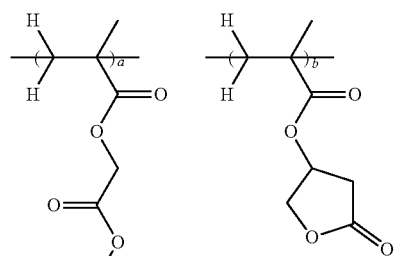
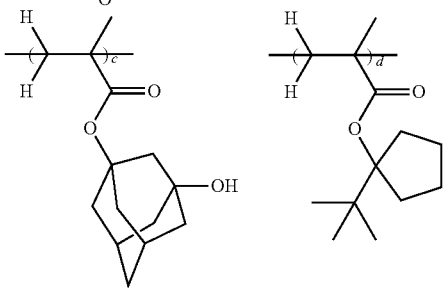
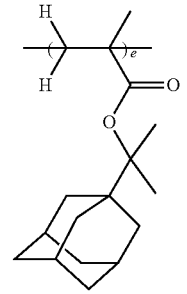
a = 0.30, b = 0.15,
c = 0.05, d = 0.30,
e = 0.20
Mw = 8,200
Mw/Mn = 1.65
2) Preparation of Resist Composition
Examples 1-1 to 1-24 and Comparative Examples 1-1 to 1-29
Resist compositions (R-1 to R-24) and comparative resist compositions (R-25 to R-53) in solution form were prepared by dissolving a polymer (Polymers 1 to 8 and Comparative Polymers 1 to 8), photoacid generator, quencher, and fluoro-polymer in an organic solvent in accordance with the formulation shown in Tables 1 to 3, and filtering through a Teflon® filter with a pore size of 0.2 μm. The solvent contained 0.01 wt % of surfactant KH-20 (Asahi Glass Co., Ltd.).

The photoacid generator, quencher, fluoro-polymer and solvent used herein are identified below.

Photoacid Generator: PAG-1 to PAG-8

PAG-1

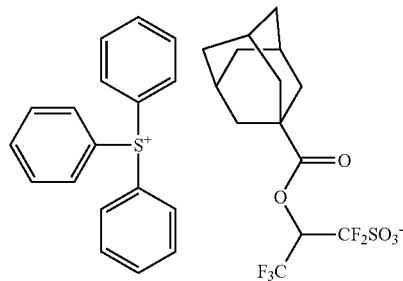

PAG-2

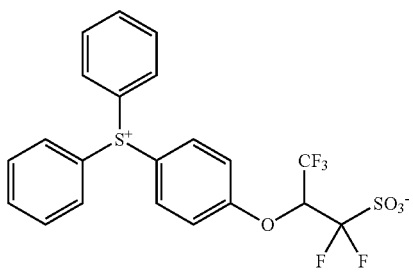

PAG-3

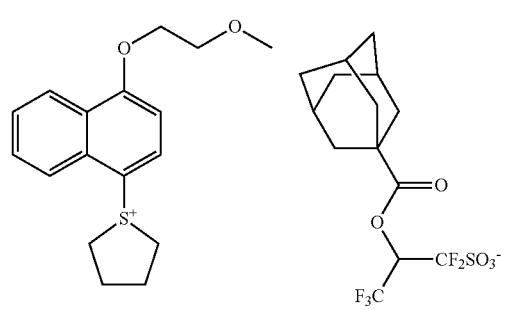

PAG-4

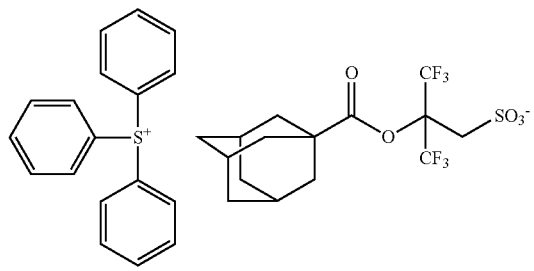

PAG-5

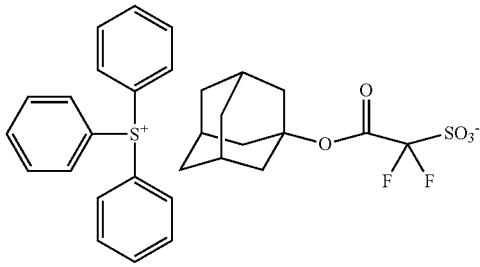

PAG-6

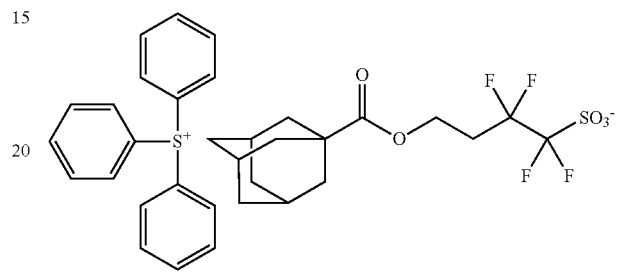

PAG-7

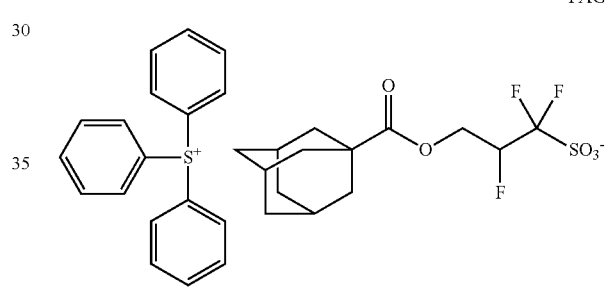

PAG-8

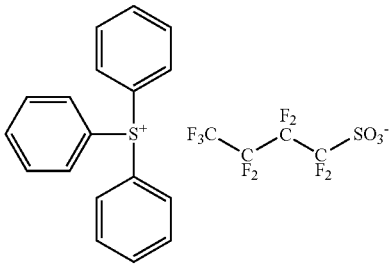

Quencher: Q-1 to Q-3

Q-1

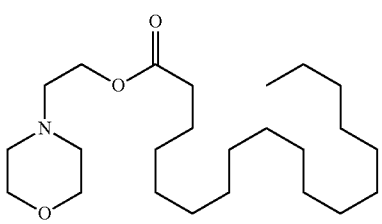

-continued

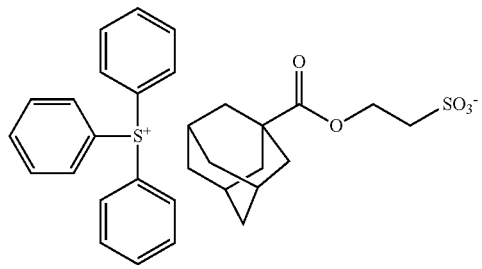
Q-2

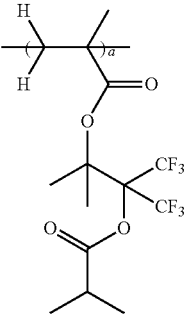
Q-3

Fluoro-polymer: F-1 to F-4

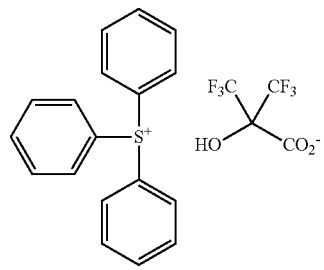
F-1 a = 0.40, b = 0.60
Mw = 7,000

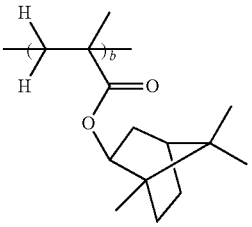
F-2 a = 0.60, b = 0.40
Mw = 9,000

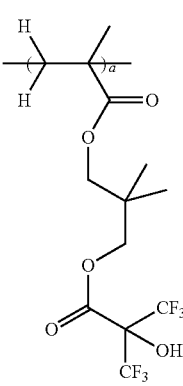
F-3 a = 0.50, b = 0.50
Mw = 11,000

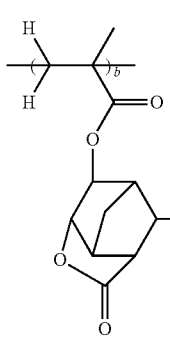
F-4 a = 0.50, b = 0.50
Mw = 9,600

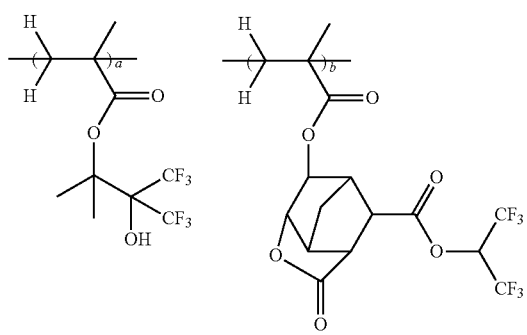

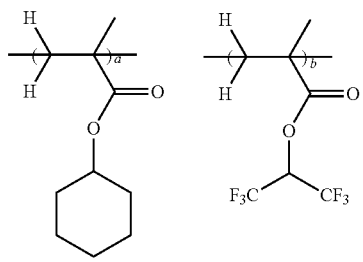

S-1: PGMEA (propylene glycol monomethyl ether acetate)
S-2: GBL (γ-butyrolactone)
S-3: CyHO (cyclohexanone)

TABLE 1

|  |  | Resist composition | Base resin (pbw) | Photoacid generator 1 (pbw) | Photoacid generator 2 (pbw) | Photoacid generator 3 (pbw) | Quencher (pbw) | Fluoro-polymer (pbw) | Solvent 1 (pbw) | Solvent 2 (pbw) |
|---|---|---|---|---|---|---|---|---|---|---|
| Example | 1-1 | R-1 | Polymer 1 (80) | PAG-1 (4) | — | — | Q-1 (2) | F-1 (5) | S-1 (1,600) | — |
|  | 1-2 | R-2 | Polymer 2 (80) | PAG-1 (5) | — | — | Q-2 (2.5) | F-2 (3) | S-1 (1,380) | S-2 (220) |
|  | 1-3 | R-3 | Polymer 3 (80) | PAG-1 (5) | — | — | Q-1 (2) | F-3 (3) | S-1 (1,600) | — |
|  | 1-4 | R-4 | Polymer 4 (80) | PAG-1 (3) | — | — | Q-3 (1.5) | F-2 (3) | S-1 (1,300) | S-3 (300) |
|  | 1-5 | R-5 | Polymer 5 (80) | PAG-1 (5) | — | — | Q-3 (2.5) | F-2 (3) | S-1 (1,300) | S-2 (300) |

TABLE 1-continued

|  | Resist composition | Base resin (pbw) | Photoacid generator 1 (pbw) | Photoacid generator 2 (pbw) | Photoacid generator 3 (pbw) | Quencher (pbw) | Fluoro-polymer (pbw) | Solvent 1 (pbw) | Solvent 2 (pbw) |
| --- | --- | --- | --- | --- | --- | --- | --- | --- | --- |
| 1-6 | R-6 | Polymer 6 (80) | PAG-1 (5) | — | — | Q-1 (2) | F-3 (3) | S-1 (1,600) | — |
| 1-7 | R-7 | Polymer 7 (80) | PAG-1 (4) | — | — | — | F-2 (3) | S-1 (1,300) | S-3 (300) |
| 1-8 | R-8 | Polymer 8 (80) | PAG-1 (3) | — | — | — | F-1 (5) | S-1 (1,600) | — |
| 1-9 | R-9 | Polymer 1 (80) | PAG-2 (5) | — | — | Q-1 (2) | F-1 (5) | S-1 (1,600) | — |
| 1-10 | R-10 | Polymer 2 (80) | PAG-2 (5) | — | — | Q-2 (2.5) | F-2 (3) | S-1 (1,380) | S-2 (220) |
| 1-11 | R-11 | Polymer 3 (80) | PAG-2 (5) | — | — | Q-1 (2) | F-3 (3) | S-1 (1,600) | — |
| 1-12 | R-12 | Polymer 4 (80) | PAG-2 (4) | — | — | Q-3 (1.5) | F-2 (3) | S-1 (1,300) | S-3 (300) |
| 1-13 | R-13 | Polymer 5 (80) | PAG-2 (5) | — | — | Q-2 (2.5) | F-2 (3) | S-1 (1,300) | S-2 (300) |
| 1-14 | R-14 | Polymer 6 (80) | PAG-2 (5) | — | — | Q-1 (2) | F-3 (3) | S-1 (1,600) | — |
| 1-15 | R-15 | Polymer 7 (80) | PAG-2 (5) | — | — | — | F-2 (3) | S-1 (1,300) | S-3 (300) |
| 1-16 | R-16 | Polymer 8 (80) | PAG-2 (4) | — | — | — | F-1 (5) | S-1 (1,600) | — |
| 1-17 | R-17 | Polymer 1 (80) | PAG-1 (2) | PAG-2 (4) | — | Q-1 (2) | F-1 (5) | S-1 (1,600) | — |
| 1-18 | R-18 | Polymer 2 (80) | PAG-1 (3) | PAG-3 (5) | — | Q-2 (2.5) | F-2 (3) | S-1 (1,380) | S-2 (220) |
| 1-19 | R-19 | Polymer 3 (80) | PAG-1 (3) | PAG-2 (4) | PAG-4 (2) | Q-1 (2) | F-3 (3) | S-1 (1,600) | — |
| 1-20 | R-20 | Polymer 4 (80) | PAG-1 (3) | PAG-3 (5) | PAG-4 (3) | Q-3 (1.5) | F-2 (3) | S-1 (1,300) | S-3 (300) |
| 1-21 | R-21 | Polymer 5 (80) | PAG-3 (3) | — | — | Q-3 (2.5) | F-2 (3) | S-1 (1,300) | S-2 (300) |
| 1-22 | R-22 | Polymer 6 (80) | PAG-3 (4) | — | — | Q-1 (2) | F-3 (3) | S-1 (1,600) | — |
| 1-23 | R-23 | Polymer 7 (80) | PAG-1 (3) | PAG-7 (2) | — | — | F-2 (3) | S-1 (1,300) | S-2 (300) |
| 1-24 | R-24 | Polymer 8 (80) | PAG-2 (5) | PAG-5 (5) | — | — | F-1 (5) | S-1 (1,600) | — |

TABLE 2

|  |  | Resist composition | Base resin (pbw) | Photoacid generator 1 (pbw) | Photoacid generator 2 (pbw) | Photoacid generator 3 (pbw) | Quencher (pbw) | Fluoro-polymer (pbw) | Solvent 1 (pbw) | Solvent 2 (pbw) |
| --- | --- | --- | --- | --- | --- | --- | --- | --- | --- | --- |
| Comparative Example | 1-1 | R-25 | Comparative Polymer 1 (80) | PAG-1 (4) | — | — | Q-1 (2) | F-1 (5) | S-1 (1,600) | — |
|  | 1-2 | R-26 | Comparative Polymer 2 (80) | PAG-1 (5) | — | — | Q-2 (2.5) | F-2 (3) | S-1 (1,380) | S-2 (220) |
|  | 1-3 | R-27 | Comparative Polymer 3 (80) | PAG-2 (5) | — | — | Q-1 (2) | F-3 (3) | S-1 (1,600) | — |
|  | 1-4 | R-28 | Comparative Polymer 4 (80) | PAG-2 (4) | — | — | Q-3 (1.5) | F-2 (3) | S-1 (1,300) | S-3 (300) |
|  | 1-5 | R-29 | Comparative Polymer 5 (80) | PAG-3 (3) | — | — | Q-3 (2) | F-2 (3) | S-1 (1,300) | S-2 (300) |
|  | 1-6 | R-30 | Comparative Polymer 6 (80) | PAG-3 (4) | — | — | Q-1 (2) | F-3 (3) | S-1 (1,300) | S-2 (300) |
|  | 1-7 | R-31 | Comparative Polymer 7 (80) | PAG-1 (3) | PAG-3 (3) | — | — | F-2 (3) | S-1 (1,300) | S-3 (300) |
|  | 1-8 | R-32 | Comparative Polymer 8 (80) | PAG-2 (5) | PAG-3 (5) | — | — | F-1 (5) | S-1 (1,600) | — |

TABLE 2-continued

| | | Resist composition | Base resin (pbw) | Photoacid generator 1 (pbw) | Photoacid generator 2 (pbw) | Photoacid generator 3 (pbw) | Quencher (pbw) | Fluoro-polymer (pbw) | Solvent 1 (pbw) | Solvent 2 (pbw) |
|---|---|---|---|---|---|---|---|---|---|---|
| | 1-9 | R-33 | Comparative Polymer 1 (80) | PAG-5 (5) | — | — | Q-1 (3) | F-1 (5) | S-1 (1,600) | — |
| | 1-10 | R-34 | Comparative Polymer 2 (80) | PAG-5 (4) | — | — | Q-2 (3) | F-2 (3) | S-1 (1,380) | S-2 (220) |
| | 1-11 | R-35 | Comparative Polymer 3 (80) | PAG-6 (4) | — | — | Q-1 (2) | F-3 (3) | S-1 (1,600) | — |
| | 1-12 | R-36 | Comparative Polymer 4 (80) | PAG-6 (3) | — | — | Q-2 (2.5) | F-2 (3) | S-1 (1,300) | S-3 (300) |
| | 1-13 | R-37 | Comparative Polymer 5 (80) | PAG-7 (3) | — | — | Q-3 (2.5) | F-2 (3) | S-1 (1,300) | S-2 (300) |
| | 1-14 | R-38 | Comparative Polymer 6 (80) | PAG-7 (5) | — | — | Q-1 (2) | F-3 (3) | S-1 (1,600) | — |
| | 1-15 | R-39 | Comparative Polymer 7 (80) | PAG-8 (4) | — | — | — | F-2 (3) | S-1 (1,300) | S-3 (300) |
| | 1-16 | R-40 | Comparative Polymer 8 (80) | PAG-8 (4) | — | — | — | F-1 (5) | S-1 (1,600) | — |

TABLE 3

| | | Resist composition | Base resin (pbw) | Photoacid generator 1 (pbw) | Photoacid generator 2 (pbw) | Photoacid generator 3 (pbw) | Quencher (pbw) | Fluoro-polymer (pbw) | Solvent 1 (pbw) | Solvent 2 (pbw) |
|---|---|---|---|---|---|---|---|---|---|---|
| Comparative Example | 1-17 | R-41 | Polymer 1 (80) | PAG-5 (5) | — | — | Q-1 (2) | F-1 (5) | S-1 (1,600) | — |
| | 1-18 | R-42 | Polymer 2 (80) | PAG-5 (4) | — | — | Q-2 (2.5) | F-2 (3) | S-1 (1,380) | S-2 (220) |
| | 1-19 | R-43 | Polymer 3 (80) | PAG-6 (4) | — | — | Q-1 (2) | F-3 (3) | S-1 (1,600) | — |
| | 1-20 | R-44 | Polymer 4 (80) | PAG-6 (3) | — | — | Q-3 (1.5) | F-2 (3) | S-1 (1,300) | S-3 (300) |
| | 1-21 | R-45 | Polymer 5 (80) | PAG-7 (3) | — | — | Q-3 (2) | F-2 (3) | S-1 (1,300) | S-2 (300) |
| | 1-22 | R-46 | Polymer 6 (80) | PAG-7 (5) | — | — | Q-1 (2) | F-3 (3) | S-1 (1,300) | S-2 (300) |
| | 1-23 | R-47 | Polymer 7 (80) | PAG-8 (4) | — | — | — | F-2 (3) | S-1 (1,300) | S-3 (300) |
| | 1-24 | R-48 | Polymer 8 (80) | PAG-8 (4) | — | — | — | F-1 (5) | S-1 (1,600) | — |
| | 1-25 | R-49 | Comparative Polymer 1 (80) | PAG-1 (2) | PAG-2 (4) | — | Q-1 (2) | F-1 (5) | S-1 (1,600) | — |
| | 1-26 | R-50 | Comparative Polymer 2 (80) | PAG-1 (3) | PAG-3 (5) | — | Q-2 (2.5) | F-2 (3) | S-1 (1,380) | S-2 (220) |
| | 1-27 | R-51 | Comparative Polymer 3 (80) | PAG-1 (3) | PAG-2 (4) | PAG-4 (2) | Q-1 (2) | F-3 (3) | S-1 (1,600) | — |
| | 1-28 | R-52 | Comparative Polymer 1 (80) | PAG-1 (4) | — | — | Q-1 (2) | F-4 (5) | S-1 (1,600) | — |
| | 1-29 | R-53 | Comparative Polymer 4 (80) | PAG-2 (4) | — | — | Q-3 (1.5) | F-4 (3) | S-1 (1,300) | S-3 (300) |

3) ArF Immersion Lithography Patterning Test (Hole Pattern Test)

Examples 2-1 to 2-24 and Comparative Examples 2-1 to 2-29

Hole Pattern Formation

On a substrate (silicon wafer), a spin-on carbon film ODL-70 (carbon content 65 wt %, Shin-Etsu Chemical Co., Ltd.) was deposited to a thickness of 200 nm and a silicon-containing spin-on hard mask SHB-A940 (silicon content 43 wt %) was deposited thereon to a thickness of 35 nm. On this substrate for trilayer process, each of the resist compositions in Tables 1 to 3 was spin coated, then baked on a hotplate at 200° C. for 60 seconds to form a resist film of 100 nm thick.

Using an ArF excimer laser immersion scanner NSR-S610C (Nikon Corp., NA 1.30, σ 0.9/0.72, 35° cross-pole opening, azimuthally polarized illumination), the resist film was exposed by immersion lithography through a 6% half-tone phase shift mask in a varying dose. The resist film was baked (PEB) at the temperature shown in Tables 4 and 5 for 60 seconds. After PEB, the developer shown in Tables 4 and 5 was injected from a development nozzle while the wafer was spun at 30 rpm for 3 seconds, which was followed by stationary puddle development for 27 seconds. There was formed a hole pattern having a pitch of 100 nm.

Evaluation of Sensitivity

The hole pattern formed above was observed under a TD-SEM (CG-4000, Hitachi High-Technologies Corp.). The optimum dose (Eop) is an exposure dose (mJ/cm$^2$) providing a hole diameter of 50 nm at pitch 100 nm, and serves as an index of sensitivity.

Evaluation of Depth-of-Focus (DOF) Margin

The hole size at the optimum dose was measured under TD-SEM (CG-4000), from which a DOF margin providing a size of 50 nm±5 nm was determined. A larger value indicates a smaller change of pattern size with a change of DOF and hence, better DOF margin.

Evaluation of CDU

The hole pattern formed above was observed under TD-SEM (CG-4000), and 125 holes were measured for diameter. A three-fold value (3a) of a standard deviation (a) was computed therefrom and reported as CDU. A smaller value of 3a indicates a smaller variation of holes.

Evaluation of PPD

Immediately after the PEB (no delay, PPD=0 h), the wafer was puddle developed for 30 seconds to form a hole pattern having a diameter of 50 nm and a pitch of 100 nm. In another run, the wafer was held for 6 hours after PEB (PPD=6 h) before it was similarly developed to form a pattern.

The hole patterns at PPD=0 h and 6 h were observed under TD-SEM (CG-4000), and 125 holes were measured for diameter. An average thereof was regarded a hole size (CD), and CDU was computed by the same method as above. A difference between CD at PPD 0 h and CD at PPD 6 h is regarded a CD shrinkage amount by PPD (ΔPPD CD).

The results of sensitivity, DOF and CDU are shown in Tables 4 and 5.

TABLE 4

| | | Resist composition | PEB temp. (° C.) | Developer | Eop (mJ/cm$^2$) | DOF (nm) | CDU (nm) |
|---|---|---|---|---|---|---|---|
| Example | 2-1 | R-1 | 95 | n-butyl acetate | 34.5 | 90 | 3.5 |
| | 2-2 | R-2 | 90 | n-butyl acetate | 31.5 | 100 | 3.8 |
| | 2-3 | R-3 | 90 | n-butyl acetate | 34.0 | 80 | 3.9 |
| | 2-4 | R-4 | 95 | n-butyl acetate | 29.8 | 120 | 3.7 |
| | 2-5 | R-5 | 95 | n-butyl acetate | 32.7 | 80 | 4.1 |
| | 2-6 | R-6 | 100 | n-butyl acetate | 31.9 | 90 | 3.8 |
| | 2-7 | R-7 | 95 | n-butyl acetate | 32.1 | 90 | 4.1 |
| | 2-8 | R-8 | 90 | n-butyl acetate | 31.2 | 100 | 4.0 |
| | 2-9 | R-9 | 100 | n-butyl acetate | 34.8 | 90 | 3.5 |
| | 2-10 | R-10 | 95 | n-butyl acetate | 35.0 | 90 | 3.6 |
| | 2-11 | R-11 | 90 | n-butyl acetate | 35.5 | 90 | 3.8 |
| | 2-12 | R-12 | 95 | 2-heptanone | 34.1 | 100 | 3.5 |
| | 2-13 | R-13 | 95 | n-butyl acetate | 36.0 | 80 | 3.9 |
| | 2-14 | R-14 | 100 | n-butyl acetate | 34.0 | 90 | 3.7 |
| | 2-15 | R-15 | 95 | n-butyl acetate | 33.9 | 80 | 3.7 |
| | 2-16 | R-16 | 95 | methyl benzoate | 32.8 | 90 | 3.5 |
| | 2-17 | R-17 | 95 | n-butyl acetate | 31.5 | 100 | 3.5 |
| | 2-18 | R-18 | 90 | n-butyl acetate | 30.8 | 90 | 3.4 |
| | 2-19 | R-19 | 90 | n-butyl acetate | 33.7 | 100 | 3.1 |
| | 2-20 | R-20 | 95 | n-butyl acetate | 32.1 | 90 | 3.2 |
| | 2-21 | R-21 | 95 | n-butyl acetate | 31.9 | 110 | 3.1 |
| | 2-22 | R-22 | 90 | n-butyl acetate | 32.5 | 100 | 3.3 |
| | 2-23 | R-23 | 95 | n-butyl acetate | 33.4 | 90 | 3.4 |
| | 2-24 | R-24 | 90 | n-butyl acetate | 31.7 | 90 | 3.2 |

TABLE 5

| | | Resist composition | PEB temp. (° C.) | Developer | Eop (mJ/cm$^2$) | DOF (nm) | CDU (nm) |
|---|---|---|---|---|---|---|---|
| Comparative Example | 2-1 | R-25 | 95 | n-butyl acetate | 33.6 | 60 | 4.5 |
| | 2-2 | R-26 | 90 | n-butyl acetate | 34.5 | 70 | 4.6 |
| | 2-3 | R-27 | 95 | n-butyl acetate | 33.9 | 70 | 5.1 |
| | 2-4 | R-28 | 95 | 2-heptanone | 32.9 | 60 | 4.8 |
| | 2-5 | R-29 | 95 | n-butyl acetate | 34.2 | 70 | 5.2 |
| | 2-6 | R-30 | 100 | n-butyl acetate | 35.1 | 50 | 5.3 |

TABLE 5-continued

|  | Resist composition | PEB temp. (° C.) | Developer | Eop (mJ/cm²) | DOF (nm) | CDU (nm) |
|---|---|---|---|---|---|---|
| 2-7 | R-31 | 90 | n-butyl acetate | 34.8 | 60 | 5.0 |
| 2-8 | R-32 | 95 | methyl benzoate | 34.1 | 60 | 4.7 |
| 2-9 | R-33 | 90 | n-butyl acetate | 35.5 | 50 | 5.0 |
| 2-10 | R-34 | 95 | n-butyl acetate | 34.4 | 60 | 4.9 |
| 2-11 | R-35 | 90 | n-butyl acetate | 33.0 | 70 | 5.4 |
| 2-12 | R-36 | 90 | n-butyl acetate | 34.0 | 60 | 5.8 |
| 2-13 | R-37 | 95 | n-butyl acetate | 35.2 | 50 | 6.2 |
| 2-14 | R-38 | 95 | n-butyl acetate | 37.5 | 70 | 5.1 |
| 2-15 | R-39 | 95 | n-butyl acetate | 32.1 | 70 | 4.8 |
| 2-16 | R-40 | 90 | n-butyl acetate | 35.6 | 60 | 4.7 |
| 2-17 | R-41 | 95 | n-butyl acetate | 31.5 | 50 | 5.4 |
| 2-18 | R-42 | 95 | n-butyl acetate | 32.0 | 60 | 6.0 |
| 2-19 | R-43 | 90 | n-butyl acetate | 34.5 | 60 | 5.1 |
| 2-20 | R-44 | 90 | n-butyl acetate | 36.0 | 50 | 4.9 |
| 2-21 | R-45 | 90 | n-butyl acetate | 30.5 | 60 | 5.8 |
| 2-22 | R-46 | 95 | n-butyl acetate | 31.2 | 60 | 4.9 |
| 2-23 | R-47 | 95 | n-butyl acetate | 28.5 | 60 | 6.8 |
| 2-24 | R-48 | 90 | n-butyl acetate | 30.5 | 50 | 6.5 |
| 2-25 | R-49 | 95 | n-butyl acetate | 30.6 | 70 | 5.2 |
| 2-26 | R-50 | 90 | n-butyl acetate | 33.5 | 60 | 5.8 |
| 2-27 | R-51 | 90 | n-butyl acetate | 34.6 | 60 | 4.7 |
| 2-28 | R-52 | 95 | n-butyl acetate | 35.8 | 50 | 4.8 |
| 2-29 | R-53 | 100 | 2-heptanone | 36.3 | 60 | 4.6 |

The results of PPD evaluation are shown in Tables 6 and 7.

TABLE 6

|  |  | Resist composition | CD (nm) @PPD 0h | CDU (3σ, nm) @PPD 0h | CD (nm) @PPD 6h | CDU (3σ, nm) @PPD 6h | ΔPPD CD (nm) |
|---|---|---|---|---|---|---|---|
| Example | 2-1 | R-1 | 50.2 | 6.1 | 47.8 | 6.2 | 2.4 |
|  | 2-2 | R-2 | 48.2 | 6.2 | 46.9 | 5.9 | 1.3 |
|  | 2-3 | R-3 | 52.3 | 6.7 | 50.1 | 6.5 | 2.2 |
|  | 2-4 | R-4 | 51.4 | 5.9 | 48.1 | 6.3 | 3.3 |
|  | 2-5 | R-5 | 51.5 | 6.8 | 49.8 | 6.9 | 1.7 |
|  | 2-6 | R-6 | 50.7 | 5.7 | 49.1 | 5.9 | 1.6 |
|  | 2-7 | R-7 | 50.9 | 5.9 | 47.9 | 6.1 | 3.0 |
|  | 2-8 | R-8 | 48.7 | 6.1 | 46.2 | 6.3 | 2.5 |
|  | 2-9 | R-9 | 50.1 | 6.5 | 48.2 | 6.4 | 1.9 |
|  | 2-10 | R-10 | 47.9 | 6.7 | 45.6 | 6.8 | 2.3 |
|  | 2-11 | R-11 | 51.6 | 5.6 | 48.5 | 5.9 | 3.1 |
|  | 2-12 | R-12 | 52.8 | 6.1 | 49.1 | 6.4 | 3.7 |
|  | 2-13 | R-13 | 51.2 | 6.0 | 49.5 | 6.5 | 1.7 |
|  | 2-14 | R-14 | 51.5 | 5.8 | 49.0 | 6.1 | 2.5 |
|  | 2-15 | R-15 | 49.5 | 5.9 | 47.9 | 6.2 | 1.6 |
|  | 2-16 | R-16 | 49.8 | 6.3 | 47.2 | 6.5 | 2.6 |
|  | 2-17 | R-17 | 50.7 | 6.4 | 48.1 | 6.6 | 2.6 |
|  | 2-18 | R-18 | 51.1 | 6.6 | 47.8 | 6.8 | 3.3 |
|  | 2-19 | R-19 | 51.9 | 5.8 | 48.9 | 6.1 | 3.0 |
|  | 2-20 | R-20 | 52.8 | 6.1 | 50.1 | 6.3 | 2.7 |
|  | 2-21 | R-21 | 50.3 | 6.8 | 48.6 | 6.5 | 1.7 |
|  | 2-22 | R-22 | 48.4 | 6.5 | 46.9 | 6.7 | 1.5 |
|  | 2-23 | R-23 | 50.3 | 6.1 | 48.1 | 6.3 | 2.2 |
|  | 2-24 | R-24 | 49.6 | 6.1 | 47.3 | 6.4 | 2.3 |

TABLE 7

|  |  | Resist composition | CD (nm) @PPD 0h | CDU (3σ, nm) @PPD 0h | CD (nm) @PPD 6h | CDU (3σ, nm) @PPD 6h | ΔPPD CD (nm) |
|---|---|---|---|---|---|---|---|
| Comparative Example | 2-1 | R-25 | 50.1 | 6.2 | 45.1 | 6.3 | 5.0 |
|  | 2-2 | R-26 | 50.5 | 6.3 | 44.6 | 6.1 | 5.9 |
|  | 2-3 | R-27 | 51.6 | 6.4 | 46.8 | 6.6 | 4.8 |
|  | 2-4 | R-28 | 52.1 | 6.5 | 47.8 | 6.7 | 4.3 |
|  | 2-5 | R-29 | 48.7 | 5.8 | 43.8 | 6.1 | 4.9 |
|  | 2-6 | R-30 | 49.7 | 5.5 | 44.1 | 5.7 | 5.6 |

TABLE 7-continued

| | Resist composition | CD (nm) @PPD 0h | CDU (3σ, nm) @PPD 0h | CD (nm) @PPD 6h | CDU (3σ, nm) @PPD 6h | ΔPPD CD (nm) |
|---|---|---|---|---|---|---|
| 2-7 | R-31 | 47.5 | 5.6 | 42.1 | 5.8 | 5.4 |
| 2-8 | R-32 | 50.9 | 6.7 | 44.8 | 6.9 | 6.1 |
| 2-9 | R-33 | 50.7 | 6.8 | 45.1 | 6.9 | 5.6 |
| 2-10 | R-34 | 51.9 | 5.9 | 46.8 | 6.2 | 5.1 |
| 2-11 | R-35 | 52.3 | 6.1 | 46.1 | 6.5 | 6.2 |
| 2-12 | R-36 | 51.4 | 6.3 | 47.2 | 6.3 | 4.2 |
| 2-13 | R-37 | 52.1 | 6.2 | 47.5 | 6.4 | 4.6 |
| 2-14 | R-38 | 50.8 | 5.8 | 46.5 | 5.9 | 4.3 |
| 2-15 | R-39 | 50.6 | 6.1 | 45.5 | 6.5 | 5.1 |
| 2-16 | R-40 | 51.2 | 6.2 | 46.8 | 6.6 | 4.4 |
| 2-17 | R-41 | 50.2 | 5.9 | 45.9 | 6.4 | 4.3 |
| 2-18 | R-42 | 50.4 | 6.2 | 46.2 | 6.3 | 4.2 |
| 2-19 | R-43 | 51.6 | 6.1 | 45.8 | 6.5 | 5.8 |
| 2-20 | R-44 | 51.8 | 5.8 | 46.8 | 6.9 | 5.0 |
| 2-21 | R-45 | 50.3 | 6.0 | 46.1 | 6.7 | 4.2 |
| 2-22 | R-46 | 49.8 | 5.8 | 45.1 | 6.5 | 4.7 |
| 2-23 | R-47 | 52.4 | 5.9 | 44.2 | 6.9 | 8.2 |
| 2-24 | R-48 | 52.6 | 6.1 | 45.9 | 6.7 | 7.8 |
| 2-25 | R-49 | 50.1 | 6.1 | 46.0 | 6.4 | 4.1 |
| 2-26 | R-50 | 52.1 | 6.2 | 45.6 | 6.6 | 6.5 |
| 2-27 | R-51 | 50.8 | 6.0 | 46.5 | 6.7 | 4.3 |
| 2-28 | R-52 | 50.7 | 5.8 | 46.1 | 6.2 | 4.6 |
| 2-29 | R-53 | 49.7 | 6.1 | 45.2 | 6.3 | 4.5 |

It is evident from Tables 4 to 7 that the resist compositions within the scope of the invention show improved DOF and CDU and reduced CD shrinkage amounts by PPD (small CD changes), as compared with well-known resist compositions.

Japanese Patent Application No. 2017-148008 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising:
(A) a base resin consisting of recurring units having the formula (1) shown below and recurring units having an acid labile group having the formula (2) shown below, and optionally at least one recurring unit selected from the group consisting of recurring units having the formulae (3) to (5) shown below,
(B) a photoacid generator consisting of a compound having the formula (B-2) shown below, and
(C) a solvent,

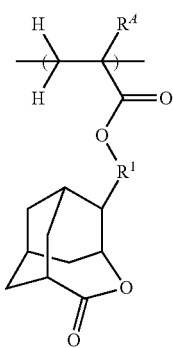
(1)

wherein $R^A$ is hydrogen or methyl, $R^1$ is a $C_1$-$C_{10}$ straight, branched or cyclic divalent hydrocarbon group in which at least one carbon atom may be substituted by an ether or carbonyl moiety,

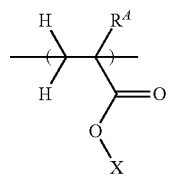
(2)

wherein $R^A$ is as defined above and X is an acid labile group,

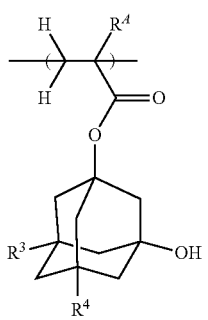
(3)

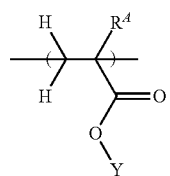
(4)

-continued

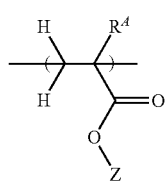
(5)

wherein $R^A$ is hydrogen or methyl, $R^3$ and $R^4$ are each independently hydrogen or hydroxyl, Y is a substituent group containing a lactone structure different from formula (1) or a substituent group containing a sultone structure, Z is hydrogen, a $C_1$-$C_{15}$ fluorinated hydrocarbon group, or a $C_1$-$C_{15}$ fluoroalcohol-containing substituent group,

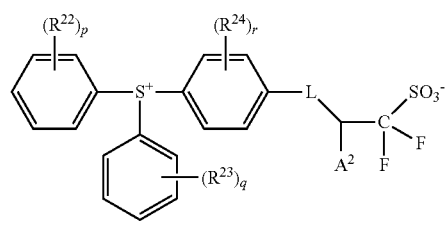
(B-2)

wherein $A^2$ is hydrogen or trifluoromethyl, $R^{22}$, $R^{23}$, and $R^{24}$ are each independently hydrogen or a $C_1$-$C_{20}$ straight, branched or cyclic monovalent hydrocarbon group which may contain a heteroatom, p and q are each independently an integer of 0 to 5, r is an integer of 0 to 4, L is a single bond, ether group, or a $C_1$-$C_{20}$ straight, branched or cyclic divalent hydrocarbon group which may contain a heteroatom, wherein the recurring units having formula (4) is selected from the group consisting of the following formulae:

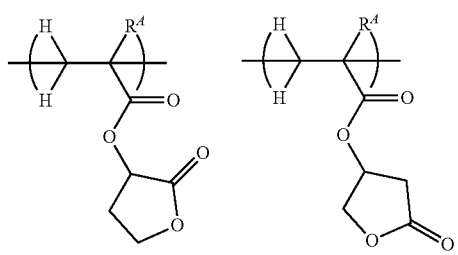

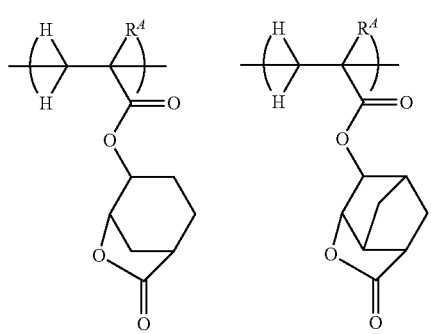

-continued

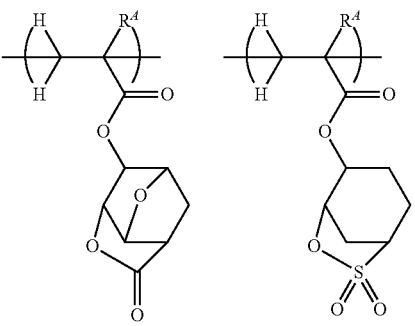

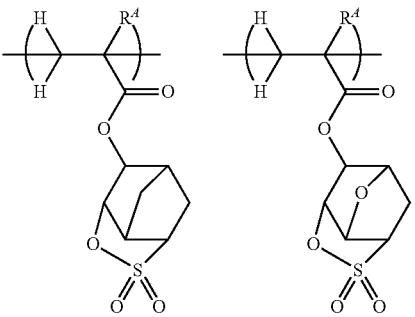

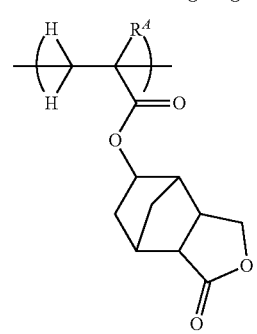

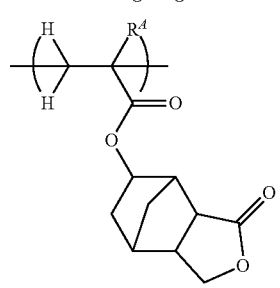

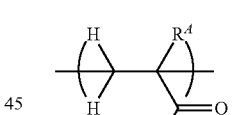

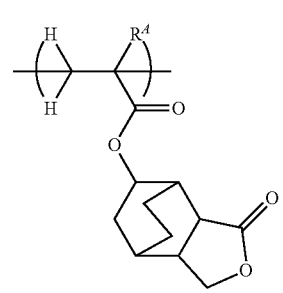

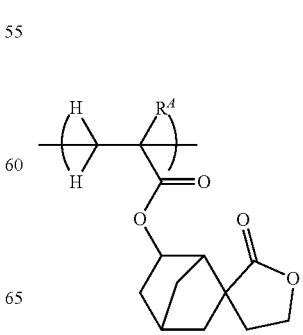

-continued
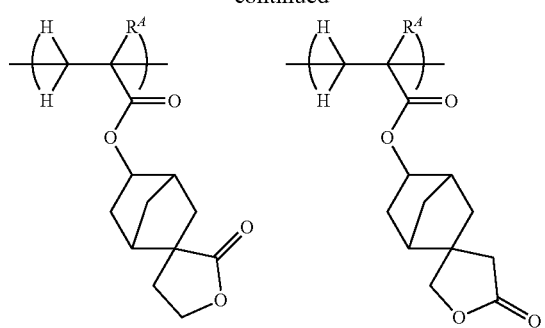
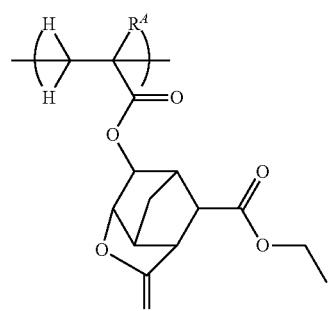
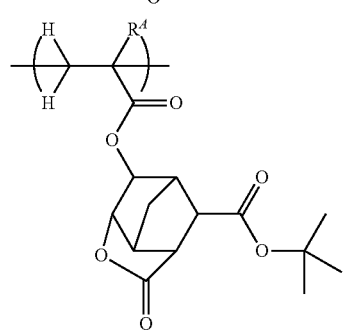
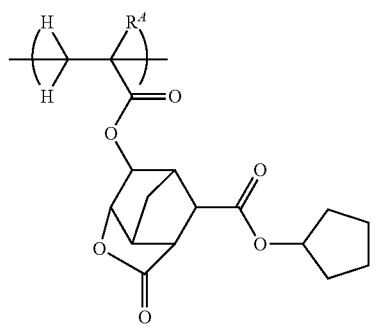
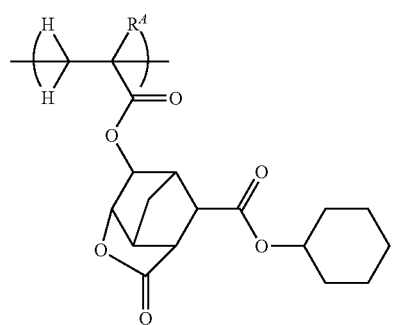
-continued
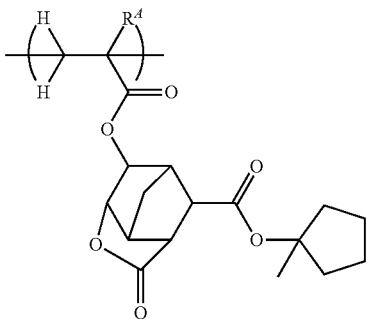
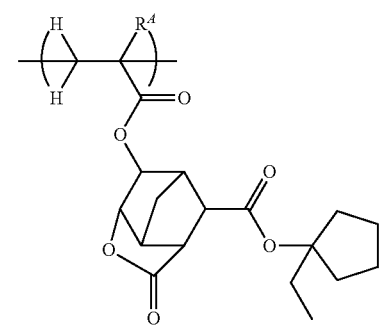
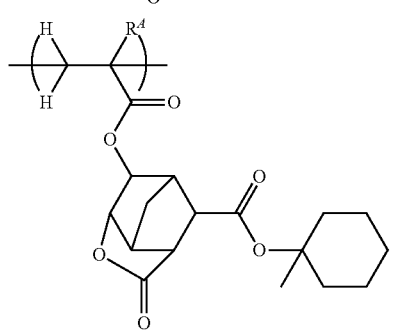
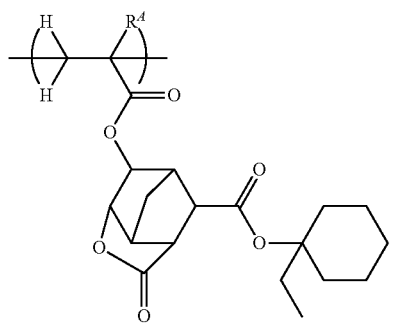
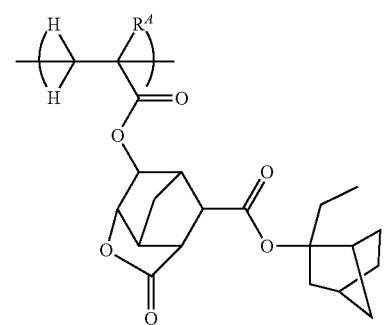

121
-continued
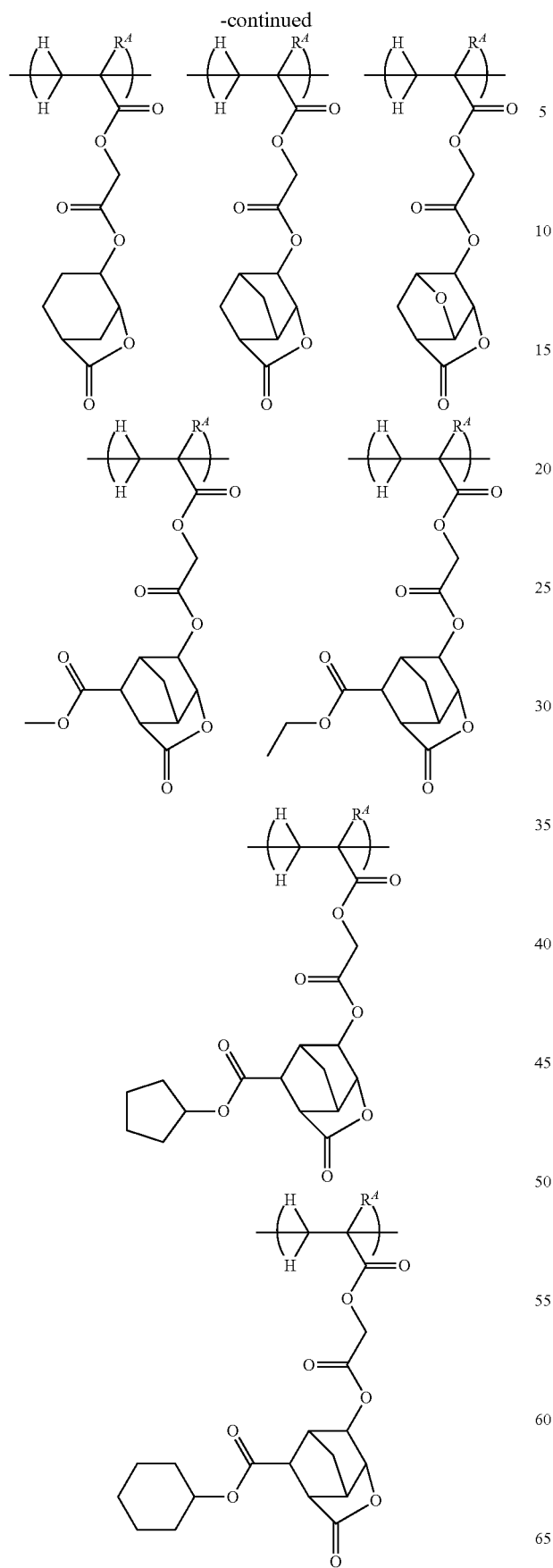
122
-continued
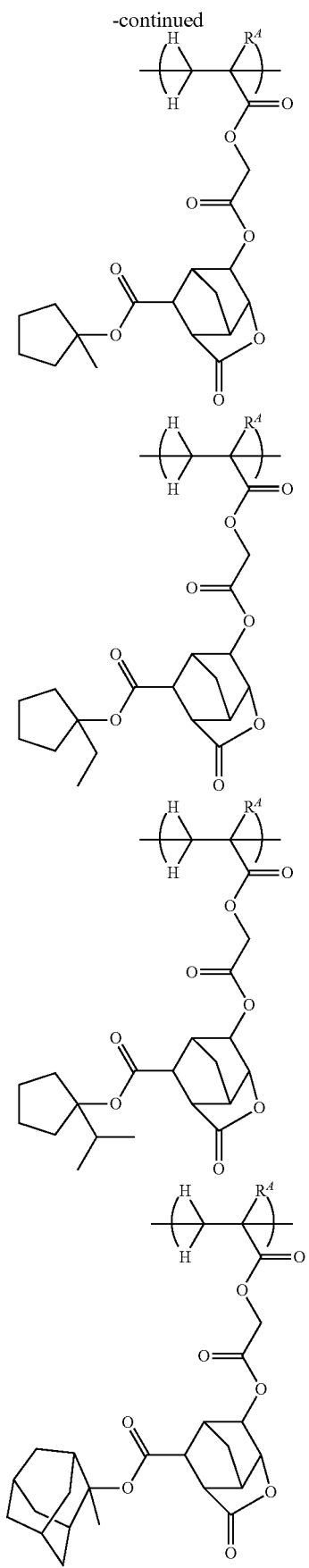

-continued

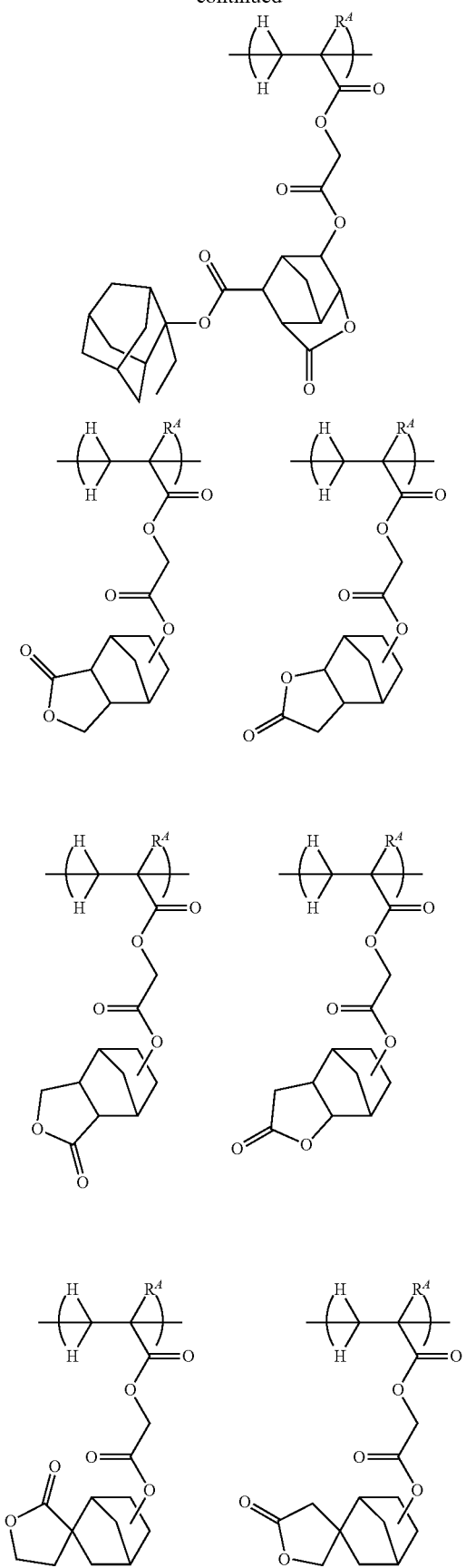

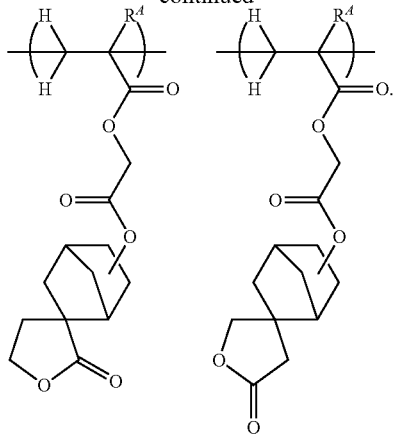

2. The resist composition of claim 1, further comprising (D) a fluoro-resin different from the resin as component (A), the fluoro-resin comprising recurring units of at least one type selected from the formulae (D-1), (D-2) and (D-3),

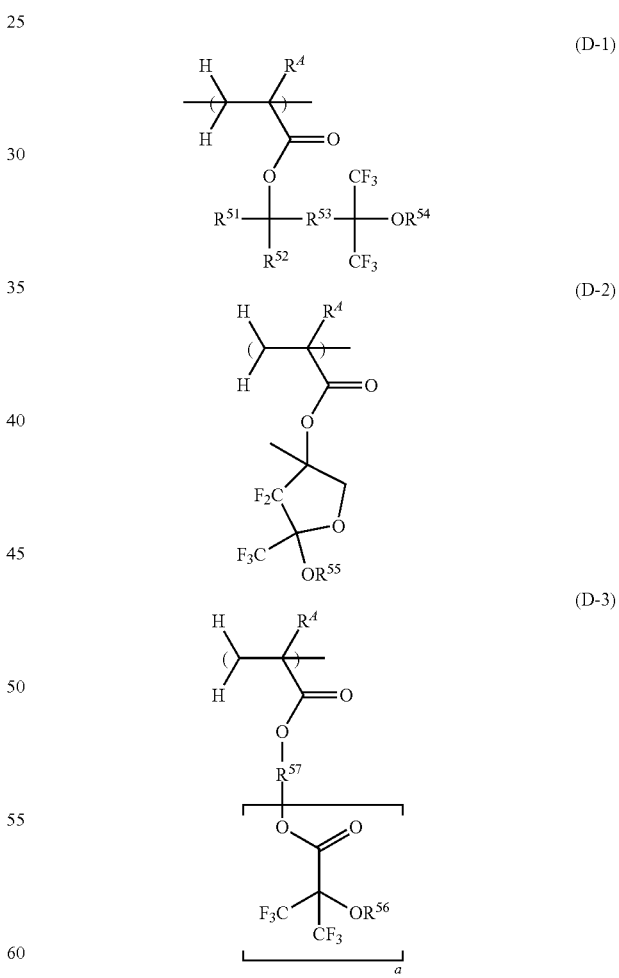

wherein $R^A$ is as defined above, $R^{51}$ and $R^{52}$ are each independently hydrogen or a $C_1$-$C_{10}$ straight, branched or cyclic monovalent hydrocarbon group, $R^{53}$ is a single bond or a $C_1$-$C_5$ straight or branched divalent hydrocarbon group, $R^{54}$, $R^{55}$ and $R^{56}$ are each independently hydrogen or a $C_1$-$C_{15}$ straight, branched or cyclic monovalent hydrocarbon, fluorinated hydrocarbon or acyl group, or an acid labile group, with the proviso that when $R^{54}$, $R^{55}$ and $R^{56}$ each are a monovalent hydrocarbon or fluorinated hydrocarbon group, at least one carbon atom in the group may be substituted by an ether or carbonyl moiety, $R^{57}$ is a $C_1$-$C_{20}$ straight, branched or cyclic (a+1)-valent hydrocarbon or fluorinated hydrocarbon group, and a is an integer of 1 to 3.

3. A process for forming a pattern comprising the steps of applying the resist composition of claim 1 onto a substrate, prebaking to form a resist film, exposing the resist film to ArF excimer laser, EB or EUV, baking, and developing the exposed film in a developer.

4. The process of claim 3 wherein the exposing step is by immersion lithography wherein a liquid having a refractive index of at least 1.0 is interposed between the resist film and a projection lens.

5. The process of claim 3, further comprising the step of forming a protective film on the resist film, and in the immersion lithography, the liquid is interposed between the protective film and the projection lens.

6. The resist composition of claim 1 wherein the acid labile group represented by X is a group of any one of the following formulae (L1) to (L9), tertiary alkyl groups of 4 to 20 carbon atoms, trialkylsilyl groups in which each alkyl moiety has 1 to 6 carbon atoms, or oxoalkyl groups of 4 to 20 carbon atoms,

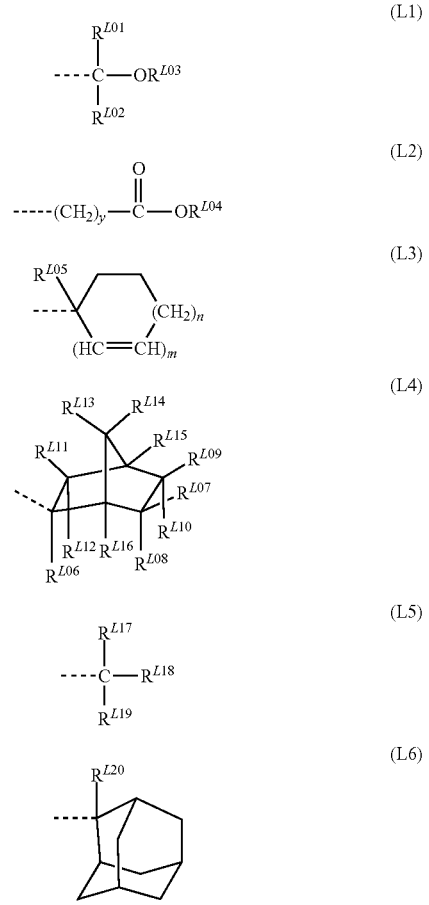

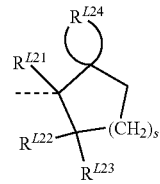

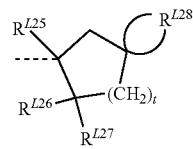

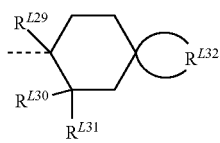

wherein $R^{L01}$ and $R^{L02}$ are each independently hydrogen or a straight, branched or cyclic alkyl group of 1 to 18 carbon atoms, $R^{L03}$ is a monovalent hydrocarbon group of 1 to 18 carbon atoms which may contain a heteroatom, a pair of $R^{L01}$ and $R^{L02}$, $R^{L01}$ and $R^{L03}$, or $R^{L02}$ and $R^{L03}$ may bond together to form a ring with the carbon and oxygen atoms to which they are attached, $R^{L04}$ is a $C_4$-$C_{20}$ tertiary alkyl group, a trialkylsilyl group in which each alkyl moiety has 1 to 6 carbon atoms, a $C_4$-$C_{20}$ oxoalkyl group, or a group of formula (L1), y is an integer of 0 to 6, $R^{L05}$ is an optionally substituted, straight, branched or cyclic $C_1$-$C_8$ alkyl group or optionally substituted $C_6$-$C_{20}$ aryl group, m is 0 or 1, n is an integer of 0 to 3, and 2m+n is equal to 2 or 3, $R^{L06}$ is an optionally substituted, straight, branched or cyclic $C_1$-$C_8$ alkyl group or optionally substituted $C_6$-$C_{20}$ aryl group, $R^{L07}$ to $R^{L16}$ each independently denote hydrogen or a $C_1$-$C_{15}$ monovalent hydrocarbon group, any two of $R^{L07}$ to $R^{L16}$ may bond together to form a ring, a pair of $R^{L07}$ to $R^{L16}$ which are attached to vicinal carbon atoms may bond together directly to form a double bond, $R^{L17}$ to $R^{L19}$ are each independently a $C_1$-$C_{15}$ straight, branched or cyclic alkyl group, $R^{L20}$ is an optionally substituted, straight, branched or cyclic $C_1$-$C_{10}$ alkyl group or optionally substituted $C_6$-$C_{20}$ aryl group, $RL_{21}$ is an optionally substituted, straight, branched or cyclic $C_1$-$C_{10}$ alkyl group or optionally substituted $C_6$-$C_{20}$ aryl group, $R^{L22}$ and $R^{L23}$ are each independently hydrogen or a $C_1$-$C_{15}$ straight, branched or cyclic monovalent hydrocarbon group, $R^{L22}$ and $R^{L23}$ may bond together to form a ring with the carbon atom to which they are attached, and the ring is a substituted or unsubstituted cyclopentane or cyclohexane ring, $R^{L24}$ is a divalent group which forms a substituted or unsubstituted cyclopentane, cyclohexane or norbornane ring with the carbon atom to which it is attached, s is 1 or 2, $R^{L25}$ is an optionally substituted, straight, branched or cyclic $C_1$-$C_{10}$ alkyl group or optionally substituted $C_6$-$C_{20}$ aryl group, $R^{L28}$ is a divalent group which forms a substituted or unsubstituted cyclopentane, cyclohexane or norbornane ring with the carbon atom to which it is attached, $R^{L26}$ and $R^{L27}$ are each independently hydrogen or a $C_1$-$C_{10}$ straight, branched or cyclic monovalent hydrocarbon group, $R^{L26}$ and $R^{L27}$ may bond together to form a ring with the carbon atom to which they are attached, and the ring is a substituted or unsubstituted cyclopentane or cyclohexane ring, t is 1 or 2, $R^{L29}$ is an optionally substituted, straight, branched or cyclic $C_1$-$C_{10}$ alkyl group or optionally substituted $C_6$-$C_{20}$ aryl group, $R^{L30}$ and $R^{L31}$ are each independently hydrogen or a $C_1$-$C_{10}$ straight, branched or cyclic monovalent hydrocarbon group, $R^{L30}$ and $R^{L31}$ may bond together to form a ring with the carbon atom to which they are attached, and the ring is a substituted or unsubstituted cyclopentane or cyclohexane ring, and $R^{L32}$ is a divalent group which forms a substituted or unsubstituted cyclopentane, cyclohexane or norbornane ring with the carbon atom to which it is attached.

\* \* \* \* \*